United States Patent [19]
Osakabe et al.

[11] Patent Number: 6,073,683
[45] Date of Patent: Jun. 13, 2000

[54] COOLING APPARATUS USING BOILING AND CONDENSING REFRIGERANT AND METHOD FOR MANUFACTURING THE SAME

[75] Inventors: Hiroyuki Osakabe, Chita-gun; Kiyoshi Kawaguchi, Toyota; Takahide Ohara, Okazaki; Shigeru Kadota, Hekinan; Masahiko Suzuki, Hoi-gun, all of Japan

[73] Assignee: Nippondenso Co., Ltd., Kariya, Japan

[21] Appl. No.: 08/674,821

[22] Filed: Jul. 3, 1996

[30] Foreign Application Priority Data

| Jul. 5, 1995 | [JP] | Japan | 7-169494 |
| Sep. 8, 1995 | [JP] | Japan | 7-230979 |
| Oct. 9, 1995 | [JP] | Japan | 7-261155 |
| Nov. 10, 1995 | [JP] | Japan | 7-292346 |
| Mar. 14, 1996 | [JP] | Japan | 8-057570 |

[51] Int. Cl.$^7$ ................................................. F28D 15/00
[52] U.S. Cl. .............................. 165/104.33; 165/104.21; 361/700; 257/715
[58] Field of Search ....................... 165/104.21, 80.3, 165/104.26, 104.33; 361/700; 257/714, 715

[56] References Cited

U.S. PATENT DOCUMENTS

| 4,949,164 | 8/1990 | Ohashi et al. . |
| 5,476,141 | 12/1995 | Tanaka . |
| 5,479,985 | 1/1996 | Yamamoto et al. . |

FOREIGN PATENT DOCUMENTS

| 3328732 | 2/1984 | Germany | 165/104.33 |
| 51-039442 | 4/1976 | Japan . | |
| 51-118038 | 10/1976 | Japan . | |
| 0049418 | 4/1977 | Japan | 165/104.33 |
| 55-051345 | 12/1980 | Japan . | |
| 0137086 | 10/1981 | Japan | 165/104.33 |
| 0152150 | 9/1982 | Japan | 165/104.33 |
| 57-204156 | 12/1982 | Japan . | |
| 0131755 | 8/1983 | Japan | 165/104.33 |
| 58-135954 | 9/1983 | Japan . | |
| 60-119799 | 6/1985 | Japan . | |
| 62-162847 | 10/1987 | Japan . | |
| 3-283454 | 12/1991 | Japan . | |
| 6-024279 | 2/1994 | Japan . | |
| 7-169494 | 7/1995 | Japan . | |
| 7-230979 | 9/1995 | Japan . | |
| 7-261155 | 10/1995 | Japan . | |
| 7-292346 | 11/1995 | Japan . | |
| 8-057570 | 3/1996 | Japan . | |

*Primary Examiner*—Christopher Atkinson
*Attorney, Agent, or Firm*—Pillsbury Madison & Sutro LLP

[57] ABSTRACT

A cooling apparatus using boiling and condensing refrigerant for cooling a heat generating unit, includes a refrigerant tank having a wall surface, for containing the refrigerant therein, a heat generating unit boiling the refrigerant in the refrigerant tank by heating, and a radiator disposed in communication with the refrigerant tank for condensing and liquefying the boiling refrigerant in the tank. An interior of the refrigerant tank is partitioned into a vapor passage for leading the boiling refrigerant to the radiator, a condensed liquid passage in which the condensed and liquefied refrigerant flows downwardly, and a communication path formed at a lower side thereof for communicating between the vapor passage and the condensed liquid passage. The condensed liquid passage is defined by a part of the wall surface. Since the refrigerant liquid passage is formed by the wall surface, the heat from the refrigerant in the refrigerant tank, which is received by the condensed refrigerant having condensed and liquefied in the condensed liquid passage, is reduced.

6 Claims, 50 Drawing Sheets

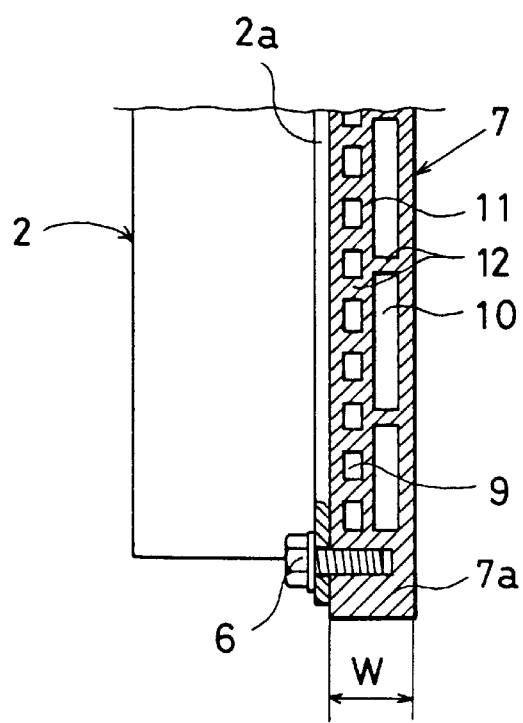
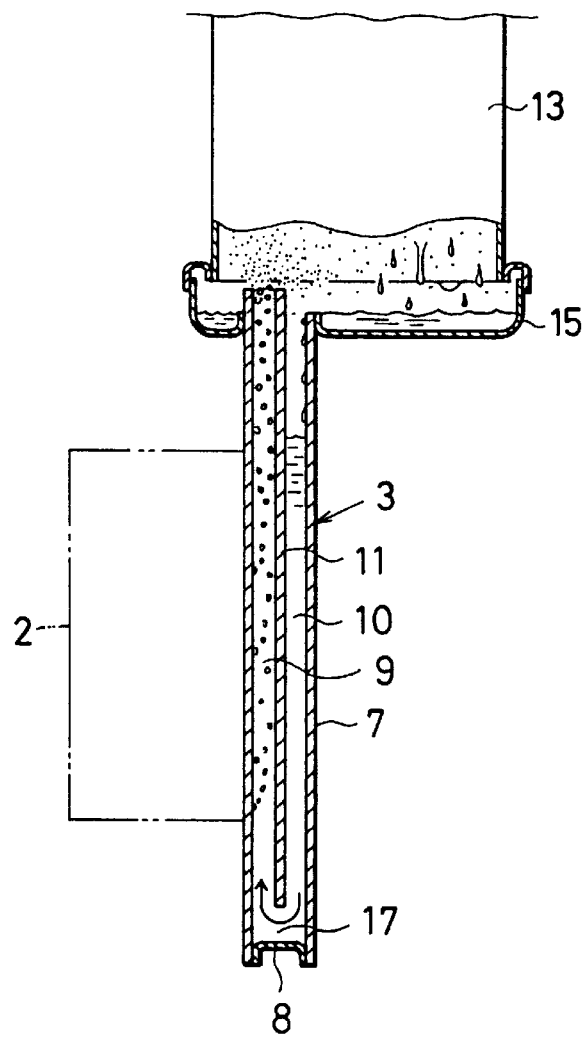

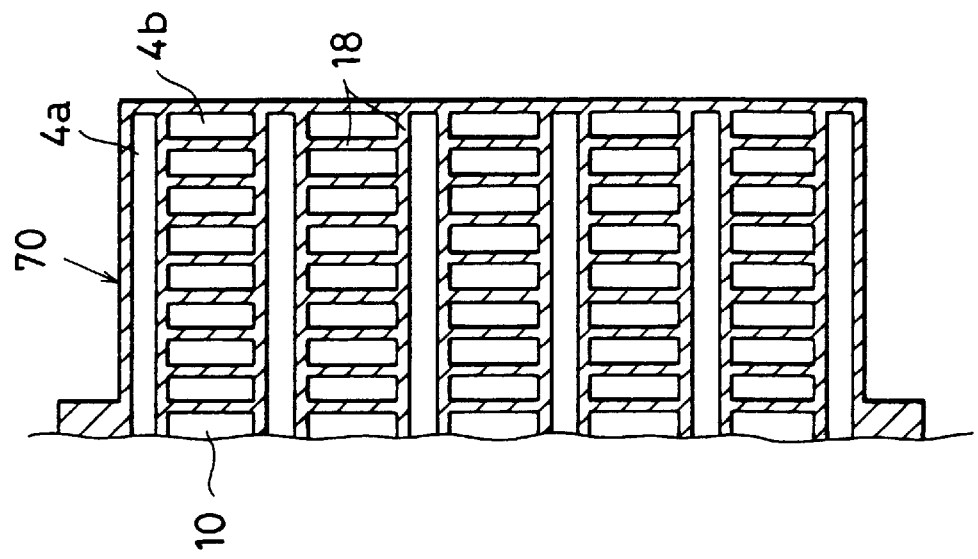
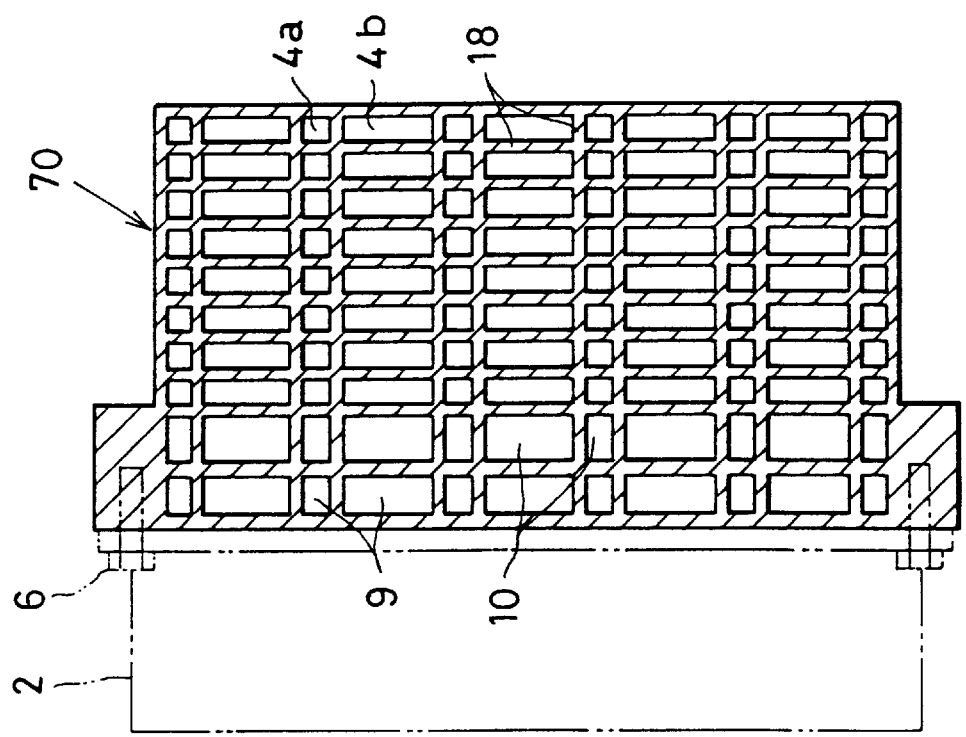

FIG. 8
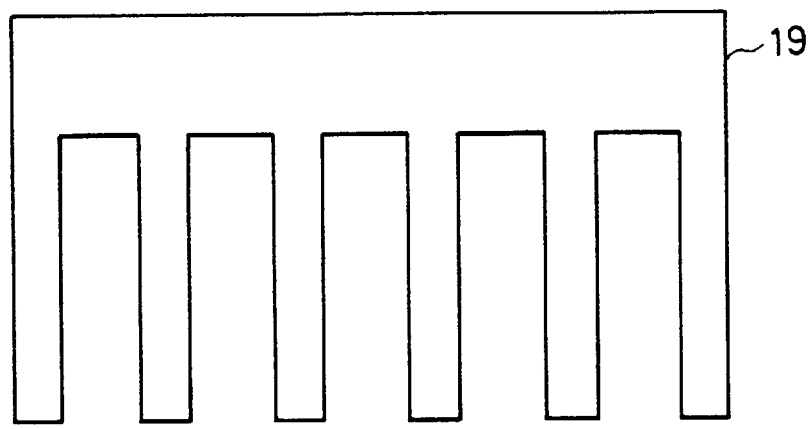
FIG. 9A
FIG. 9B
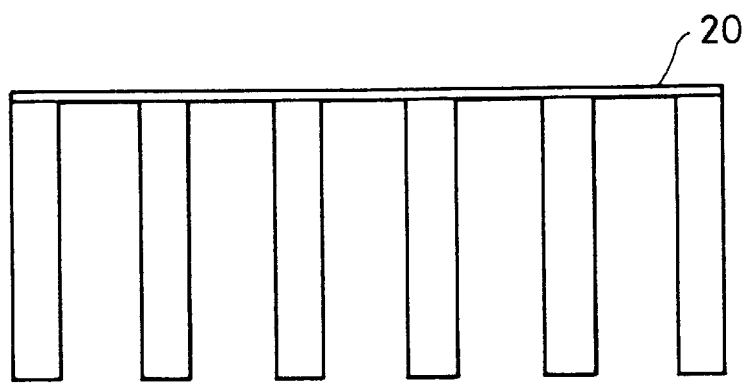 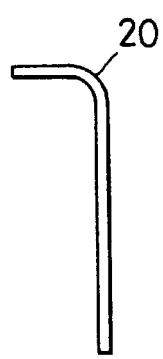
FIG. 10
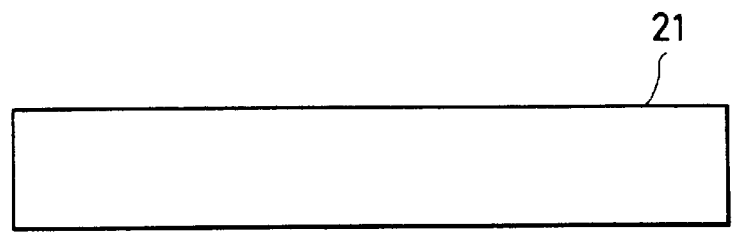

FIG. 23
FIG. 24
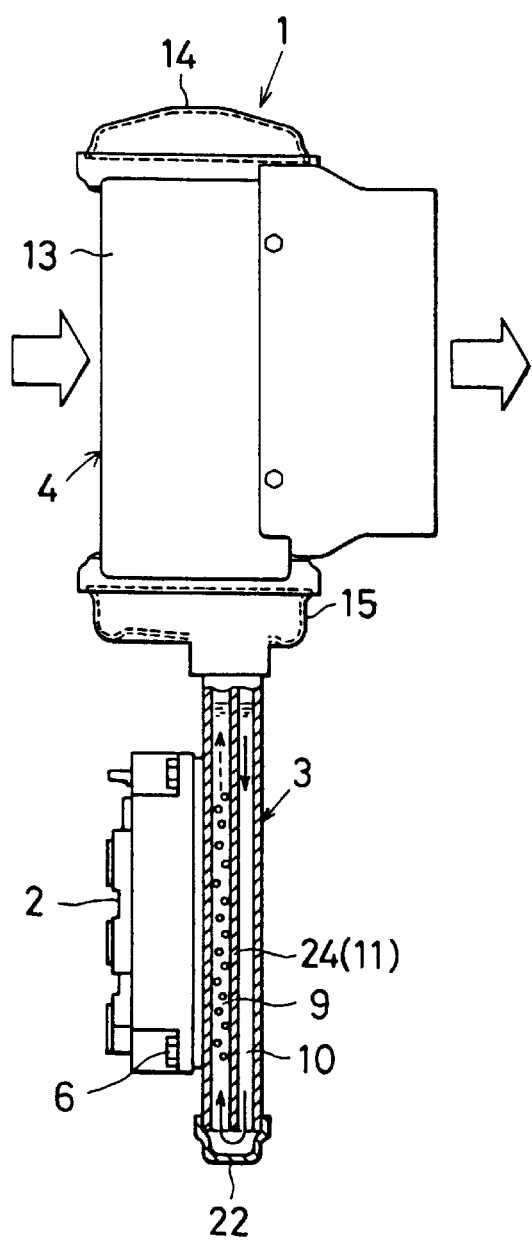
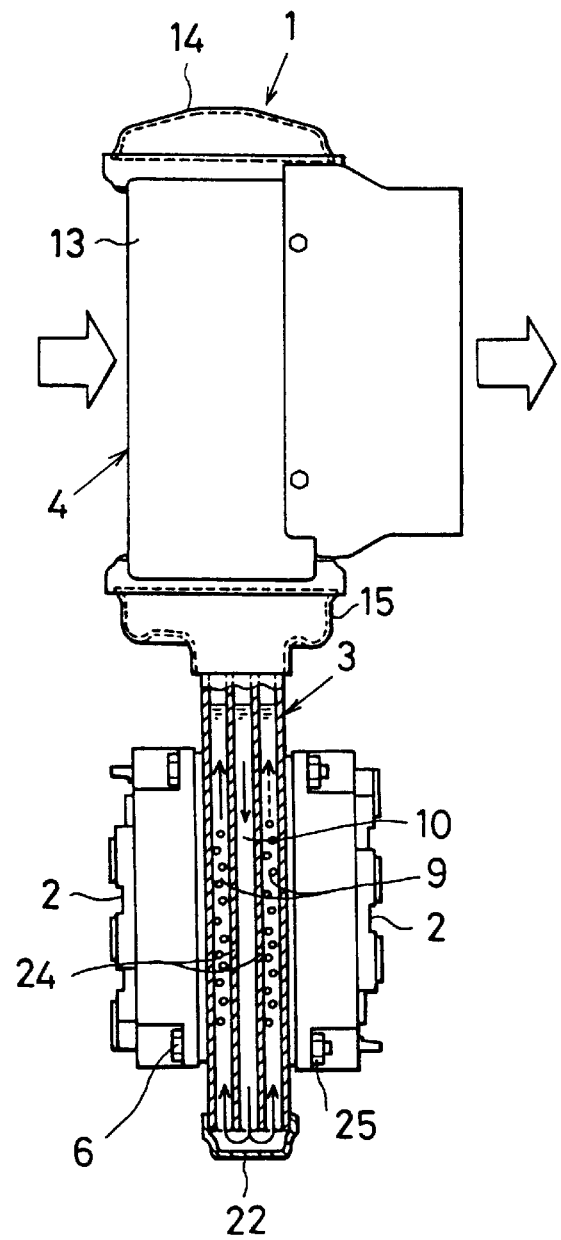

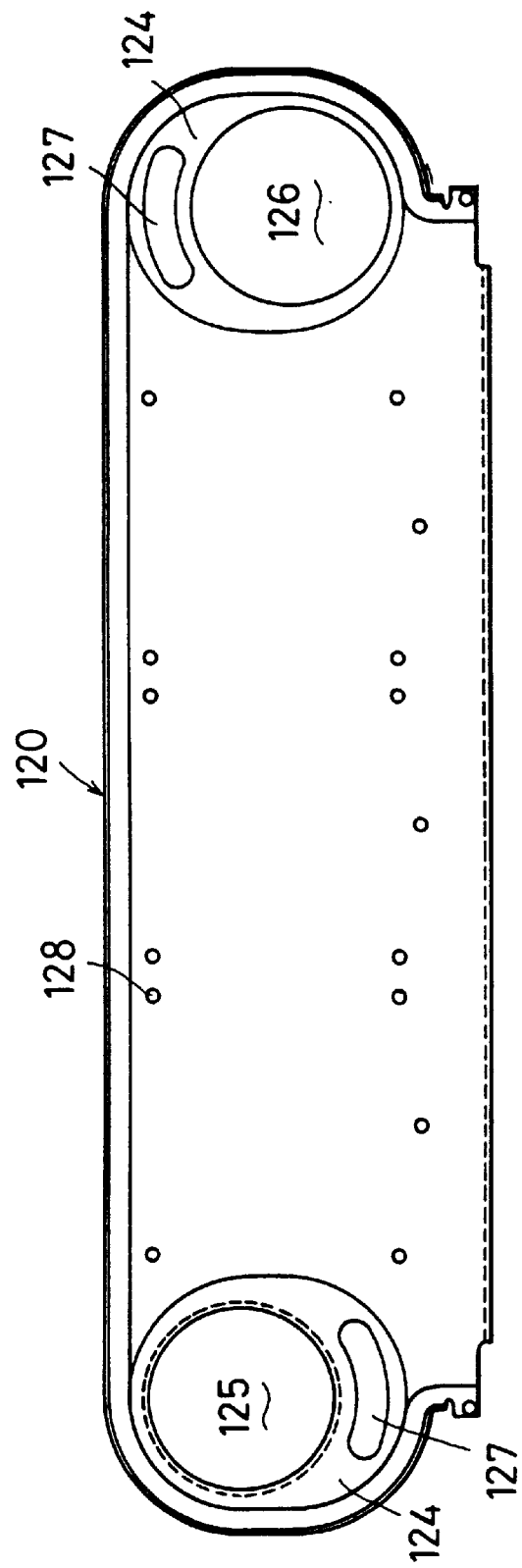
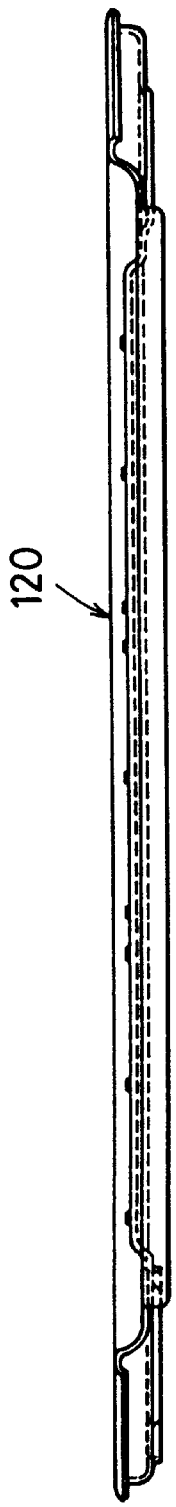
FIG. 59A
FIG. 59B

COOLING APPARATUS USING BOILING AND CONDENSING REFRIGERANT AND METHOD FOR MANUFACTURING THE SAME

CROSS REFERENCE TO RELATED APPLICATIONS

This application is based on and claims priority of Japanese Patent Applications Nos. Hei. 7-169494 filed on Jul. 5, 1995, Hei. 7-230979 filed on Sep. 8, 1995, Hei. 7-261155 filed on Oct. 9, 1995, Hei. 7-292346 filed on Nov. 10, 1995, Hei. 8-57570 filed on Mar. 14, 1996, the contents of which are incorporated herein by reference.

BACKGROUND OF THE INVENTION

1. Field of the Invention

The present invention relates to a cooling apparatus using boiling and condensing refrigerant for cooling a heat generating unit such as a semiconductor device or the like.

2. Description of Related Art

In a conventional cooling apparatus using boiling and condensing refrigerant, the refrigerant filled in the refrigerant tank is boiled by absorbing heat. Then, the boiled and vaporized refrigerant is condensed and liquefied in the radiator, and heat is repeatedly absorbed by the liquefied refrigerant. Accordingly, in order to absorb the heat in the refrigerant tank efficiently, it is necessary for the flow of the vaporized refrigerant inside the radiator to be a circulating flow (uniform flow).

In the cooling apparatus using boiling and condensing refrigerant, as disclosed in JP-A-3-283454, JP-U-62-162847, or JP-A-51-118038, there is provided a tube for forming a passage (hereinafter referred to condensed liquid passage) to return the refrigerant from the radiator to the refrigerant tank and such tube is soaked in the refrigerant tank.

In such a cooling apparatus using boiling and condensing refrigerant, since the condensed liquid passage is soaked in the refrigerant within the refrigerant tank, the condensed refrigerant liquefied and falling may be heated before reaching an outlet of the condensed liquid passage. As a result, it is hard for the refrigerant to fall in the condensed liquid passage and to reach the outlet of the condensed liquid passage efficiently. Accordingly, the refrigerant does not circulate efficiently, and the radiating ability may be deteriorated.

As a conventional cooling apparatus using boiling and condensing refrigerant in which the circulating flow is formed, as disclosed in JP-A-51-39442, or JP-U-58-135954, the condensed liquid passage is disposed outside the refrigerant tank and connected to the radiator below the refrigerant tank.

However, in the cooling apparatus using boiling and condensing refrigerant as disclosed in JP-A-51-39442, or JP-U58-135954, since the condensed liquid passage is formed as an outside piping, the manufacturing cost may be increased and the reliability of the connecting portion between the refrigerant tank and the liquid may be deteriorated.

Further, in the cooling apparatus using boiling and condensing refrigerant as disclosed in JP-A-51-39442, or JP-U58-135954, since two pipes for connecting between the refrigerant tank and the radiator are needed, the number of the parts as well as the manufacturing cost may be increased and the apparatus may be large sized.

SUMMARY OF THE INVENTION

In view of the above problems, it is a first object of the present invention to obtain a cooling apparatus using boiling and condensing refrigerant, capable of preventing the increase of the manufacturing cost and preventing the reliability and the radiating ability from being deteriorated.

Further, it is a second object of the present invention to obtain a cooling apparatus using boiling and condensing refrigerant, capable of reducing the number of the parts and downsizing the apparatus.

According to the present invention, a cooling apparatus using boiling and condensing refrigerant for cooling a heat generating unit includes a refrigerant tank having a wall surface, for containing the refrigerant therein; a heat generating unit boiling the refrigerant in the refrigerant tank by heating; and a radiator disposed in communication with the refrigerant tank for condensing and liquefying the boiling refrigerant in the tank. An interior of the refrigerant tank is partitioned into a vapor passage for leading the boiling refrigerant to the radiator, a condensed liquid passage in which the condensed and liquefied refrigerant flows down, and a communication path formed at a lower side thereof for communicating between the vapor passage and the condensed liquid passage. The condensed liquid passage is defined by a part of the wall surface.

The refrigerant tank includes at least a wall surface, and the wall surface of the refrigerant tank is used as a wall surface of the condensed liquid passage. Since the wall surface of the refrigerant tank faces the outside of the apparatus, by forming the refrigerant liquid passage with the wall surface, the heat from the refrigerant in the refrigerant tank, which received by the condensed refrigerant having condensed and liquefied in the condensed liquid passage, is reduced. As a result, the refrigerant can flow through the condensed liquid passage smoothly, thereby leading the refrigerant to an outlet of the condensed liquid passage efficiently.

The condensed liquid passage is formed by the wall surface of the refrigerant tank, and is further formed by partitioning the interior of the refrigerant tank. Therefore, the increase of the cost is prevented, and the reliability of the connection between the refrigerant tank and the condensed liquid passage is prevented from being deteriorated. Further, the number of the components can be reduced, and it is possible to downsize the apparatus.

The radiator may be constituted by laminating plural heat radiating pipes each having the same shape on the connecting portion, and thereby the number of the heat radiating pipes to be laminated can be changed easily. Consequently, by increasing or decreasing the number of heat radiating pipes to be laminated according to the number (i.e. the total quantity of heat generated) of heat generating units to be attached to the refrigerant tank, it is possible to easily ensure a heat radiation capacity corresponding to the total amount of heat generated from the heat generating units.

Further, a bottom of the refrigerant passage in each heat radiating pipe may be inclined, and thereby it becomes easy for the condensed liquid to flow from the inlet-side communicating portion toward the outlet-side communicating portion. As a result, the amount of the condensed liquid staying on the bottom of the refrigerant passage decreases and hence the vaporized refrigerant can be condensed efficiently.

Further, the refrigerant tank may be constituted by an extrusion member. In this way, the extrusion member can be cut into a suitable length according to the number and type of heat generating units to be mounted to the refrigerant tank. In other words, various refrigerant tanks according to the number and type of heat generating units can be manufactured easily with low cost.

A partition member may be provided in a connecting portion between the refrigerant tank and the radiator so as to be in contact with the partition wall in the refrigerant tank. In this way, a refrigerant circulation flow can be formed readily within the apparatus. More specifically, the vaporized refrigerant having boiled in the refrigerant tank flows through the refrigerant tank (the vapor passage), the connecting portion (inlet chamber), the radiator, the refrigerant passage, the connecting portion (outlet chamber), and the refrigerant tank (condensed liquid passage) in this order, and again returns to the refrigerant tank (vapor passage).

Further, a plate member may be used as the partition member to partition the interior of the connecting portion. In this way, it is possible to integrally form the partition by pressing, and thereby the partition member can be manufactured at low cost. Besides, since the partition member thus constituted by a plate member is bonded by brazing to the inner peripheral surface of the connecting portion, the gap between the partition member and the connecting portion can be filled with the brazing material. Thus, even with the plate-like partition member, it is possible to airtightly partition the interior of the connecting portion.

The partition member may be provided with an extending portion extending along the inner wall surface of the connecting portion. In this way, when the partition member is fixed in the interior of the connecting portion, the partition member can be fixed in the proper position easily without falling down. Besides, a sufficient bonding length can be ensured by the extending portion in bonding the partition member in the interior of the connecting portion, and therefore not only the bonding strength is improved but also the inlet chamber side and the outlet chamber side can be airtightly sealed from each other. Alternatively, the partition member may be press-fitted in the interior of the connecting portion, and thereby the extending portion is brought into pressure contact with the inner wall surface of the connecting portion and hence the airtightness can be ensured even without bonding the extending portion to the connecting portion.

The partition member may be formed by pressing integrally with the thin plate which forms the connecting portion. In this way, it is not necessary to set the position of the partition member with respect to the connecting portion and the number of manufacturing steps can be decreased by the decrease in the number of components.

BRIEF DESCRIPTION OF THE DRAWINGS

Additional objects and advantages of the present invention will be more readily apparent from the following detailed description of preferred embodiments thereof when taken together with the accompanying drawings in which;

FIG. 2 is a cross sectional view taken along line II—II of FIG. 1B;

FIG. 3 is a cross sectional view of the refrigerant according to a second embodiment;

FIG. 5 is a cross sectional view taken along line V—V of FIG. 4;

FIG. 7 is a cross sectional view taken along line VII—VII of FIG. 4;

FIG. 8 is a plan view of an end plate according to the third embodiment;

FIG. 9A is a plan view of an end plate, and

FIG. 9B is a side view thereof, according to the third embodiment;

FIG. 10 is a plan view of an end plate according to the third embodiment;

FIG. 23 is a side view of a cooling apparatus using boiling and condensing refrigerant (with a refrigerant tank being shown in cross section) according to the seventh embodiment;

FIG. 24 is a side view of a cooling apparatus using boiling and condensing refrigerant (with a refrigerant tank being shown in cross section) according to an eighth embodiment;

FIG. 59A is a plan view, and

FIG. 59B is a side view of a pressed plate as a constituent of a connecting portion according to the twenty-third embodiment;

DETAILED DESCRIPTION OF THE PREFERRED EMBODIMENTS

Embodiments of cooling apparatus using boiling and condensing refrigerants according to the present invention will be described.

A first embodiment of the present invention is described.

Figure 1A:
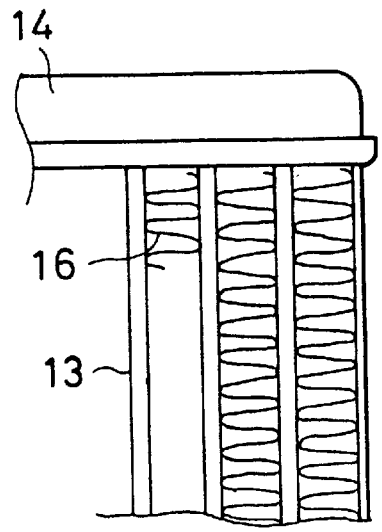
FIG. 1A is a partial front view of a radiator and FIG. 1B is a side view of a cooling apparatus with a refrigerant vessel being shown in cross section according to a first embodiment.
Figure 1B:
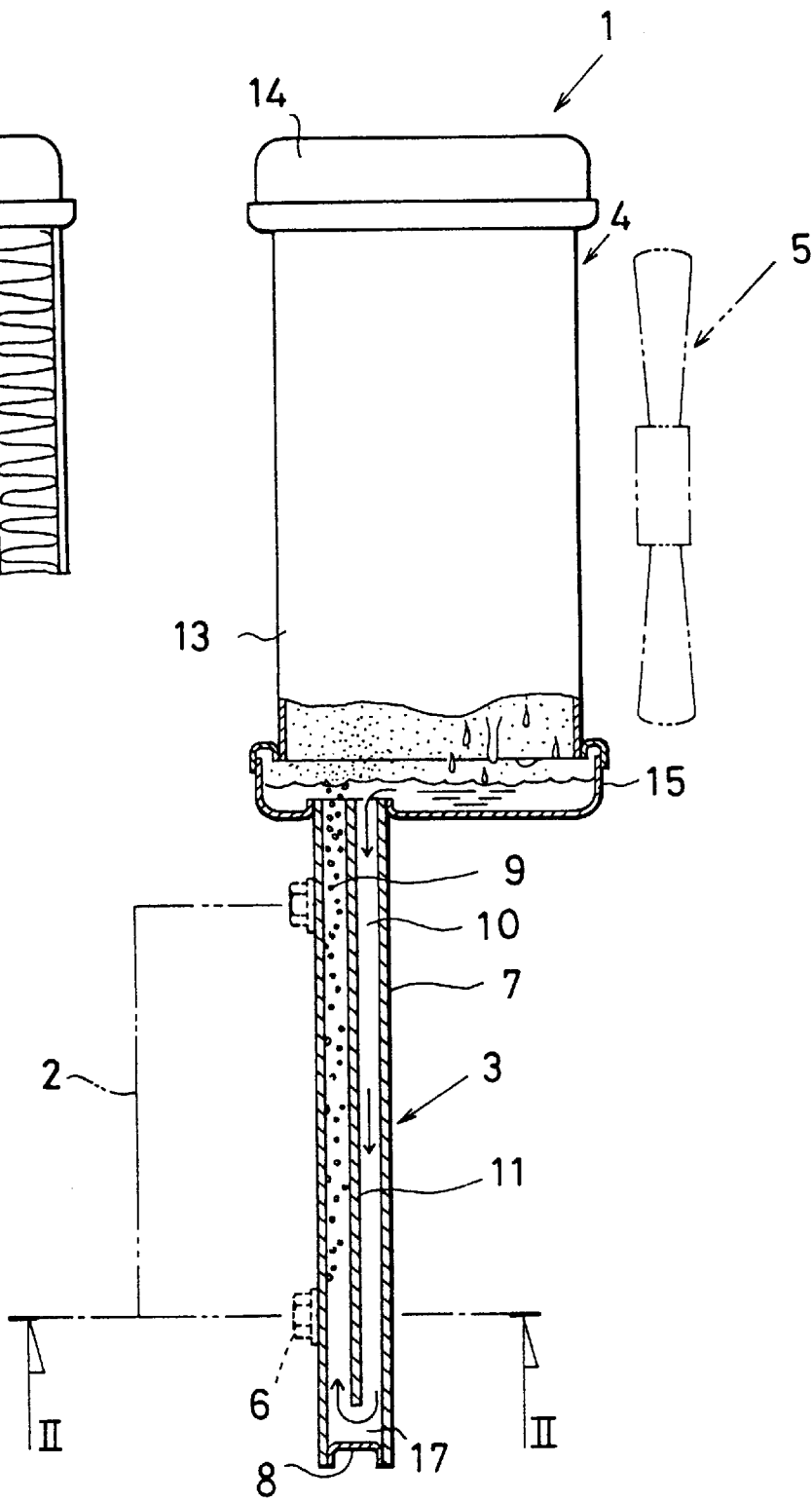

FIG. 1A is a partial front view of a radiator and FIG. 1B is a side view of a cooling apparatus using boiling and condensing refrigerant, in which a refrigerant tank is shown with a cross section.

A cooling apparatus 1 using boiling and condensing refrigerant according to the first embodiment of the present invention cools an IGBT module 2 (the heat generating unit) which constitutes an inverter circuit for an electric vehicle or a general electric power control device. The cooling apparatus 1 includes a refrigerant tank 3, a radiator 4 and a cooling fan 5.

As shown in FIG. 2, which is a cross sectional view taken along line II—II in FIG. 1, the IGBT module 2 has a heat radiating plate 2a made of a metal superior in heat conductivity (e.g. copper). The heat radiating plate 2a closely contacts with the outer wall surface of the refrigerant tank 3 and in this state the IGBT module 2 is fixed to the refrigerant tank 3 by tightening of bolts. In this case, a thermally conductive grease may be interposed between the heat radiating plate 2a and the outer wall surface of the refrigerant tank 3.

The refrigerant tank 3 includes a hollow extrusion member 7 extruded from an aluminum block material and a bottom plate 8 which closes one open end of the extrusion member 7. The other open end of the extrusion member 7 as a refrigerant inlet/output is connected to the radiator 4.

The extrusion member 7 is formed in a flat shape, and its thickness W (see FIG. 2) is thinner than the width and length of its outer wall surface with the IGBT module 2 attached thereto. A plurality of through passages 9 and 10 is formed in the inside of the extrusion member 7. Further, internal thread portions, to which bolts 6 are screwed, are formed in a thick-walled portion 7a of the extrusion member 7 where the through passages 9 and 10 are not formed.

The through passages 9 and 10 are defined by a partition wall 11 which divides into two interiors of the extrusion member 7 in the thickness direction (right and left direction in FIG. 2) and also by passage walls 12 which divide the bisected interior space on one side (left-hand side in FIG. 2) and on the other side into plural portions in the width direction (vertical direction in FIG. 2). In this case, the interior space on the IGBT module 2 mounted side (one side) with respect to the partition wall 11 is partitioned minutely by a larger number of passage walls 12 than in the other-side interior space, so that the through passages 9 thus formed in the interior space on one side are smaller in its cross sectional area and larger in number than the through passages 10 formed in the interior space on the other side.

The partition wall 11 and the passage walls 12 both defining the through passages 9 and 10 are cut short on bottom sides thereof (lower side in FIG. 1) relative to the outer wall of the extrusion member 7 so as to ensure communication between the through passages 9 on one side and the through passages 10 on the other side after the bisection by the partition wall 11 and also ensure mutual communication of the through passages 9 on one side and that of the through passages 10 on the other side (see FIG. 1B).

The bottom plate 8 which closes one open end of the extrusion member 7 is made of aluminum in the same manner as the extrusion member and is bonded to the inner peripheral surface of the extrusion member 7 by brazing for example.

Into the interior space of the extrusion member 7, one open end of which is thus closed with the bottom plate 8, namely, into the refrigerant tank 3, is sealed a fluorocarbon-based refrigerant.

The radiator 4 is composed of heat radiating tubes 13, an upper tank 14, a lower tank 15, and heat radiating fins 16.

The heat radiating tubes 13, which are flat aluminum tubes having an elliptic cross section, are arranged in a stacked state alternately with the heat radiating fins 16 and are supported by both upper tank 14 and lower tank 15.

The upper end portions of the heat radiating tubes 13 are inserted into the upper tank 14, and thus the upper tank 14 is in communication with the tubes 13.

The lower tank 15 is also in communication with the heat radiating tubes 13 through the lower end portions of the tubes which are inserted into the lower tank. Further, as shown in FIG. 1B, an upper-end opening portion of the refrigerant tank 3 (the other opening end portion of the extrusion member 7) is inserted into the lower tank 15, and thus the lower tank 15 is in communication with the refrigerant tank 3.

The heat radiating fins 16 are corrugated fins obtained by bending alternately an aluminum sheet of a high heat conductivity. As shown in FIG. 1A, the fins 16 are mounted in contact with the outer wall surfaces of the heat radiating tubes 13.

The refrigerant tank 3 and the radiator 4 may be joined together, for example by first assembling the two temporarily and thereafter brazing the two integrally in a furnace.

The cooling fan 5 is an axial-flow fan, as shown in FIG. 1B, and is disposed in front of (or behind) the radiator 4 to blow air to the radiator in the front and rear direction (the right and left direction in FIG. 1B). The cooling fan 5 may be a suction type positioned at a downstream side of the radiator in the blowing direction or a thrust type positioned at an upstream side of the radiator 4 in the blowing direction.

An operation of the cooling apparatus 1 using boiling and condensing refrigerant of this embodiment will be described below.

When the semiconductor device incorporated in the IGBT module 2 generates heat, the heat is conducted from the heat radiating plate 2a of the module 2 to the outer wall of the refrigerant tank 3 so that the refrigerant sealed in the tank 3 is boiled and vaporized. At this time, a highly efficient heat transfer (100 to 1000 times in boiling as large as that in natural convection) is performed between the inner wall surface of the refrigerant tank 3 (the inner wall surface of the extrusion member 7) and the refrigerant. Since the interior of the refrigerant tank 3 is halved by the partition wall 11, the refrigerant in each through passages 9 (hereinafter referred to as the vapor passages 9) on one side of the partition wall 11 mainly boils. The boiling refrigerant rises as air bubbles through the vapor passages 9 and enters the lower tank 15 of the radiator 4, then, the refrigerant is distributed into each heat radiating tube 13 and flows upward through the heat radiating tube 13.

The refrigerant vapor flowing on the interiors of the heat radiating tubes 13 is condensed and liquefied on the inner wall surface, which is kept at a low temperature by receiving air from the cooling fan 5, and produces a condensing latent heat. The liquid drop of the refrigerant flows down on the interiors of the tubes 13 by its own weight and stays in the lower tank 15 temporarily. Then, the refrigerant mainly flows from the lower tank 15 into the through passages 10 (hereinafter referred to the condensed liquid passages 10) on the other side in the refrigerant tank 3. The refrigerant which has flowed down through the condensed liquid passages 10 passes through a communication port 17 formed between the lower ends of the partition wall 11 and of the passage walls 12 and the bottom plate 8 and enters the vapor passages 9, thus being used for cooling the IGBT module 2 repeatedly.

On the other hand, the condensing latent heat generated when the refrigerant vapor is condensed and liquefied is transmitted from the walls of the tube walls of the heat radiating tubes 13 to the heat radiating fins 16 and is discharged to the atmosphere. By repeating the heat transfer by the boiling and condensation of the refrigerant, the heat from the IGBT module 2 is discharged to the atmosphere successively, thereby cooling the semiconductor device.

According to the first embodiment, since the refrigerant tank 3 in the cooling apparatus 1 using boiling and condensing refrigerant is constituted by using the extrusion member 7, the cost of the die unit for the extrusion member 7 can be reduced in comparison with the case where the refrigerant tank 3 is constituted by sticking pressed thin-walled members. Even when the number of IGBT module 2 increases, it is not necessary to newly provide a pressing die unit for pressed members if the additional IGBT modules 2 are arranged in plural stages (longitudinally), because the extrusion member 7 can be cut into a suitable length, and thus it is possible to greatly reduce the cost of the die unit.

Since the refrigerant tank 3 is constituted by using the extrusion member 7, it is possible to ensure a sufficient rigidity of the mounting surface of the extrusion member to which the IGBT module 2 is mounted. Consequently, as compared with the case where the refrigerant tank 3 is constituted by using such thin-walled members as pressed members, it is possible to reduce the contact heat resistance between the mounting surface (the outer wall surface of the extrusion member 7) and the IGBT module 2, thereby improving the heat radiating performance. Further, since the extrusion member 7 is used, it is possible to sufficiently ensure the thick-walled portion 7a on which an internal threaded portion are formed, and the shape of the vapor passages 9 and that of the condensed liquid passages 10 can be set freely. This is also advantageous to improve pressure resistance when the refrigerant tank 3 is formed flat. That is, although it is disadvantageous to form the refrigerant tank 3 flat in shape to decrease the amount of refrigerant in terms of pressure resistance, the shape of the vapor passages 9 and that of the condensed liquid passages 10 can be set so as to ensure a sufficient pressure resistance.

Further, by making the thick-walled portion 7a for the forming an internal threaded portion therein to have a margin in its mounting area, it is made possible to use the same extrusion member 7 for various IGBT modules 2 with the different mounting bolt pitches. In other words, various IGBT modules 2 with different mounting bolt pitches can be mounted to the refrigerant tank 3 using the extrusion member 7 without changing its shape. As a result, it is possible to standardize the refrigerant tank 3 and hence possible to reduce the cost in the case of using IGBT modules 2 with different mounting bolt pitches.

Additionally, since the interior of the refrigerant tank 3 is partitioned by the partition wall 11 into the vapor passages 9 and the condensed liquid passages 10, it is possible to definitely separate the flow of boiling refrigerant from that of condensed refrigerant within the tank 3. Consequently, so-called flooding phenomenon in which the boiling refrigerant collides with the condensed refrigerant can be prevented to assure a high heat radiation performance. Moreover, since the vapor passages 9 and the condensed liquid passages 10 are defined by the partition wall 11, the refrigerant in the condensed liquid passages 10 is not directly heated by the heat transmitted from the IGBT module 2 and the temperature thereof is lower than that of the refrigerant in the vapor passages 9. By supplying the low-temperature refrigerant from the condensed liquid passages 10 to the vapor passages successively through the communication port 17, it is possible to cool the IGBT module efficiently.

A second embodiment of the present invention will be described.

FIG. 3 is a cross sectional view of a refrigerant tank 3.

In this second embodiment, the connecting portion of the refrigerant tank 3 with the lower tank 15, namely the other opening portion of an extrusion member 7, is machined in a stepped form. More specifically, vapor passages 9 are formed a little longer than condensed liquid passages 10, as shown in FIG. 3. According to this structure, the liquid refrigerant staying in the lower tank 15 of the radiator 4 can mostly flows into the condensed liquid passages 10 without flowing into the vapor passages 9. As a result, the flooding can be further reduced to improve performance as compared with the first embodiment.

A third embodiment of the present invention will be described.

Figure 4:
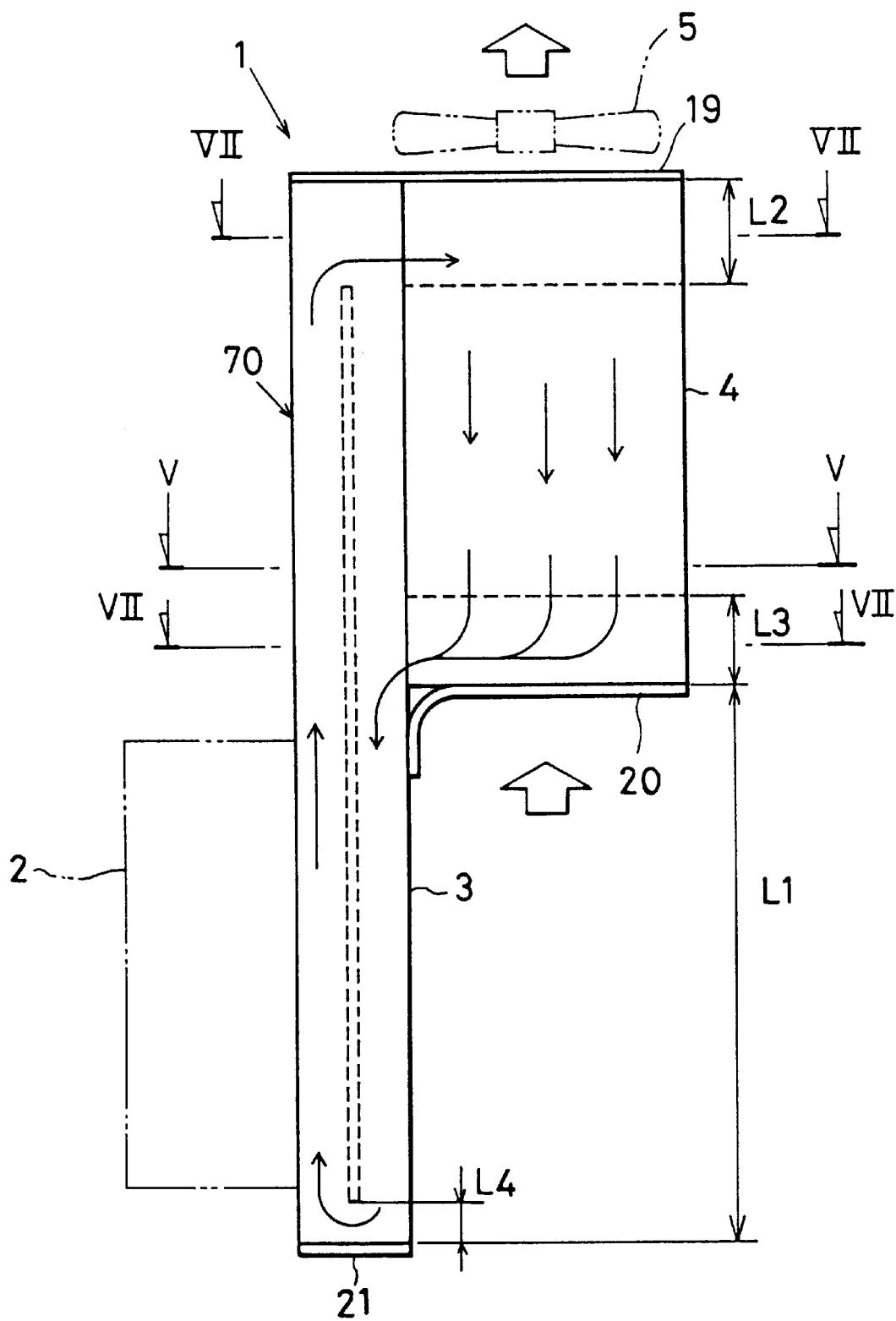
FIG. 4 is a side view of a cooling apparatus using boiling and condensing refrigerant according to a third embodiment.

FIG. 4 is a side view of a cooling apparatus 1 using boiling and condensing refrigerant.

In this embodiment, not only a refrigerant tank 3 but also a radiator 4 is constituted by using a single extrusion member 70. A method for manufacturing the cooling apparatus 1 using boiling and condensing refrigerant using the extrusion member 70 is described.

Firstly, the extrusion member 70 is formed for the entire cooling apparatus from an aluminum block. In this case, as shown in FIG. 5 (a cross sectional view taken on line V—V in FIG. 4), the interior of the extrusion member 70 is partitioned minutely by partition walls 18 to form vapor passages 9 and condensed liquid passages 10 in the refrigerant tank 3 and also form refrigerant passages 4a (corresponding to the heat radiating tubes 13 in the first embodiment) and air flow passages 4b in the radiator 4, in a lattice shape, these passages passing through the extrusion member 70 from upper end to lower end thereof.

Figure 6:
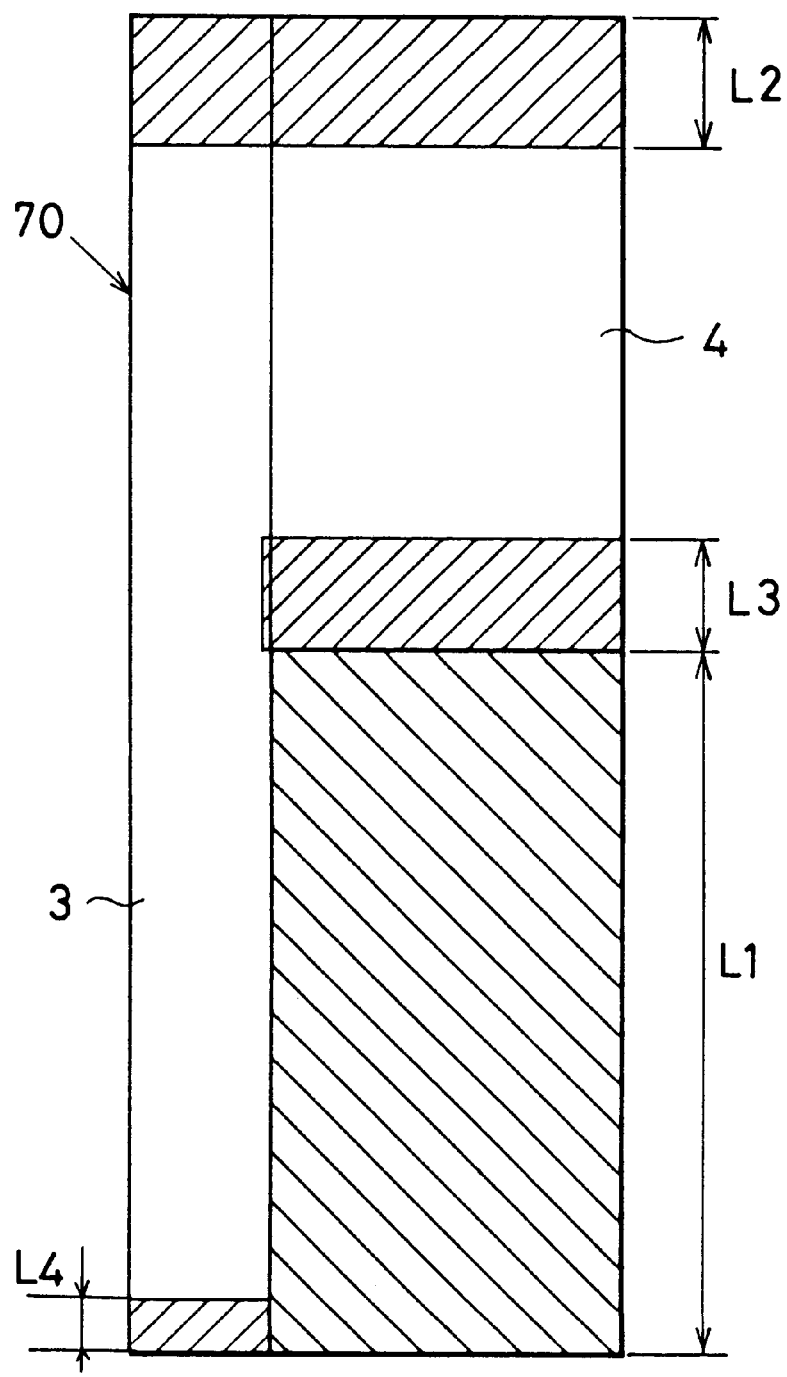
FIG. 6 is a side view showing removed portions of an extrusion member according to the third embodiment.

Next, as shown in FIG. 6, unnecessary portions are removed from the extrusion member 70, provided that, as to the portion L1 shown in FIG. 6, it is wholly removed, while as to the portions L2 and L3, the partition walls 18 which define the refrigerant passages 4a are removed as in FIG. 7 (a cross sectional view taken along line VII—VII in FIG. 4). Further, as to L4, only the inner partition walls 18 are removed.

Subsequently, open faces of the extrusion member 70 are airtightly closed with end plates 19 to 21 to seal the interior space of the extrusion member 70. A plane shape of the end plate 19 is shown in FIG. 8, plane and side shapes of the end plate 20 are shown in FIGS. 9A and 9B, respectively, and a plane shape of the end plate 21 is shown in FIG. 10.

Through the above steps, the cooling apparatus 1 using boiling and condensing refrigerant, in which the same extrusion member 70 is used for both refrigerant tank 3 and radiator 4, can be manufactured.

According to this embodiment, as compared with the first embodiment, not only the cost of the radiator 4 can be reduced, but also the entire cost of the cooling apparatus can be reduced, because the assembling step for both radiator 4 and refrigerant tank 3 is no longer required.

A fourth embodiment of the present invention is described.

Figure 11:
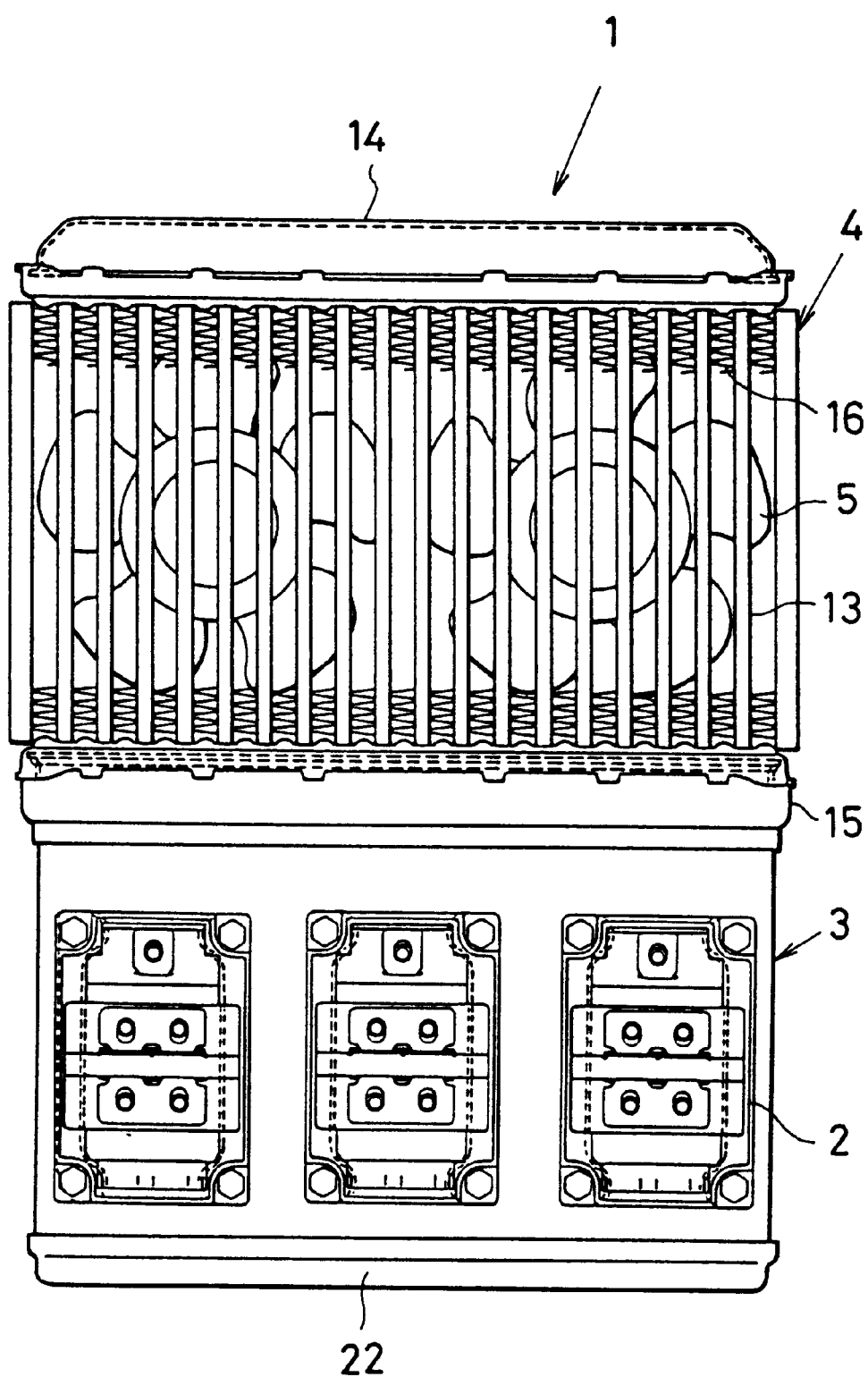
FIG. 11 is a front view of a cooling apparatus using boiling and condensing refrigerant according to a fourth embodiment.
Figure 12:
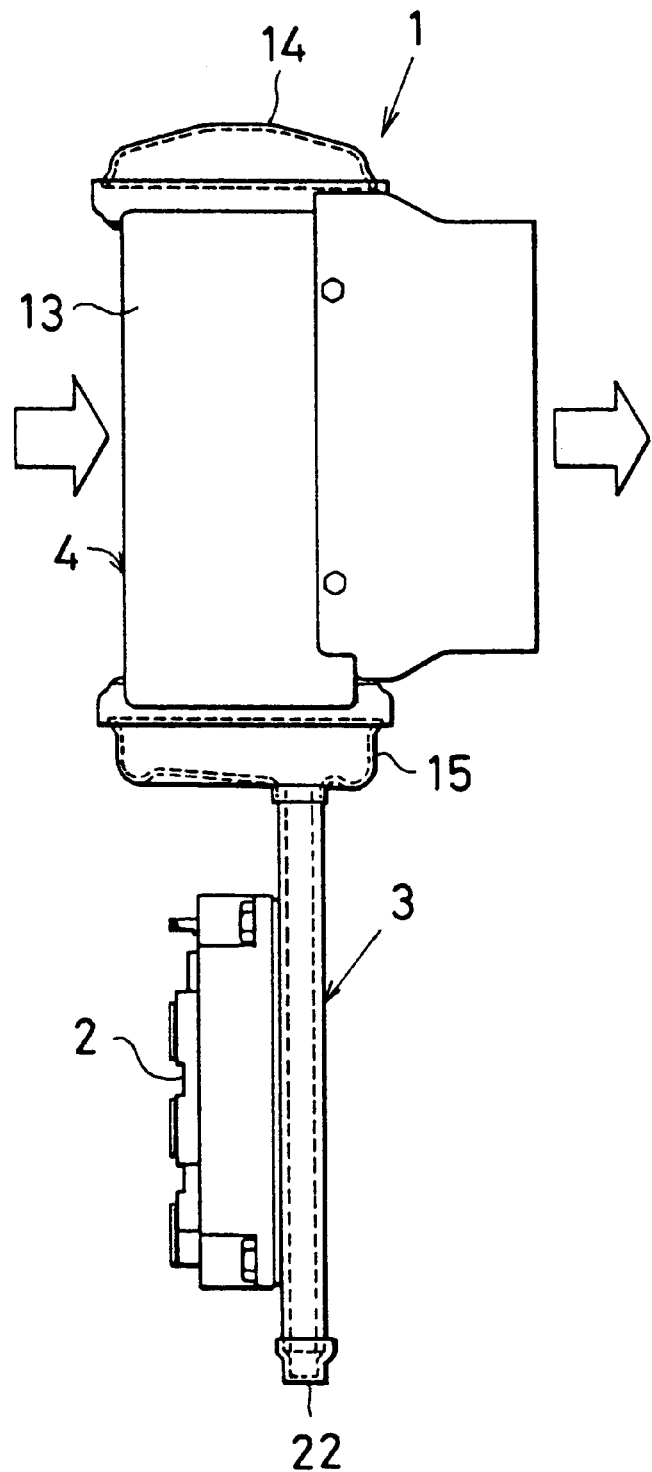
FIG. 12 is a side view of the cooling apparatus using boiling and condensing refrigerant according to the fourth embodiment.

FIG. 11 is a front view of a cooling apparatus 1 using boiling and condensing refrigerant and FIG. 12 is a side view thereof.

A refrigerant tank 3 in this embodiment, as shown in FIG. 3, has a size in which three IGBT modules 2 can be arranged and mounted in the width direction. In the interior of the refrigerant tank 3 are formed three refrigerant chambers 3a (see FIG. 13) corresponding to each IGBT modules 2. Each refrigerant chamber 3a is communicated with each other by an end cap 22 covering one open end of an extrusion member 7.

Figure 13:
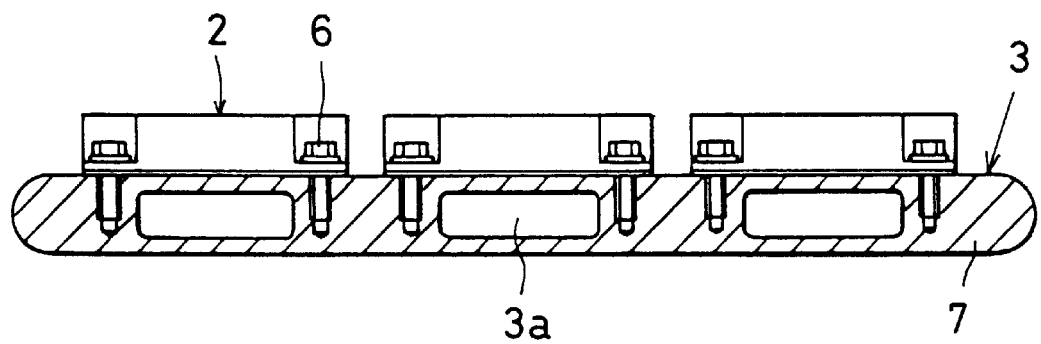
FIG. 13 is a cross sectional view of a refrigerant tank (extrusion member) according to the fourth embodiment.
Figure 14:
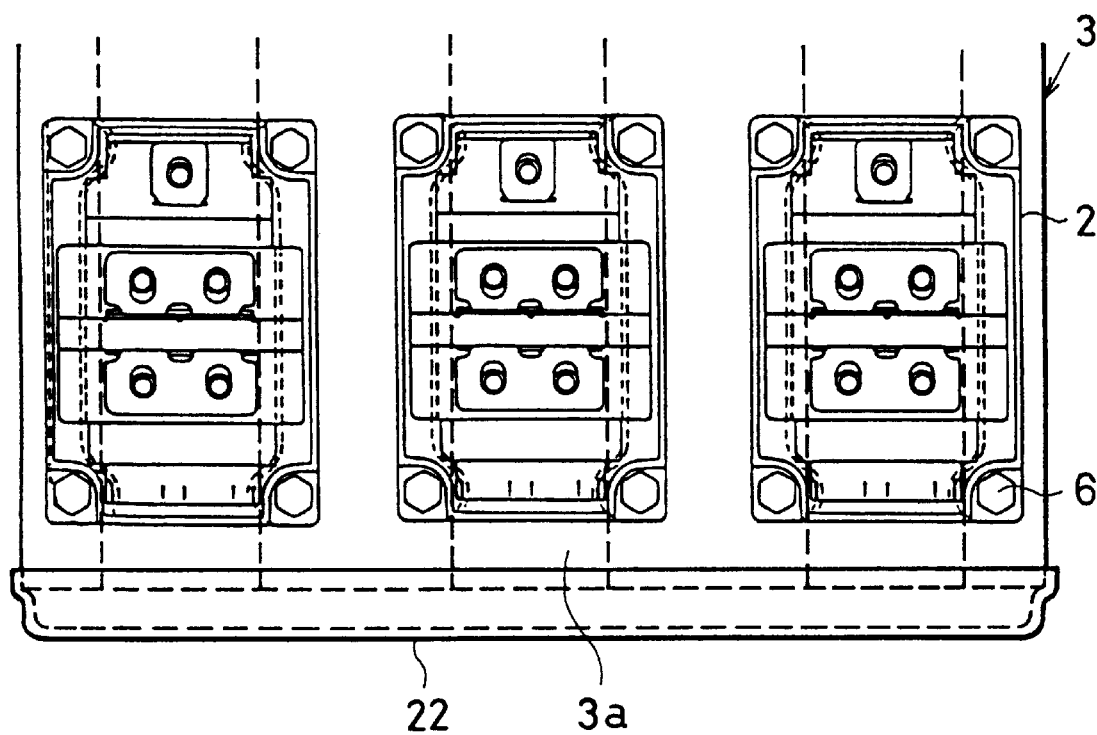
FIG. 14 is a front view of the refrigerant tank according to the fourth embodiment.
Figure 15:
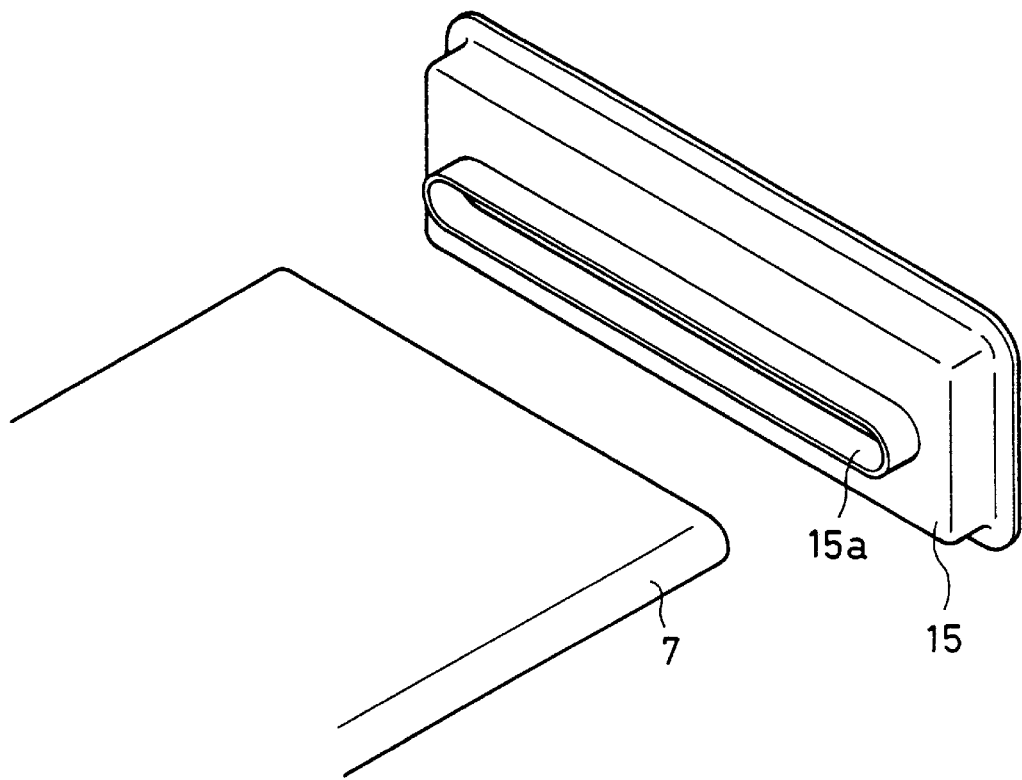
FIG. 15 is a perspective view of the refrigerant tank and a lower tank.

In the same manner as the first embodiment, the extrusion member 7 is obtained from aluminum material by extruding, and three hollow portions serving as the refrigerant chambers 3a are formed therein so as to pass through the extrusion member 7. The extrusion member 7 is formed in such a manner that the outer peripheral shape in its horizontal section corresponds to the inner peripheral shape (see FIG. 15) of an insertion opening 15a formed in a lower tank of a radiator 4. More particularly, as shown in FIG. 13, the outer peripheral surfaces of its both ends in the width direction are formed by convexly curved surfaces of a semicircular shape.

The end cap 22 is made of aluminum like the extrusion member 7. After covering one open end of the extrusion member, the end cap 22 is bonded to the said open end integrally by brazing. The end cap 22 covering the one open end face of the extrusion member 7 does not closely contact with the one open end face but is provided so as to form a gap with the open end face. Each refrigerant chamber 3a is communicated with each other through the gap.

Since the refrigerant tank 3 is constituted by using the extrusion member 7 also in this embodiment, the same effects as those mentioned in the first embodiment by using the extrusion member 7 can be obtained.

Besides, since the refrigerant chambers 3a in the refrigerant tank 3 are in communication with one another through the end cap 22, there is ensured a uniform circulation of refrigerant in each refrigerant chamber 3a. Consequently, there is no possibility that condensed refrigerant eccentrically flows in a specific refrigerant chamber 3a, and hence it is possible to prevent deterioration of the heat radiating performance caused by the eccentric flow of the refrigerant.

A fifth embodiment of the present invention will be described.

Figure 16:
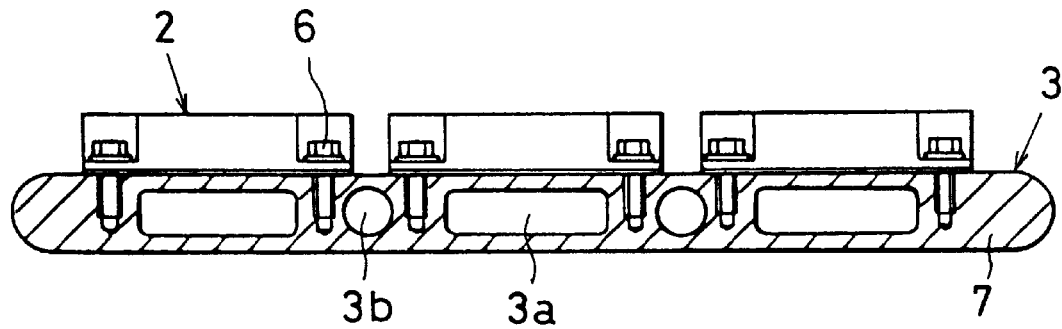
FIG. 16 is a cross sectional view of a refrigerant tank (extrusion member) according to a fifth embodiment.

FIG. 16 is a cross sectional view of a refrigerant tank 3 (extrusion member 7).

Figure 17:
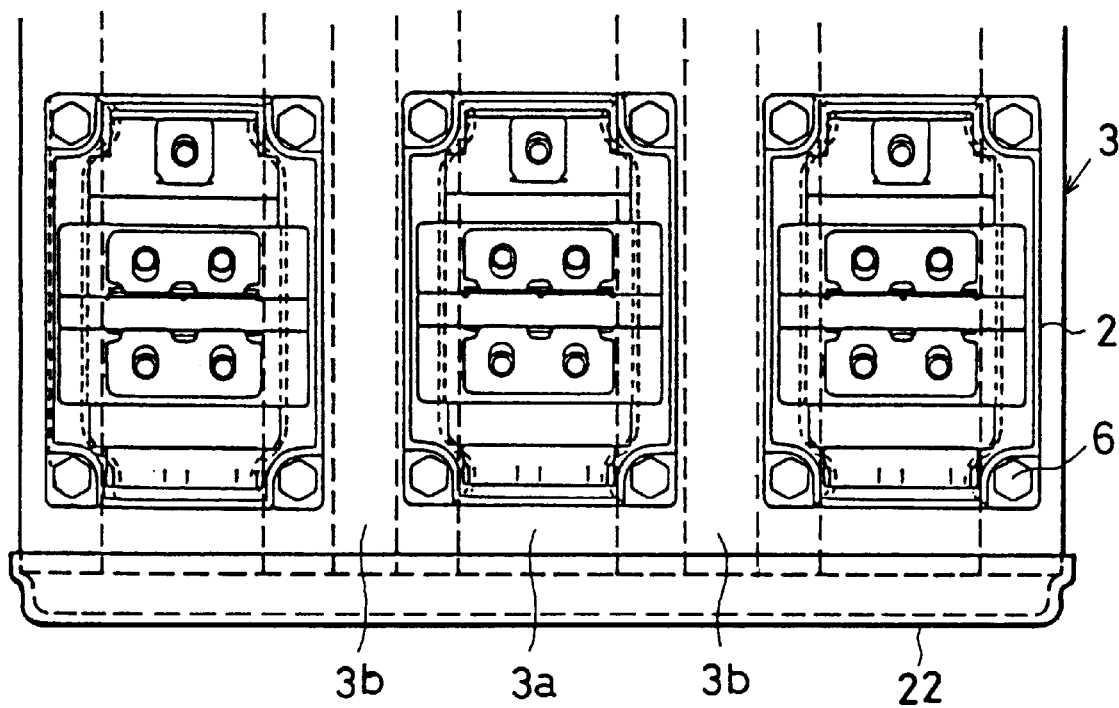
FIG. 17 is a front view of the refrigerant tank according to the fifth embodiment.

In this embodiment, in the same manner as the fourth embodiment, three hollow portions 3a serving as refrigerant chambers 3a are formed through the interior of the extrusion member 7. Further, also between adjacent hollow portions 3a is formed a hollow passage 3b as a through passage. Each hollow passage 3b is open on the upper end side into the lower tank 15 of the radiator 4, while the lower end thereof is in communication with the refrigerant chambers 3a through the end cap 22 (see FIG. 17).

Thus, the hollow passages 3b can be utilized as passages for condensed refrigerant. That is, the refrigerant in the hollow passages 3b does not receive heat directly from the IGBT modules 2, and therefore the temperature is lower than that of the refrigerant in the refrigerant chambers 3a. Thus, by communicating the hollow passages 3b with the refrigerant passages 3a to supply the low-temperature refrigerant in the hollow passages 3b into the refrigerant chambers 3a, it is possible to cool the IGBT modules 2 efficiently. Further, by forming the hollow passages 3b, it is possible to lighten the weight.

A sixth embodiment of the present invention will be described.

Figure 18:
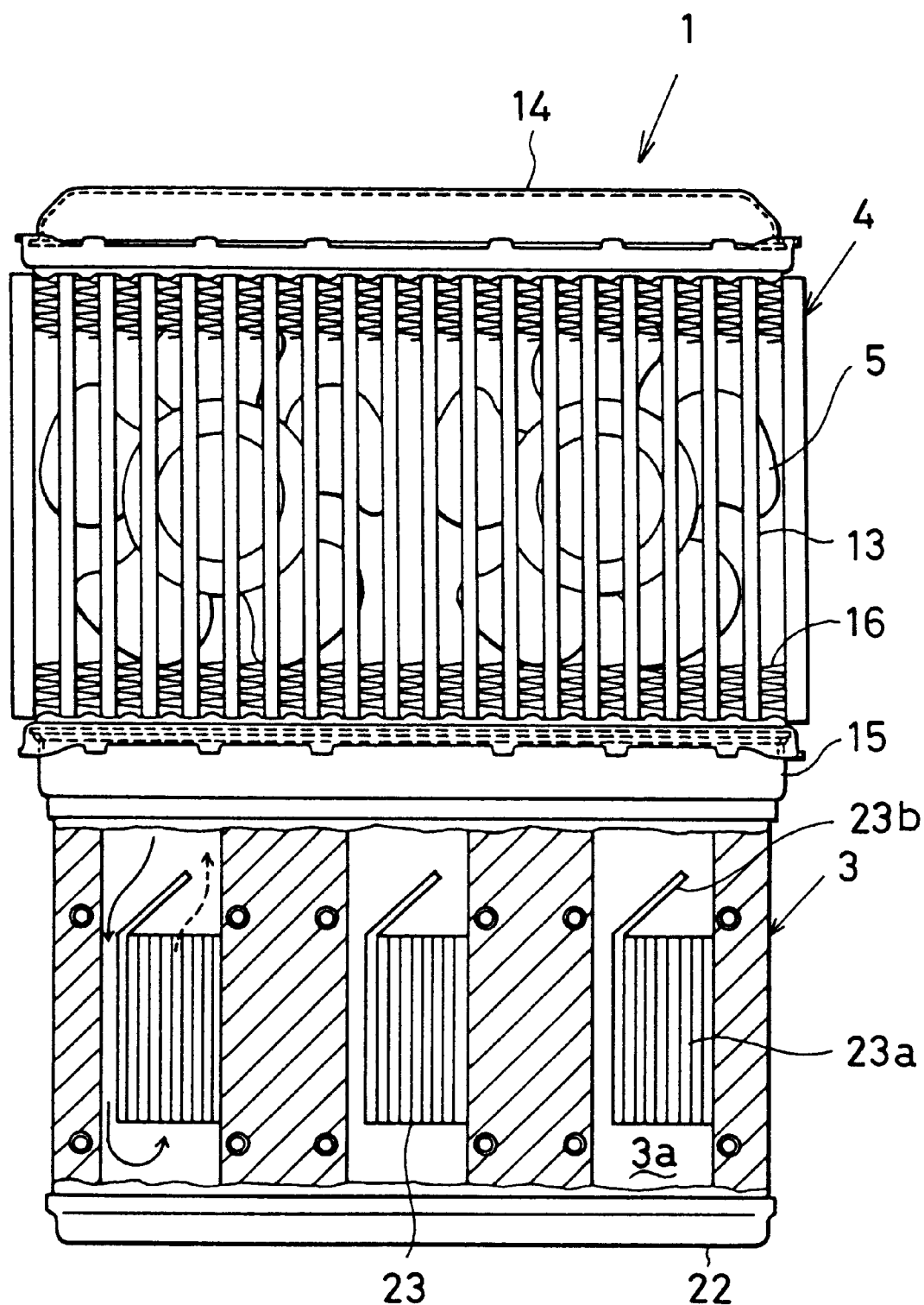
FIG. 18 is a front view of a cooling apparatus using boiling and condensing refrigerant (with a refrigerant tank being shown in cross section) according to a sixth embodiment.

FIG. 18 is a front view of a boiling cooling apparatus 1 with a cross sectional view of a refrigerant tank 3.

In this embodiment, a refrigerant flow control plate 23 is disposed in each refrigerant chamber 3a in the refrigerant tank 3 already described in the fourth embodiment.

Figure 19:
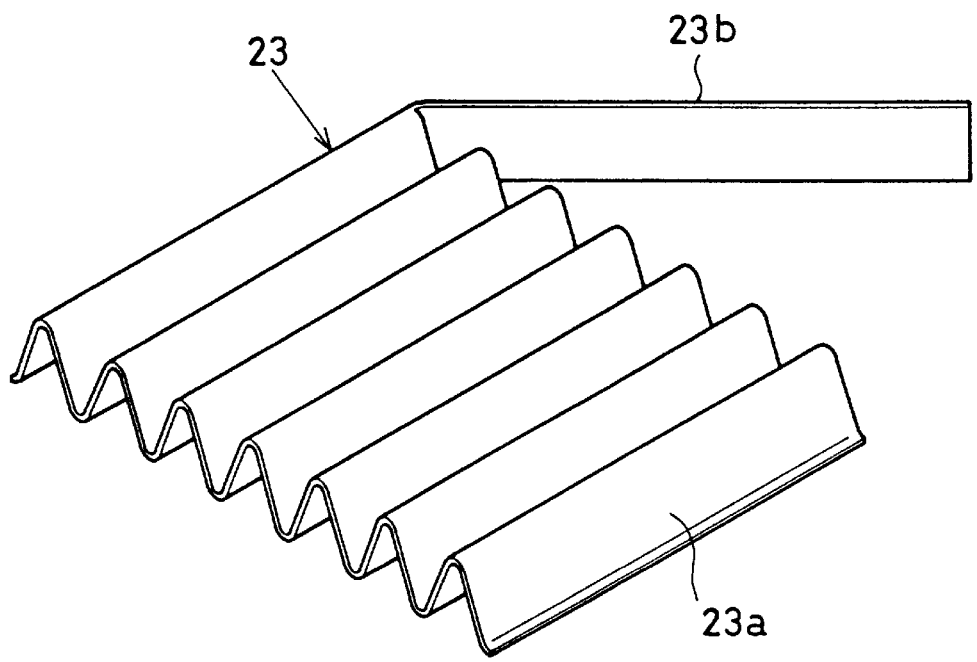
FIG. 19 is a perspective view of a refrigerant flow control plate according to the sixth embodiment.

For example, as shown in FIG. 19, the refrigerant flow control plate 23 includes a flow smoothing portion 23a formed in the shape of corrugated fins and an inclined plate 23b extending obliquely from one end portion of the flow smoothing portion 13a. In each refrigerant chamber 3a, the refrigerant flow control plate 23 is disposed as shown in FIG. 18.

Once the refrigerating flow control plate 23 is disposed in each refrigerant chamber 3a, the flow of condensed refrigerant (indicated with a solid-line arrow in FIG. 18) and that of boiling refrigerant (indicated with a broken-line arrow in FIG. 18) can be separated from each other by the inclined plate 23b, thus making it possible to prevent the flooding phenomenon in which boiling refrigerant collides with condensed refrigerant. Besides, the flow of boiling refrigerant can be rendered uniform by the flow smoothing portion 23a, and since each flow smoothing portion 23a fulfills the function of a reinforcing material, the rigidity of the refrigerant tank 3 is improved, whereby the contact heat resistance between the IGBT modules 2 (heat radiating plate 2a) and the refrigerant tank 3 can be made low. Further, if the refrigerant flow control plate 23 is formed of aluminum which is superior in heat conductivity, the heat radiation area of the refrigerant tank 3 increases because the flow smoothing portion 23a functions also as inner fins. As a result, it is possible to improve the heat radiating performance.

A seventh embodiment of the present invention will be described.

Figure 20:
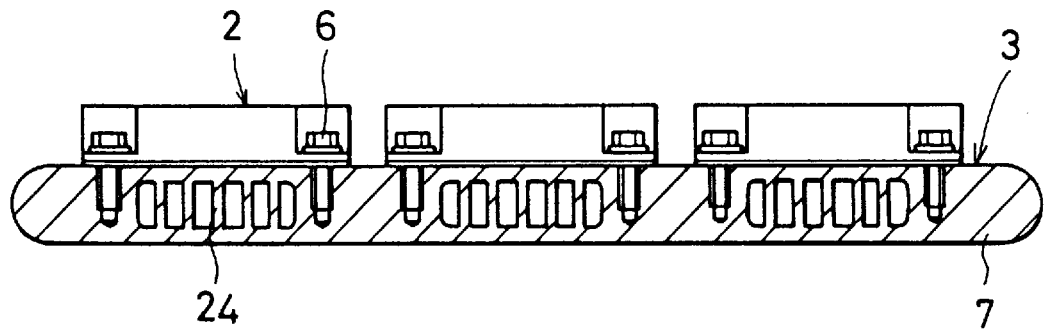
FIG. 20 is a cross sectional view of a refrigerant tank (extrusion member) according to a seventh embodiment.
Figure 21:
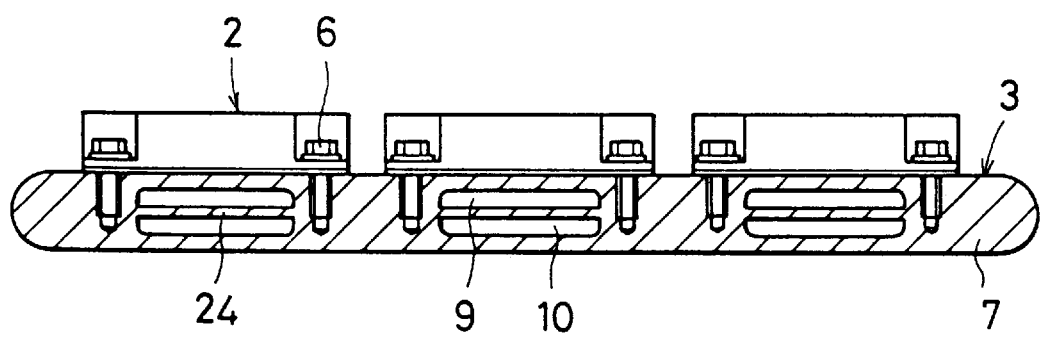
FIG. 21 is a cross sectional view of a refrigerant tank (extrusion member) according to the seventh embodiment.
Figure 22:
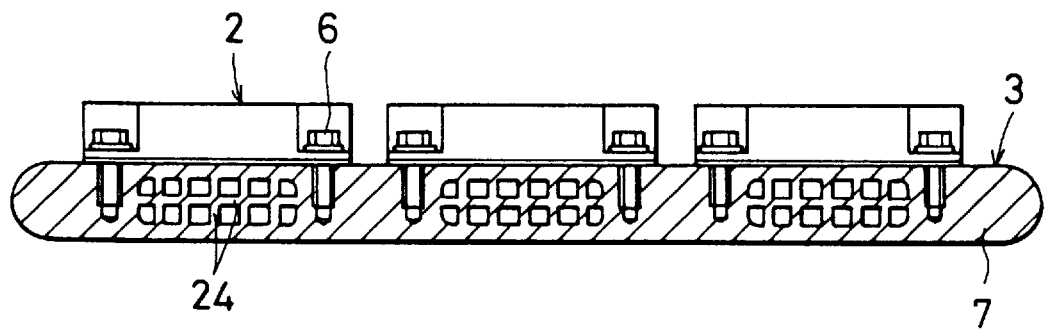
FIG. 22 is a cross sectional view of a refrigerant tank (extrusion member) according to the seventh embodiment.

FIGS. 20 to 22 are cross sectional views of refrigerant tanks 3 (extrusion members 3).

In this embodiment, partition walls 24 (corresponding to the partition wall 11 or passage walls 12 in the first embodiment) are provided in refrigerant chambers 3a in the refrigerant tank 3 described in the fourth embodiment. As shown in FIG. 20, partition walls 24 are formed in the thickness direction of the refrigerant tank 3, and thereby not only the rigidity of the refrigerant tank 3 can be improved but also the flow of refrigerant in each refrigerant chamber 3a can be rendered uniform.

In FIG. 21, by forming the partition walls 24 along the width direction of the refrigerant tank 3, the vapor passage 9 and condensate passage 10 are formed in the same manner as in the first embodiment, thus making it possible to separate the flow of boiling refrigerant (indicated with a broken-line arrow in FIG. 23) and that of condensed refrigerant (indicated with a solid-line arrow in FIG. 23) from each other. As a result, it is possible to prevent the flooding phenomenon in which the boiling refrigerant collides with the condensed refrigerant, and hence the heat radiating performance is improved. Further, as shown in FIG. 22, by forming partition walls 24 in both thickness direction and width direction of the refrigerant tank 3, it is possible to expect both effects obtained in the embodiments shown in FIGS. 20 and 21.

An eighth embodiment of the present invention will be described.

FIG. 24 is a side view of a cooling apparatus 1 using boiling and condensing refrigerant with a cross section of the refrigerant tank 3.

Figure 25:
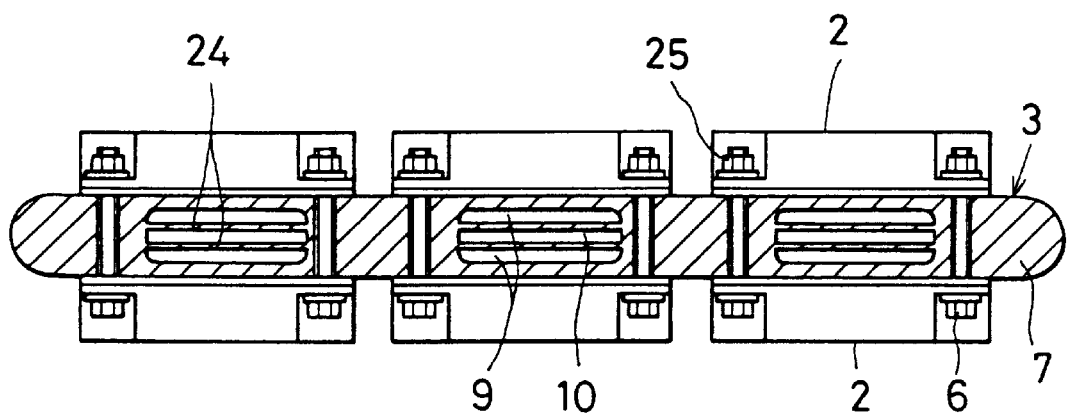
FIG. 25 is a cross sectional view of the refrigerant tank (extrusion member) according to the eighth embodiment.

In this embodiment, IGBT modules 2 are mounted to both sides of the refrigerant tank 3. Each refrigerant chamber 3a is divided in three parts in the thickness direction by means of two partition walls 24 provided in the width direction (see FIG. 25). In this case, the space formed centrally in the thickness direction serves as a condensate passage 10 as in the first embodiment, and the spaces formed on both sides of the central space serve as the vapor passages 9. Also, in this embodiment, the flow of boiling refrigerant and that of condensed refrigerant are separated from each other to prevent flooding, and thereby the heat radiating performance can be obtained. Bolts 6 for fixing the IGBT modules 2 pass through the extrusion member 7 and are tightened with nuts 25.

A ninth embodiment of the present invention will be described.

Figure 26:
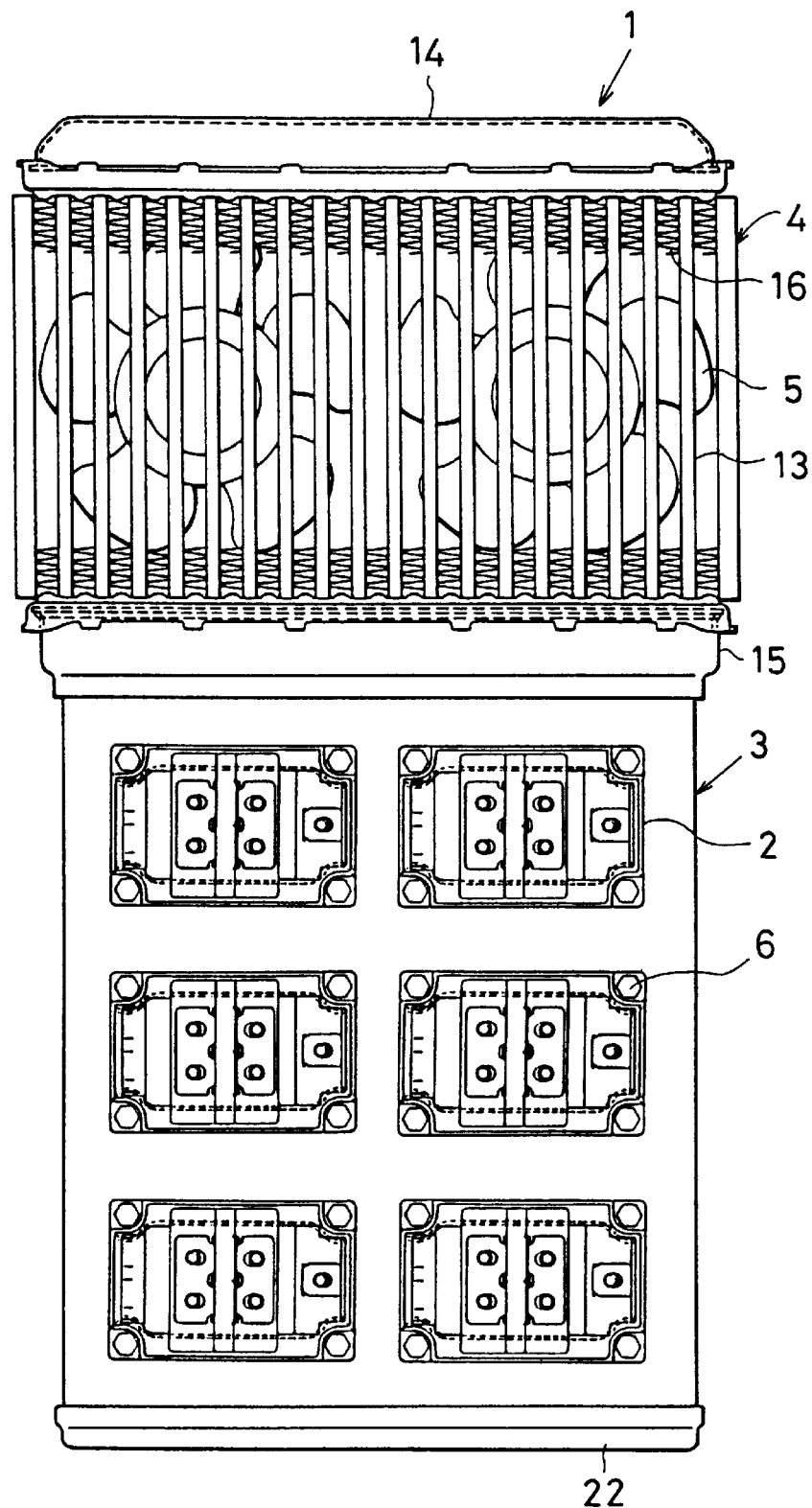
FIG. 26 is a front view of a cooling apparatus using boiling and condensing refrigerant according to a ninth embodiment.
Figure 27:
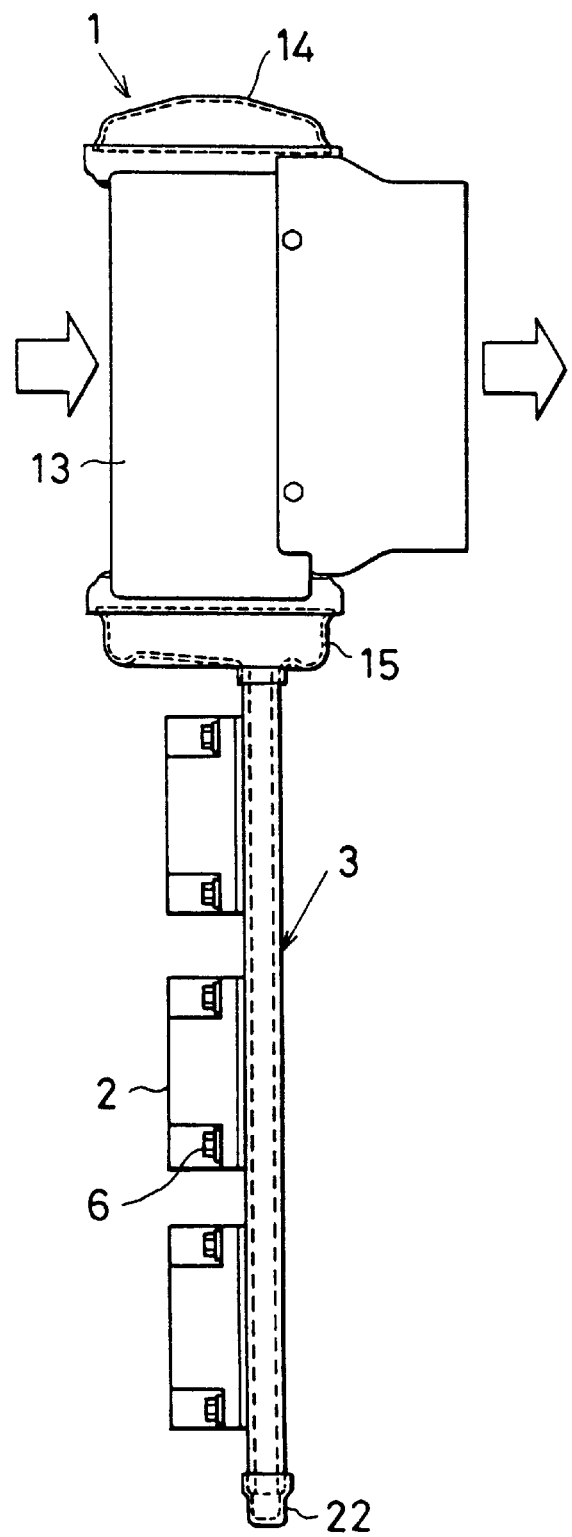
FIG. 27 is a side view of the cooling apparatus using boiling and condensing refrigerant according to the ninth embodiment.

FIG. 26 is a front view of a cooling apparatus 1 using boiling and condensing refrigerant and FIG. 27 is a side view thereof.

In this embodiment, the number of IGBT modules 2 in the height direction of the refrigerant tank 3 is increased (that is, arranging IGBT modules 2 in plural stages). It is possible to arrange these IGBT modules 2 by merely changing the length of the extrusion member 7 which constitutes the refrigerant tank 3.

A tenth embodiment of the present invention is described.

Figure 28:
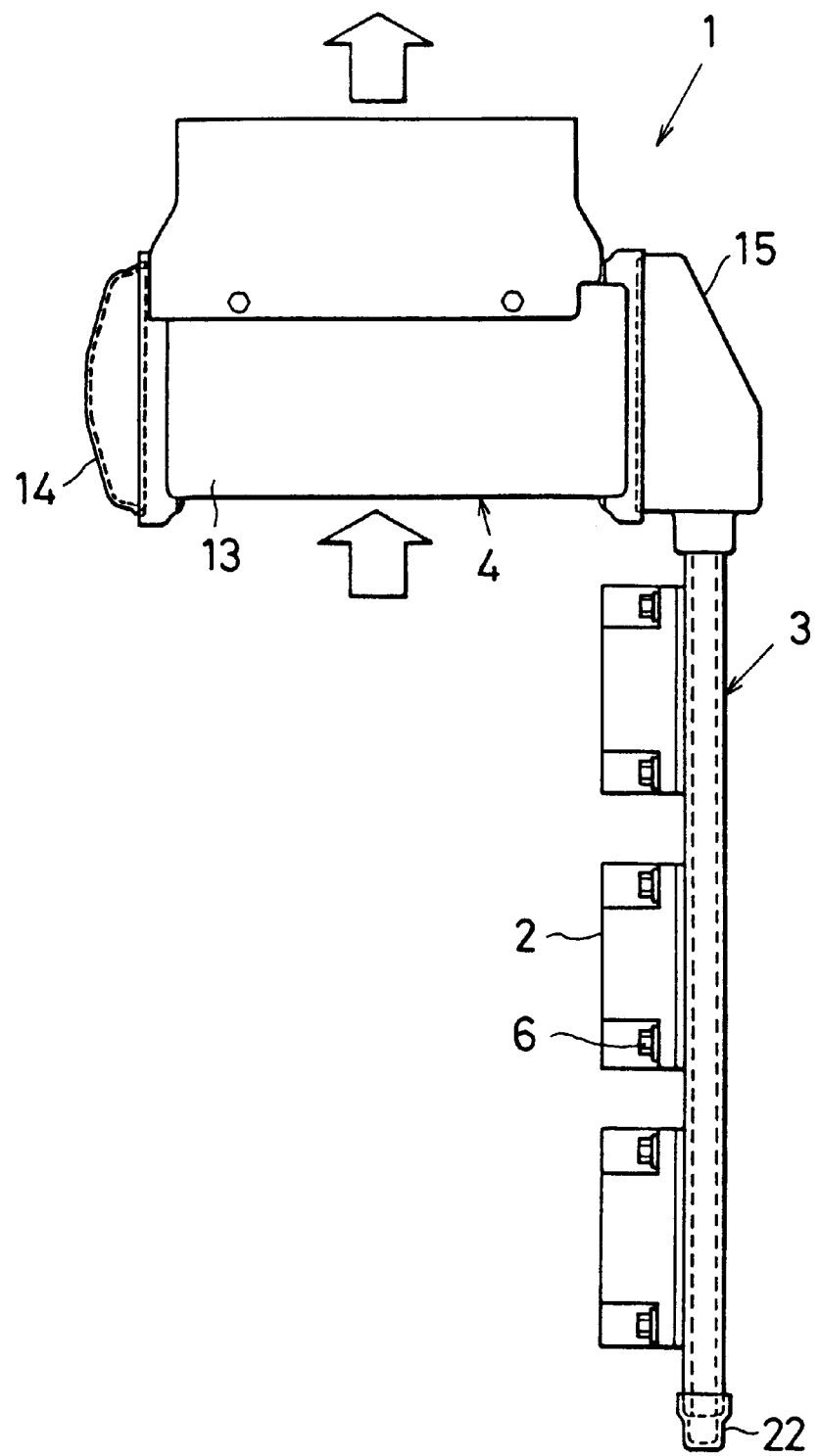
FIG. 28 is a side view of a cooling apparatus using boiling and condensing refrigerant according to a tenth embodiment.

FIG. 28 is a side view of a cooling apparatus 1 using boiling and condensing refrigerant.

According to this embodiment, a radiator 4 is assembled with a refrigerant tank 3 inclinedly at an angle of approximately 90 degrees relative to the refrigerant tank, and air is blown nearly perpendicularly to the radiator 4.

An eleventh embodiment of the present invention will be described.

Figure 29:
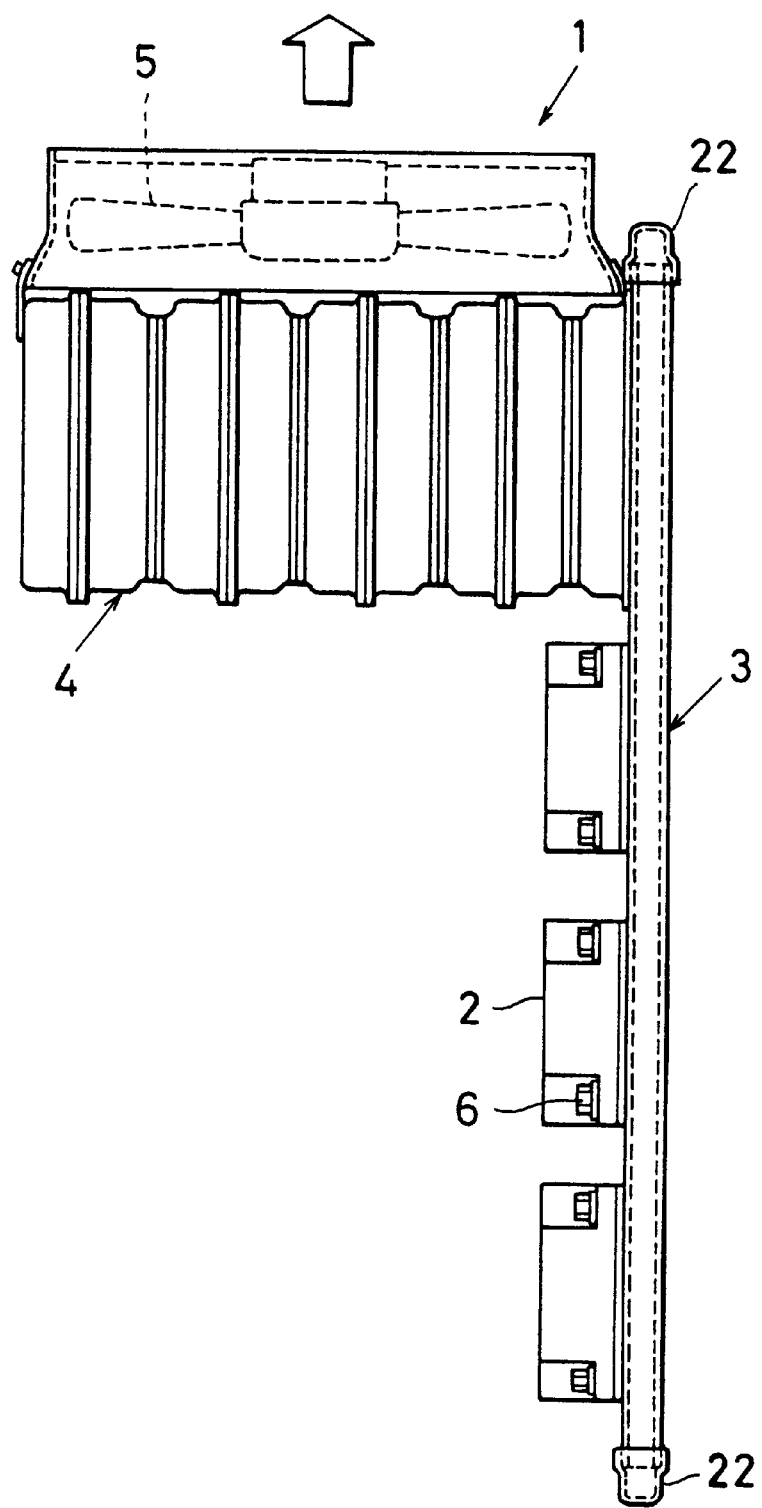
FIG. 29 is a side view of a cooling apparatus using boiling and condensing refrigerant according to an eleventh embodiment.

FIG. 29 is a side view of a cooling apparatus 1 using boiling and condensing refrigerant.

In this embodiment, so-called a drawn-cup type radiator 4 is employed. In this embodiment, since the radiator 4 is mounted to a side face of a refrigerant tank 3 and the end cap 22 covers to each open end of an extrusion member 7 which constitutes the refrigerant tank 3.

A twelfth embodiment of the present invention will be described.

Figure 30:
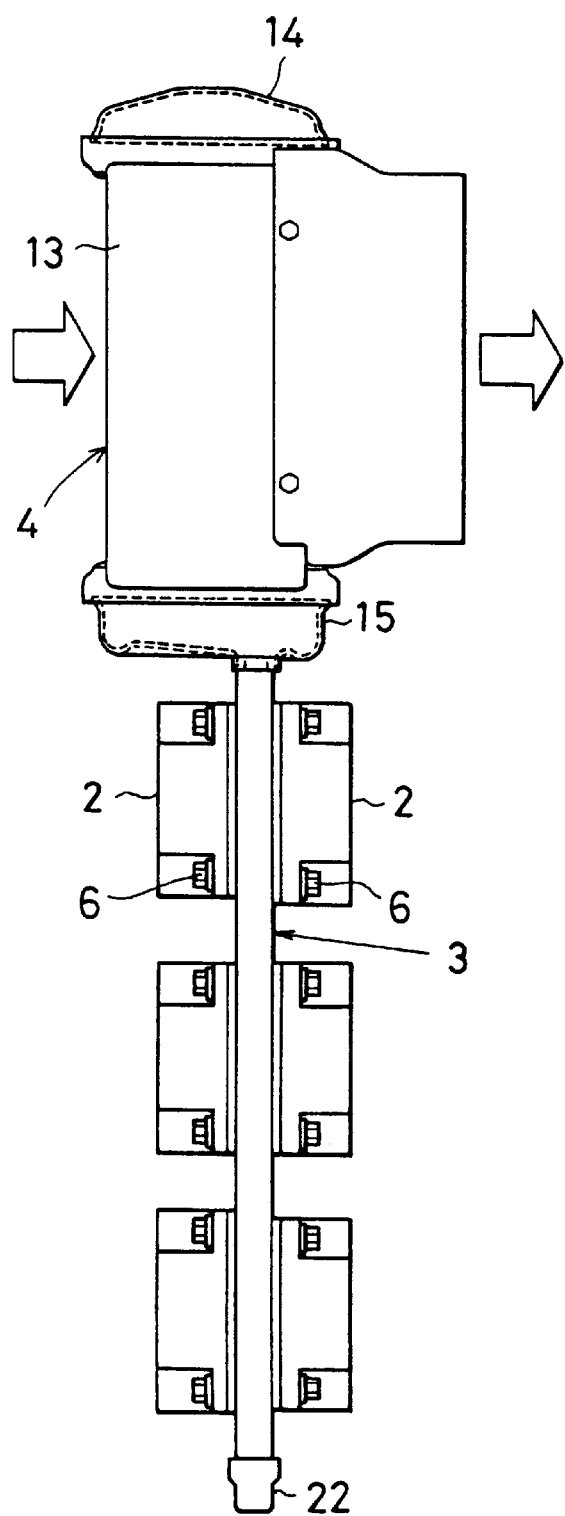
FIG. 30 is a side view of a cooling apparatus using boiling and condensing refrigerant according to a twelfth embodiment.

FIG. 30 is a side view of a cooling apparatus 1 using boiling and condensing refrigerant.

In this embodiment, IGBT modules 2 are mounted to both sides of a refrigerant tank 3, and the number of IGBT modules 2 is increased in the height direction of the refrigerant tank 3 in the same manner as in the eighth embodiment.

In each of the above fourth to twelfth embodiments, although the end cap 22 covers an open end of the extrusion member 7, the open end may be closed with the bottom plate 8 in the same manner as in the first embodiment.

A thirteenth embodiment of the present invention will be described.

Figure 31:
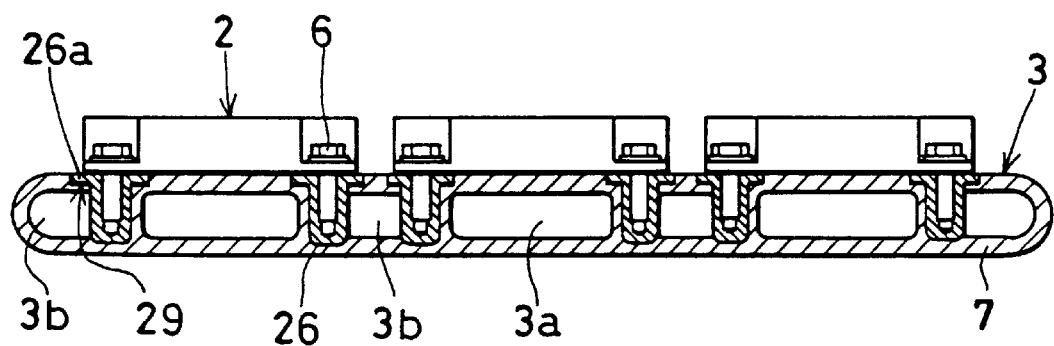
FIG. 31 is a cross sectional view of a refrigerant tank (extrusion member) according to a thirteenth embodiment.
Figure 32:
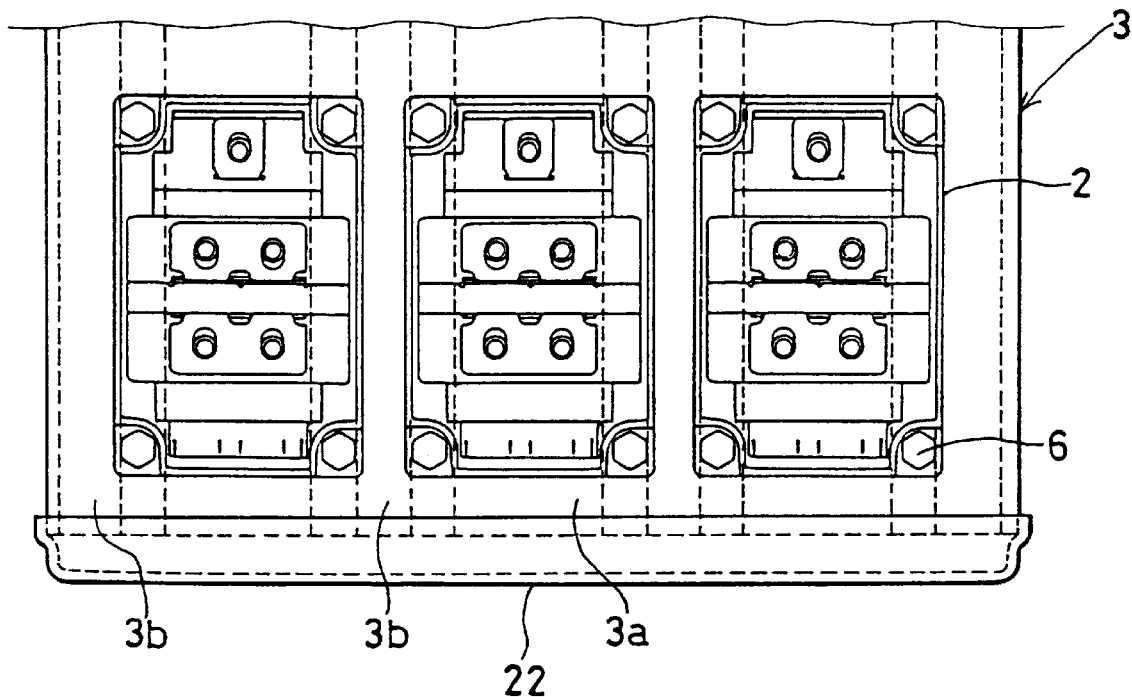
FIG. 32 is a front view of the refrigerant tank (extrusion member) according to the thirteenth embodiment.
Figure 33:
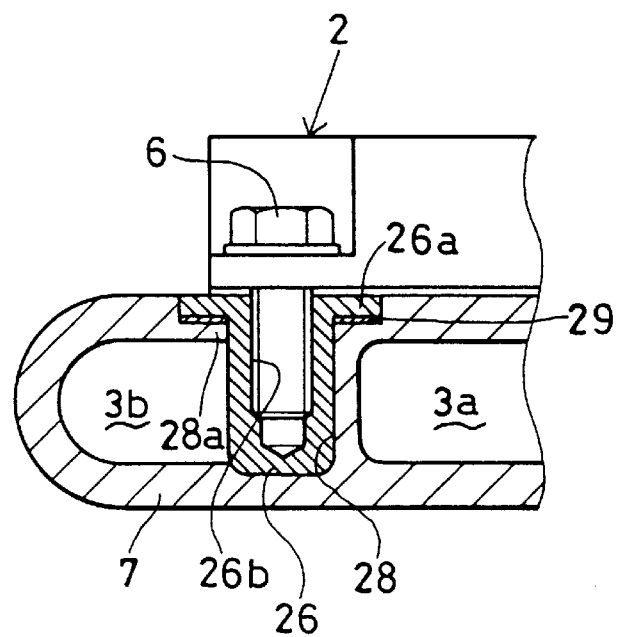
FIG. 33 is a partial cross sectional view of the refrigerant tank (extrusion member) according to the thirteenth embodiment.

FIG. 31 is a cross sectional view of a refrigerant tank 3 (extrusion member 7), FIG. 32 is a front view of the refrigerant tank 3, and FIG. 33 is a partial cross sectional view of the refrigerant tank 3 (extrusion member 7).

In this embodiment, a mounting member 26 is used at the portion where each bolt 6 is tightened, the mounting member 26 being provided separately from the extrusion member 7.

The mounting member 26 is made of aluminum for example, and is formed in a cylinder having a bottom with only one end side being open. The outer periphery of the opening of the mounting member 26 is formed with a flange portion 26a, and internal thread portions 26b (see FIG. 33) are formed on the inner peripheral surface of the cylinder.

On the other hand, in the extrusion member 7 are formed mounting holes 28 (see FIG. 33), to which the mounting members 26 are inserted, at positions corresponding to the mounting pitch of the bolts 6. As shown in FIG. 33, the mounting holes 28 are formed in such a manner that the outer wall portions of the extrusion member 7 for supporting the flange portions 26a of the mounting members 26 remain as wall surfaces 28a.

Each mounting member 26 is fitted between wall surface 28a of the mounting hole 28 and the flange portion 26a so as to interpose a ring-like brazing sheet 29, and is thereafter integrally bonded to the mounting hole by brazing. In brazing, the ring-like brazing sheet 29 melts, and the flange portion 26a is thereby bonded to the wall surface 28a of the mounting hole 28, so that the airtightness of the refrigerant tank 3 is not impaired.

According to this structure, since threaded holes (internal threaded portions) to which the extrusion member 7 is tightened with bolts 6 are not needed, it is not necessary to ensure a thick-walled portion for forming such threaded holes. Consequently, surplus thick-walled portions can be minimized in the extrusion member 7 and instead it is possible to enlarge refrigerant chambers 3a or to form the passages (hollow passages 3b) for condensed refrigerant described in the fifth embodiment. Consequently, the heat mass (heat capacity) of the extrusion member 7 becomes smaller, so that the increase in temperature of the extrusion member 7 when the refrigerant tank 3 (extrusion member 7) is brazed with the radiator 4 becomes faster and hence the brazing performance with the radiator 4 having a heat mass smaller than that of the refrigerant tank 3 is improved.

A fourteenth embodiment of the present invention will be described.

FIGS. 34 to 37 are each a partial cross sectional view of a refrigerant tank 3 (extrusion member 7).

In this embodiment, the mounting member 26 in the thirteenth embodiment is also used.

Figure 34:
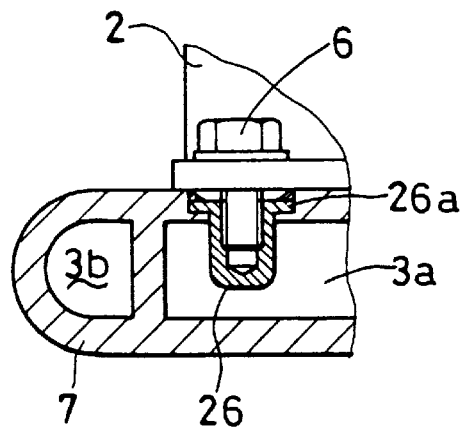
FIG. 34 is a partial cross sectional view of a refrigerant tank (extrusion member) according to a fourteenth embodiment.

A mounting member 26 shown in FIG. 34 is fitted into a mounting hole 28 in a little retracted (recessed) state from the surface of the extrusion member 7. Not by brazing with the brazing sheet 29 mentioned in the thirteenth embodiment, but by brazing with a touch or by welding, the mounting member 26 is bonded to the extrusion member 7. In this case, since the surface of a flange portion 26a is recessed with respect to the surface of the extrusion member 7, even when defective brazing is caused, it is possible to repair easily by re-heating with a torch.

Figure 35:
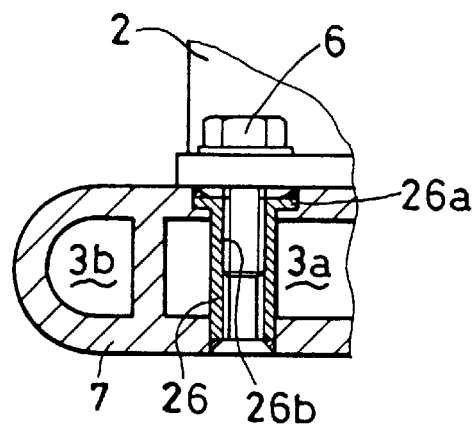
FIG. 35 is a partial cross sectional view of a refrigerant tank (extrusion member) according to the fourteenth embodiment.

A mounting member shown in FIG. 35 passes through the extrusion member 7 from one end-face side to the other end-face side and is bonded to the extrusion member 7 by brazing with a torch or by welding in the same manner as in FIG. 34. In this case, since the overall length of the mounting member 26 is large, it is possible to ensure a large length of connection with a bolt 6 and hence possible to improve the tightening force of the bolt. Besides, internal threads 26b are formed on the inner peripheral surface of the mounting member 26 throughout the overall length of the same member and therefore it is also possible to fix IGBT modules 2 to both sides of the extrusion member 7.

Figure 36:
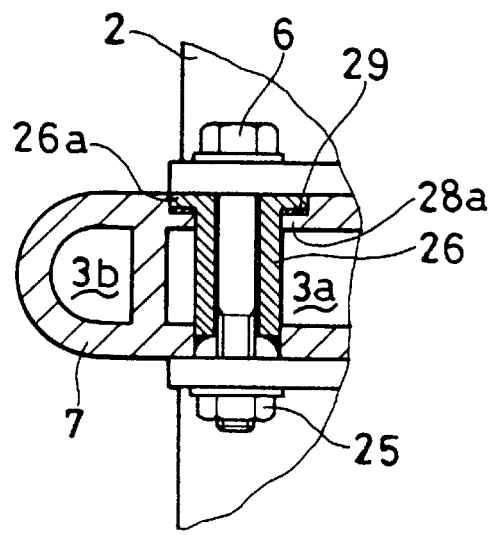
FIG. 36 is a partial cross sectional view of a refrigerant tank (extrusion member) according to the fourteenth embodiment.

A mounting member 26 shown in FIG. 36 is formed in a cylindrical shape without having internal threads 26b on its inner peripheral surface and passes through the extrusion member 7 from one end-face side to the other end-face side. A flange portion 26a side of the mounting member 26 is integrally bonded to a wall surface 28a of a mounting hole 28 by brazing with a ring-like brazing sheet 29 interposed between the flange portion 26a and the wall surface 28a, while the side opposite to the flange portion 26a is bonded to the mounting hole by brazing with a torch or by welding. In this case, by disposing IGBT modules 2 on both sides of the extrusion member 7, then inserting a bolt 6 from one end-face side of the extrusion member 7 (from the upper side in FIG. 36) along the inner peripheral surface of the mounting member 26, and further by tightening a nut 25 onto the tip end portion of the bolt 6 on the other end-face side of the extrusion member 7, it is possible to simultaneously fix the IGBT modules 2 disposed on both sides of the extrusion member.

Figure 37:
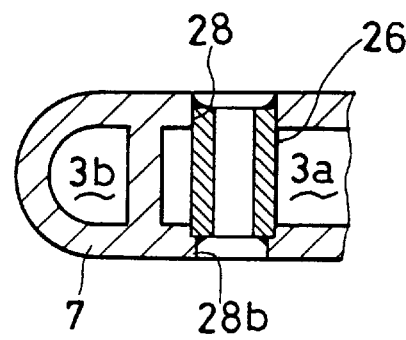
FIG. 37 is a partial cross sectional view of a refrigerant tank (extrusion member) according to the fourteenth embodiment.

A mounting member 26 shown in FIG. 37 is formed in a cylindrical shape without having internal threads 26b on its inner peripheral surface, in the same manner as the mounting member 26 shown in FIG. 36, however, the cylindrical shape is a simple shape without having flange portion 26a. Such a simple cylindrical shape reduces the manufacturing cost as well as the entire cost of the cooling apparatus. By forming a convex portion 28b protruding to the inner peripheral side at an end portion of a mounting hole 28 which is formed in the extrusion member 7, it is possible to set the mounting member 26 in a predetermined position.

A fifteenth embodiment of the present invention will be described.

Figure 38:
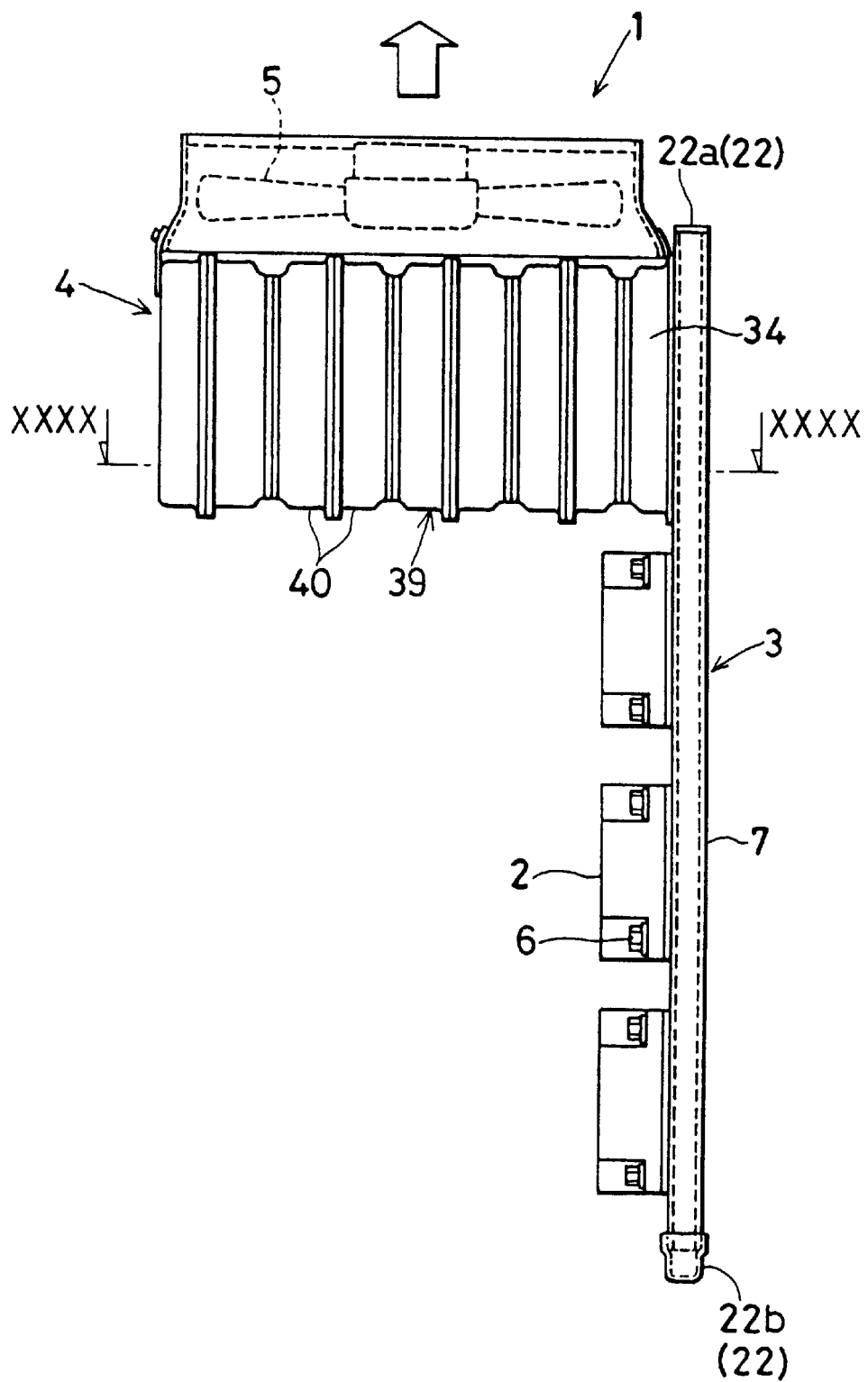
FIG. 38 is a side view of a cooling apparatus using boiling and condensing refrigerant according to a fifteenth embodiment.
Figure 39:
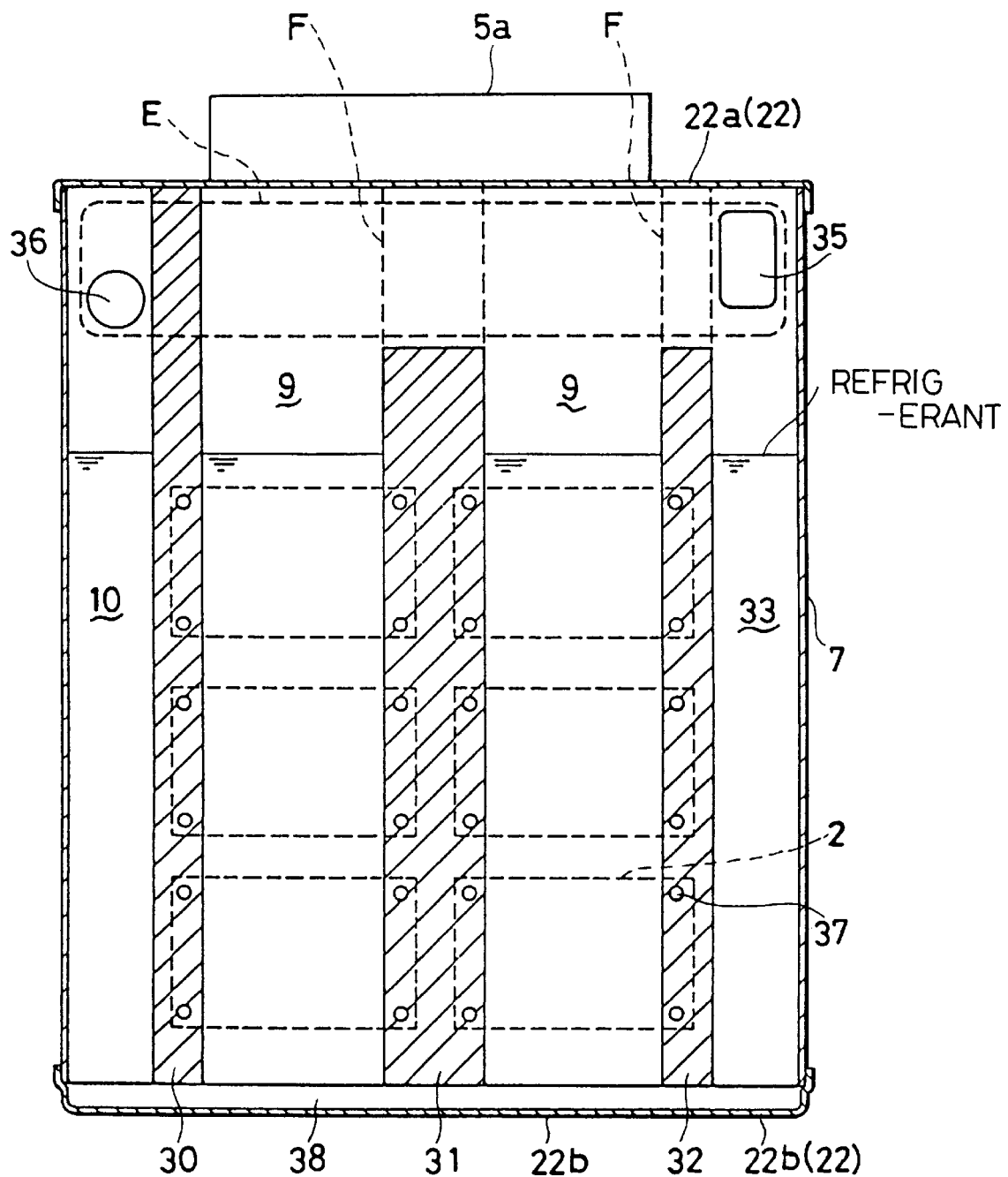
FIG. 39 is a cross sectional view of a refrigerant tank according to the fifteenth embodiment.
Figure 40:
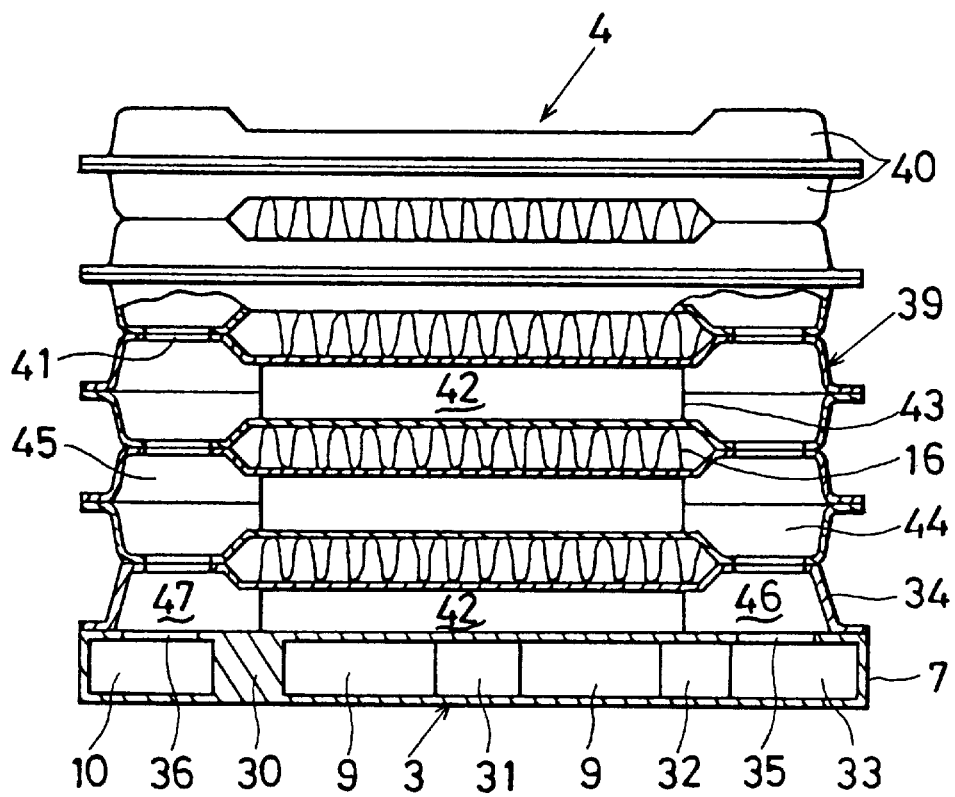
FIG. 40 is a cross sectional view taken along line XL—XL in FIG. 38 according to the fifteenth embodiment.

FIG. 38 is a side view of a cooling apparatus 1 using boiling and condensing refrigerant, FIG. 39 is a cross sectional view of a refrigerant tank 3, and FIG. 40 is a cross sectional view taken along line XL—XL in FIG. 38.

According to this embodiment, the cooling apparatus 1 using boiling and condensing refrigerant is constructed so that the capacity of the radiator 4 can be altered according to the number (i.e. the total amount of heat generated) of IGBT modules 2 attached to the refrigerant tank 3.

The refrigerant tank 3 includes an extrusion member 7 obtained by extrusion and end caps 2 (22a, 22b) which are bonded to both upper and lower end portions of the extrusion member 7.

In the extrusion member 7, as shown in FIG. 39, vapor passages 9, condensed liquid passage 10 and inoperative passage 33 passing longitudinally through the extrusion member are formed by support portions 30, 31 and 32 extending vertically. Further, an outlet port 35 of the vapor passages 9 and an inlet port 36 of the condensate passage 10 are open to an area (the area indicated with a broken line E in FIG. 39) to which a radiator 4 (heat radiating pipe 39) is connected through a connection plate 34 (see FIG. 38). As shown in FIG. 39, the inlet and outlet ports 36 and 35 are formed so that the lower opening end of the inlet port 36 is positioned a little lower than the lower opening end of the outlet port 35.

The upper portion of the support portion 31 located between the two vapor passages 9 and that of the support portion between one vapor passage 9 and the inoperative passage 33, the upper portions indicated with broken lines F in FIG. 39, are removed by an additional machining step such as milling, thereby the outlet port 35 communicates with the vapor passages 9. In the support portions 30 to 32 are formed threaded holes 37 to which bolts 6 for mounting the IGBT modules 2 are threaded. The inoperative passage 33 is formed for balance with the condensed liquid passage 10 in extruding process is not used as the condensed liquid passage 10. Therefore, the inoperative passage 33 may not be always formed.

The end caps 22 are integrally bonded to both end portions of the extrusion member 7 by brazing. The end cap 22a located on the upper end side closes the upper-end opening of the extrusion member 7, while the end cap 22b located on the lower end side defines a communication path 38 with the lower end face of the extrusion member 7 to mutually communicate with the vapor passages 9, condensate passage 10 and inoperative passage 33.

The radiator 4 is so-called a drawn-cup type heat exchanger. As shown in FIG. 40, the radiator 4 is constituted by laminating plural heat radiating pipes 39 which are hollow and each has the identical shapes, and is connected to the refrigerant tank 3 through the connection plate 34.

Each of the heat radiating pipes 39 is composed of two pressed plates 40, each plane shape of which is substantially rectangular, and is formed as a hollow body by bonding the outer peripheral edges of the pressed plates 40. The two pressed plates 40 are formed in the identical shapes by pressing a metal having high heat conductivity (e.g. aluminum), with communication ports 41 being formed in both end portions of each pressed plate.

In each heat radiating pipe 39, the whole of its central portion serves as a flat refrigerant passage 42, into which are inserted inner fins 43 obtained by corrugating a thin aluminum sheet. On both end sides of the refrigerant passage 42 are formed an inlet-side communicating portion 44 and an outlet-side communicating portion 45 each having the communication ports 41. The communicating portions 44 and 45 of one heat radiating pipe 39 are connected to the communicating portions 44 and 45 of another heat radiating pipe 39 through the communication ports 41, thus constituting the entire tank portion of the radiator 4.

As shown in FIG. 40, the heat radiating pipes 39 are laminated while fitting the respective inlet-side communicating portions 44 with one another and also fitting the respective outlet-side communicating portions 45 with one another. The respective pipes 39 communicates with one another through the communication ports 41 formed in the communicating portions 44 and 45, and heat radiating fins 16 are interposed between adjacent pipes 39. The communication ports 41 are not formed in the outer pressed plate 40 of the heat radiating pipe 39 located in the outermost position. Alternatively, when the pressed plate 40 having communication ports 41 is used as the outermost pressed plate, the communication ports 41 is closed the pressed plate 40 from the outside by end plate (not shown) or the like. As shown in FIG. 40, the connection plate 34 is airtightly bonded to the outer wall surface of the extrusion member 7 so as to cover the inlet port 36 and outlet port 35 formed in the extrusion member. Between the connection plate 34 and the outer wall surface of the extrusion member 7 are formed a communication chamber 46 communicating with the vapor passages 9 and inoperative passage 10 through the outlet port 35, and another communication chamber 47 (outlet chamber in the invention) communicating with the condensate passage 10 through the inlet port 36. One communication chamber 46 communicates with the other communication chamber 47 through the refrigerant passage 42 into which are inserted inner fins 43. In the connection plate 34 are formed communication ports 41 similar to those of the pressed plates 40, and through the communication ports 41, the communication chambers 47 communicate with the heat radiating pipes 39.

An operation of this embodiment will be described below.

The refrigerant boiling with heat from the IGBT modules 2 rises as bubbles through the interiors of the vapor passages 9 and flows mainly into one communication chamber 46 through the outlet port 35, then further flows into one tank portion (the right-hand inlet-side communicating portions 44 in FIG. 40) of the radiator 4 through one communication chamber 46 and is distributed to the refrigerant passages 42 in the heat radiating pipes 39. The vaporized refrigerant flowing through each refrigerant passage 42 is condensed on the inner wall surface of the passage 42 and the surface of the inner fins 43, temperature of which are low in temperature by receiving air from a cooling fan 5 (see FIG. 38), and generates a condensing latent heat. The liquid drop of the refrigerant flows down along the bottom of the refrigerant passage 42 and into the other tank portion (the left outlet-side communicating portion 45 in FIG. 40) of the radiator 4. The condensed liquid then flows from the other tank portion into the other communication chamber 47, and the condensed liquid mainly staying in the communication chamber 47 flows through the inlet port 36 into the condensed liquid passage 10, then flows down through the passage 10, thereafter passes through the communication path 38 formed in the end cap 22b and is supplied to the vapor passages 9. On the other hand, the condensing latent heat generated at the time of condensation of the vaporized refrigerant is transmitted from the wall surface of the refrigerant passage 42 to the heat radiating fins 16 and is thereby discharged to the blown air passing between adjacent heat radiating pipes 39.

Since the drawn-cup type radiator 4 is used, the capacity of the radiator can be easily changed even when the number of the mounted IGBT modules 2 increases and the total amount of heat generated increases. That is, since the capacity of the radiator 4 can be easily increased by laminating the heat radiating pipes 39 having the same shape successively, it is possible to provide the radiator 4 having a capacity corresponding to the total amount of heat generated with low cost. Besides, since the vapor passages 9 can be communicated with the vapor passages 9 merely by removing the upper portions of support portions 31 and 32 of the extrusion member 7, it is possible to control the circulation of refrigerant with low cost without adding any special parts.

In this embodiment, the radiator 4 may be tilted relative to the refrigerant tank 3 so as to facilitate the return of condensate from the radiator 4 to the refrigerant tank 3 (condensed liquid passage 10).

Figure 41:
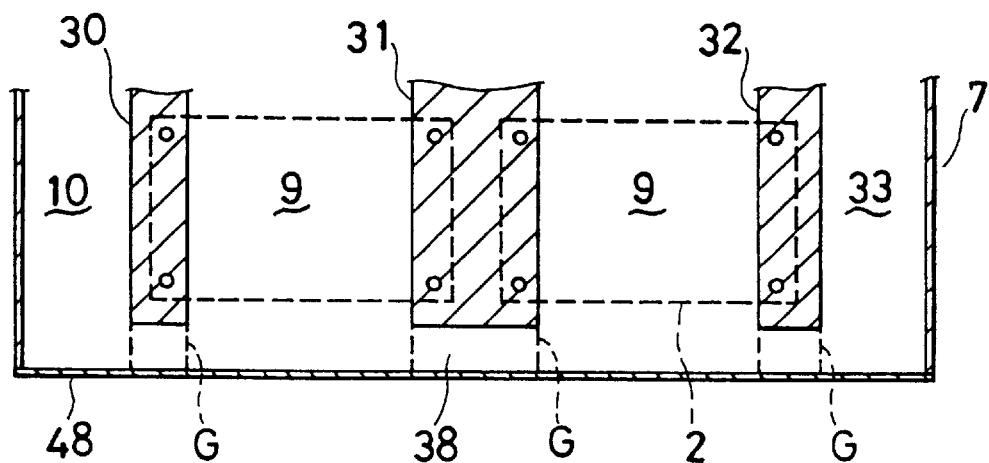
FIG. 41 is a cross sectional view of the lower portion of a refrigerant tank according to the fifteenth embodiment.

Instead of the end cap 22b located on the lower end side of the refrigerant tank 3, it may be applied to remove the lower portions (indicated with broken lines G in FIG. 41; the support portion 32 is not specially limited on this regard) of the support portions 30 to 32 provided in the extrusion member 7 by an additional machining step such as milling, and to connect a flat plate 48 (end cap 22) to the lower end face of the extrusion member 7 by brazing for example. In this way, it becomes easy to manufacture the lower end cap 22 (flat plate 48).

Although in this embodiment the inlet port 36 and the outlet port 35 are formed with a difference in height, both ports may be formed at the same height. Further, both ports may be formed in the same shapes.

Figure 42:
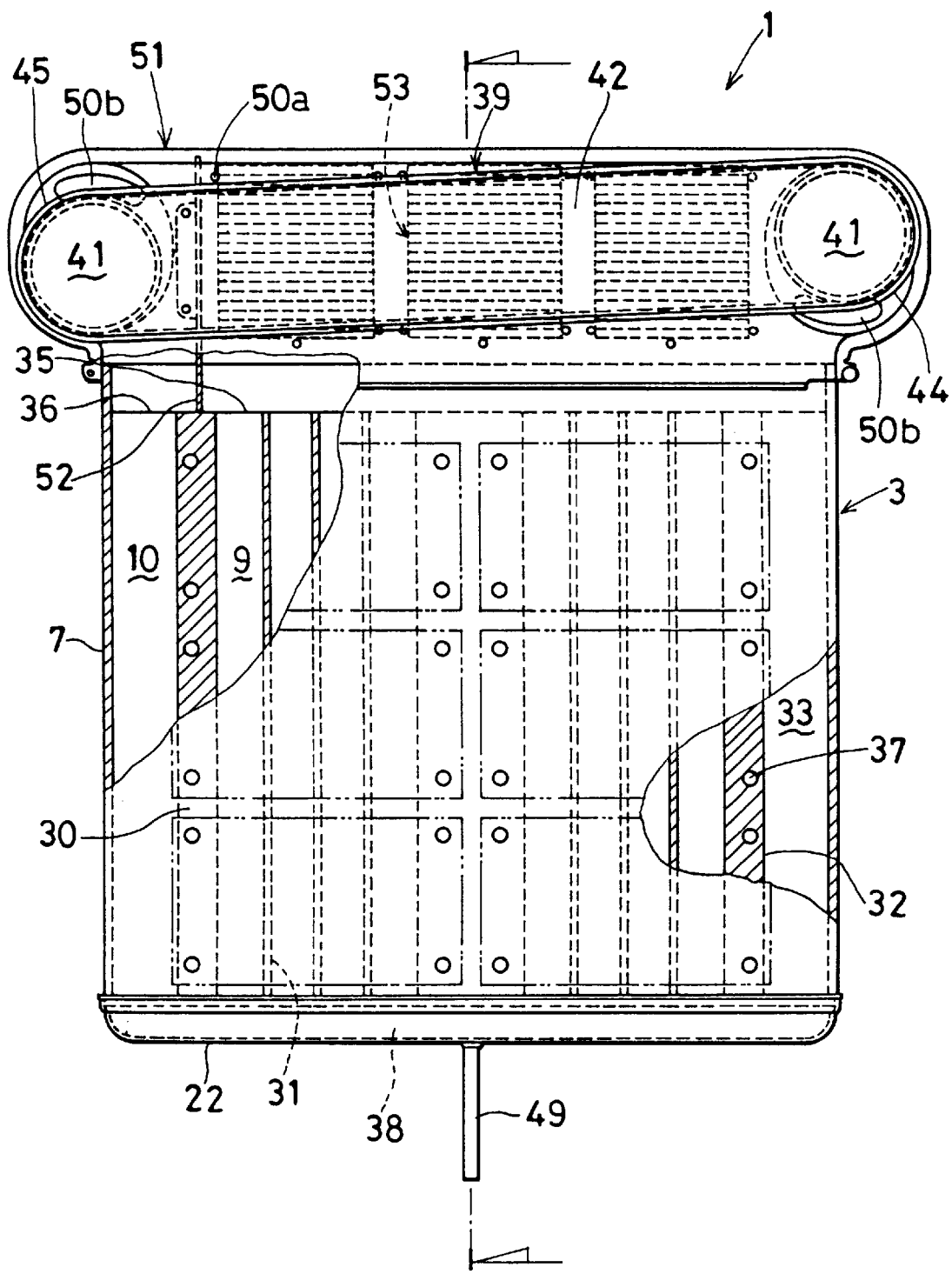
FIG. 42 is a front view of a cooling apparatus using boiling and condensing refrigerant according to a sixteenth embodiment.
Figure 43:
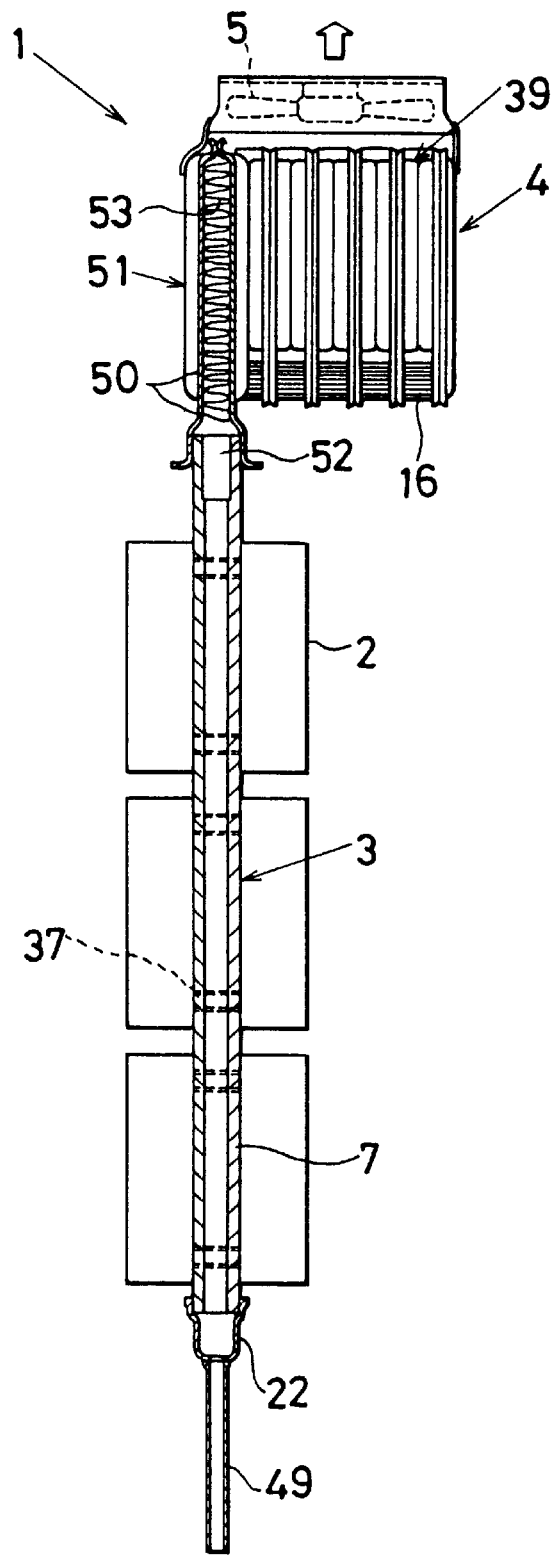
FIG. 43 is a side view of the cooling apparatus using boiling and condensing refrigerant according to the sixteenth embodiment.

A sixteenth embodiment of the present invention will be described. FIG. 42 is a front view of a cooling apparatus 1 using boiling and condensing refrigerant and FIG. 43 is a side view thereof.

In this embodiment, each of the heat radiating pipes 39 constituting a radiator 4 are mounted in an inclined state to return the condensed liquid in the radiator easily.

A refrigerant tank 3 is composed of an extrusion member 7 formed by extruding from an aluminum block and an end cap 22 for covering one open end (the lower end in FIG. 42) of the extrusion member.

In the extrusion member 7 are defined vapor passages 9, condensed liquid passage 10 and inoperative passage 33 by support portions 30 to 32 extending vertically. The passages 9, 10 and 33 are opened in positions a little lower than the upper end of the extrusion member 7 by removing the upper end portions of the support portions 30 to 32. The opening of each vapor passage 9 and that of the condensed liquid passage 10 serve as an outlet port 35 for vaporized refrigerant and an inlet port 36 for condensed liquid, respectively.

The end cap 22, which is formed of aluminum in the same manner as the extrusion member 7, is integrally bonded to the extrusion member 7 by brazing so as to cover the outer periphery of the lower end of the extrusion member. A communication path 38 is formed between the end cap 22 and the lower end face of the extrusion member 7 to communicate the vapor passages 9, condensate passage 10 and inoperative passage 33 with each other. The end cap 22 is provided with a refrigerant sealing tube 49 as shown in FIG. 42, through which the washing of the interior of the cooling apparatus 1, the pouring and degassing of refrigerant are performed. The degassing is performed by turning the whole of the cooling apparatus 1 upside down after the refrigerant is poured into the cooling apparatus, then placing the radiator 4 into a hot water tank (a temperature of which is kept in such a manner that the saturated vapor pressure of the refrigerant is greater than the atmospheric pressure), and vaporizing the refrigerant in the cooling apparatus 1 to turn the air (the refrigerant gas is heavier than air) out. After the degassing is performed, an end portion of the tube 49 is caulked and sealed by welding for example, thereby the refrigerant is sealed within the cooling apparatus 1.

The radiator 4 is so-called a drawn-cup type heat exchanger and, as shown in FIG. 43, it is constituted by laminating a connection pipe 51 and a plurality of hollow heat radiating pipes 39 each having the same shape, the connection pipe 51 being constituted by a laminate of two plates 50.

The connection pipe 51 is fitted on the outer periphery of the upper end of the refrigerant tank 3, and the interior thereof is partitioned with a separator 52 into an inlet chamber (not shown) communicating with the outlet port 35 in the refrigerant tank and an outlet chamber (not shown) communicating with the inlet port 36 in the same tank.

A plurality of inner fins 53 are inserted into the inlet chamber of the connection pipe 51. As shown in FIG. 42, the inner fins 53 are supported by a plurality of positioning ribs 50a provided on the plate 50 side.

Each of the heat radiating pipes 39 is formed as a hollow body by bonding the outer peripheral edges of two pressed plates (aluminum plates) together. At both end portions of each pipe 39 are provided an inlet-side communicating portion 44 and an outlet-side communicating portion 45 both having communication ports 41. The portion between both communicating portions 44 and 45 serves as a flat refrigerant passage 42 into which are inserted inner fins (not shown) formed by corrugating a thin aluminum plate.

As shown in FIG. 43, the heat radiating pipes 39 are laminated on one side of the connection pipe 51 and are in communication with one another through the respective communication ports 41. Further, the connection pipe 51 and the heat radiating pipes 39 are in communication with each other through the communication ports 41 formed in one plate (the plate positioned on the pipe 39 side) and through the communication ports 41 formed in the pipes 39. Each heat radiating pipe 39 is set in the proper position by a pair of ribs 50b provided on the plate 50 of the connection pipe 51, and is mounted to the connection pipe in an entirely inclined state so that the inlet-side communicating portion 44 is higher than the outlet-side communicating portion 45 (see FIG. 42). The ribs 50b of the plate 50 not only function to position the heat radiating pipes 39 but also function as reinforcing ribs to reinforce the bonding surface for the pipes 39.

An operation of this embodiment will be described below.

The refrigerant boiling with heat generated and transmitted from IGBT modules 2 rises as bubbles through the interior of the vapor passages 9, then flows from the outlet port 35 of the refrigerant tank 3 into the inlet chamber of the connection pipe 51, thereafter flows from the inlet chamber into the inlet-side communicating portion 44 of each heat radiating pipe 39 and is distributed into the refrigerant passage 42 in the pipe 39. The vaporized refrigerant flowing through each refrigerant passage 42 is condensed on the inner wall surface of the refrigerant passage and the surfaces of the inner fins, temperature of which are low in temperature by receiving air from a cooling fan 5 (see FIG. 43), and generates a condensing latent heat. The liquid drop of the refrigerant flow down along the bottom of the refrigerant passage 42 and into the outlet-side communicating portion 45 of each heat radiating pipe 39. Then, the condensed liquid flows from the outlet-side communicating portion 45 into the outlet chamber of the connection pipe 51 and enters the condensate passage 10 through the inlet port 36 of the refrigerant tank 3, then flows down through the condensate passage 10, passes through the communication path 38 in the end cap and is again supplied to the vapor passages 9.

In this embodiment, since the heat radiating pipes 39 are inclined with respect to the connection pipe 51, it becomes easy for the condensed liquid to flow from the inlet-side communicating portion toward the outlet-side communicating portion through the refrigerant passage 42 in each heat radiating pipe 39. Consequently, the amount of the condensed liquid staying on the bottom of the refrigerant passage 42 decreases and thus the vaporized refrigerant can be condensed efficiently. As a result, the amount of refrigerant required can be decreased, thus reducing the cost.

Moreover, since the plural vapor passages 9 are formed by the support portions 31, the flow of vaporized refrigerant flowing through the vapor passages 9 can be rendered uniform; besides, the support portions 31 contribute to the increase of an effective boiling area and hence the heat radiating performance can be improved. The strength against positive and negative pressures in the refrigerant tank 3 is improved, and the deformation of the mounting surface to which the IGBT modules 2 are mounted is prevented.

A seventeenth embodiment of the present invention will be described.

Figure 44:
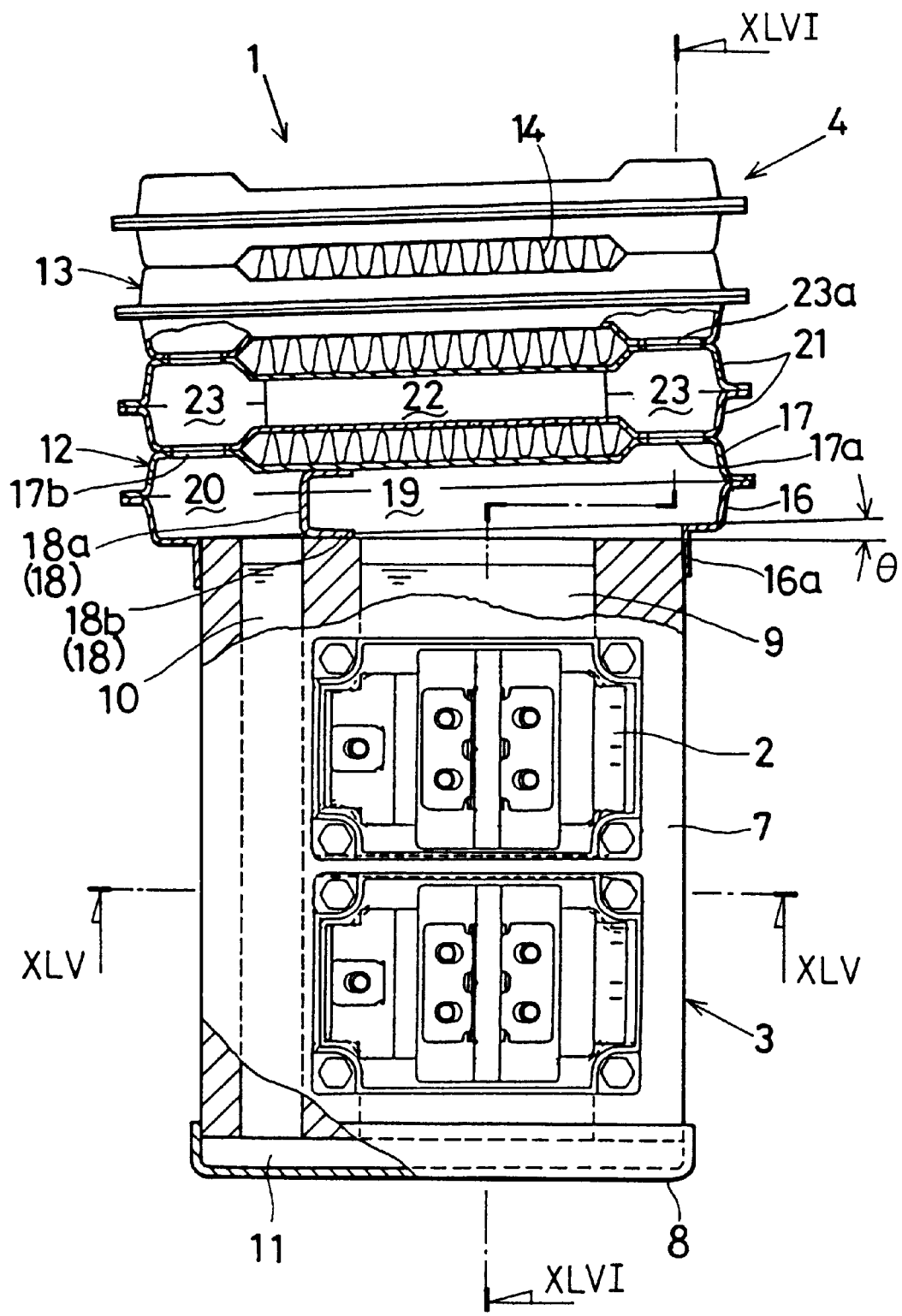
FIG. 44 is a front view, partly in cross section, of a cooling apparatus using boiling and condensing refrigerant according to a seventeenth embodiment.

FIG. 44 is a front view, partly in section, of a cooling apparatus using boiling and condensing refrigerant.

The cooling apparatus 1 using boiling and condensing refrigerant cools heat generating units 2 by boiling/condensing heat transfer of the refrigerant and includes a refrigerant tank 3 containing a fluorocarbon type refrigerant therein, a radiator 4 for radiating heat from the boiling and vaporized refrigerant in the refrigerant tank 3, and a cooling fan (see FIG. 46) for blowing air to the radiator 4.

The heat generating units 2 are IGBT modules which constitutes an inverter circuit (not shown) for an electric vehicle or a general electric power control device. The heat generating unit 2 includes a heat radiating plate (not shown) for radiating heat generated in a semiconductor device (not shown) incorporated therein, the heat radiating plate being fixed to the refrigerant tank 3 with bolts 6 in close contact with the outer wall surface of the refrigerant tank. Grease for heat conduction may be interposed between the heat radiating plate and the outer wall surface of the refrigerant tank 3.

The refrigerant tank 3 includes an extrusion member 7 formed by extruding from an aluminum block for example and a cap 8 for covering one open end (the lower end in FIG. 44) of the extrusion member 7.

Figure 45:
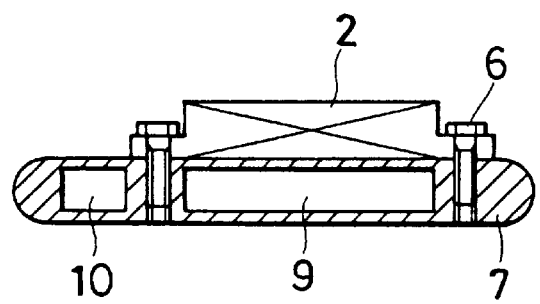
FIG. 45 is a cross sectional view taken along line XLV—XLV of FIG. 44.

The extrusion member 7 is formed in a flat shape having a thickness W (see FIG. 46) which is smaller than the width and length of its outer wall surface to which the heat generating units 2 are attached. In the extrusion member 7, two spaces are formed so as to extend therethrough in the longitudinal direction (vertical direction in FIG. 44). One space is serves as a vapor passage 9 for the refrigerant in a vaporized state after boiled and evaporated with the heat of the heat generating units 2. As shown in FIG. 45, the vapor passage 9 is widely formed in the width direction (right and left direction in FIG. 45) of the extrusion member 7 corresponding to the portion where the heat generating units 2 are mounted to the refrigerant tank 3. The other space serves as a condensed liquid passage 10 through which a condensed refrigerant having been liquefied in the radiator 4 flows, and is formed in parallel with the one space in a position away from the mounting portion of the heating generating units 2.

The cap 8, which is made of aluminum in the same manner as the extrusion member 7, is integrally bonded to the outer peripheral portion of the lower end of the extrusion member by brazing. The cap 8 is not in close contact with the lower end face of the extrusion member 7, but a certain gap is formed between the cap and the lower end face of the extrusion member so as to form a communication path 11 between the vapor passage 9 and the condensate passage 10 both formed in the extrusion member 7.

The radiator 4 is so-called a drawn-cup type heat exchanger and is constituted by laminating a connecting portion 12 and a plurality of heat radiating pipes 13. Heat radiating fins 14 are interposed between adjacent heat radiating pipes 13 and between the connecting portion 12 and the heat radiating pipe 13. Further, inner fins (see FIG. 46) are inserted into each heat radiating pipe 13.

The connecting portion 12, which connects between the heat radiating pipes 13 and the refrigerant tank 3, is formed in a hollow shape by bonding the outer peripheral edges of two pressed plates 16 and 17 (for example, aluminum plates) superior in heat conductivity. A connection opening 16a formed in one pressed plate 16 is fitted on the outer peripheral portion of the upper end of the refrigerant tank 3, and in this way, the connecting portion 12 is mounted on the upper portion of the refrigerant tank.

The interior of the connecting portion 12 is partitioned by a separator 18 into an inlet chamber 19 and an outlet chamber 20 which are in communication with the vapor passage 9 and the condensed liquid passage 10, respectively, formed in the extrusion member 7. In the other pressed plate 17 are formed an inlet-side communication port 17a which is open to the inlet chamber 19 and an outlet-side communication port 17b which is open to the outlet chamber 20.

The separator 18, which is formed in a U-shape in its cross section as illustrated in FIG. 44, includes a partition wall portion 18a for partitioning the interior of the connecting portion 12 into the inlet chamber 19 side and the outlet chamber 20 side, and an extending portion 18b extending from the peripheral edge of the partition wall portion 18a along the inner wall surface of the connecting portion 12, the outer surface of the extending portion 18b being bonded (brazed) to the inner wall surface of the connecting portion 12.

In the same manner as the connecting portion 12, each heat radiating pipe 13 is also formed in a hollow shape by bonding the outer peripheral edges of two pressed plates 21 superior in heat conductivity, and its entire central portion serves as a refrigerant passage 22, while on both end sides (right and left ends in FIG. 44) of the refrigerant passage 22 are formed communicating portions 23 for communicating with the other heat radiating pipes 13. Each of the two pressed plates 21 are formed in the same shape by pressing, with communication ports 23a being formed in both end portions thereof which constitute the communicating portions 23. As shown in FIG. 44, the heat radiating pipes 13 are laminated on the connecting portion 12 while the respective communicating portions 23 are fitted with each other. These refrigerant passages 22 communicates with one another through the respective communication ports 23a which are open to the communicating portions 23. At the same time, the refrigerant passages 22 communicates with the inlet chamber 19 in the connecting portion 12 through the inlet-side communication port 17a and communicates with the outlet chamber 20 in the connecting portion through the outlet-side communication port 17b.

The heat radiating fins 14, which are corrugated fins formed by corrugating an aluminum sheet, are interposed between the connecting portion 12 and the heat radiating pipe 13 and are also disposed in an air blowing space formed between adjacent laminated heat radiating pipes 13.

Figure 46:
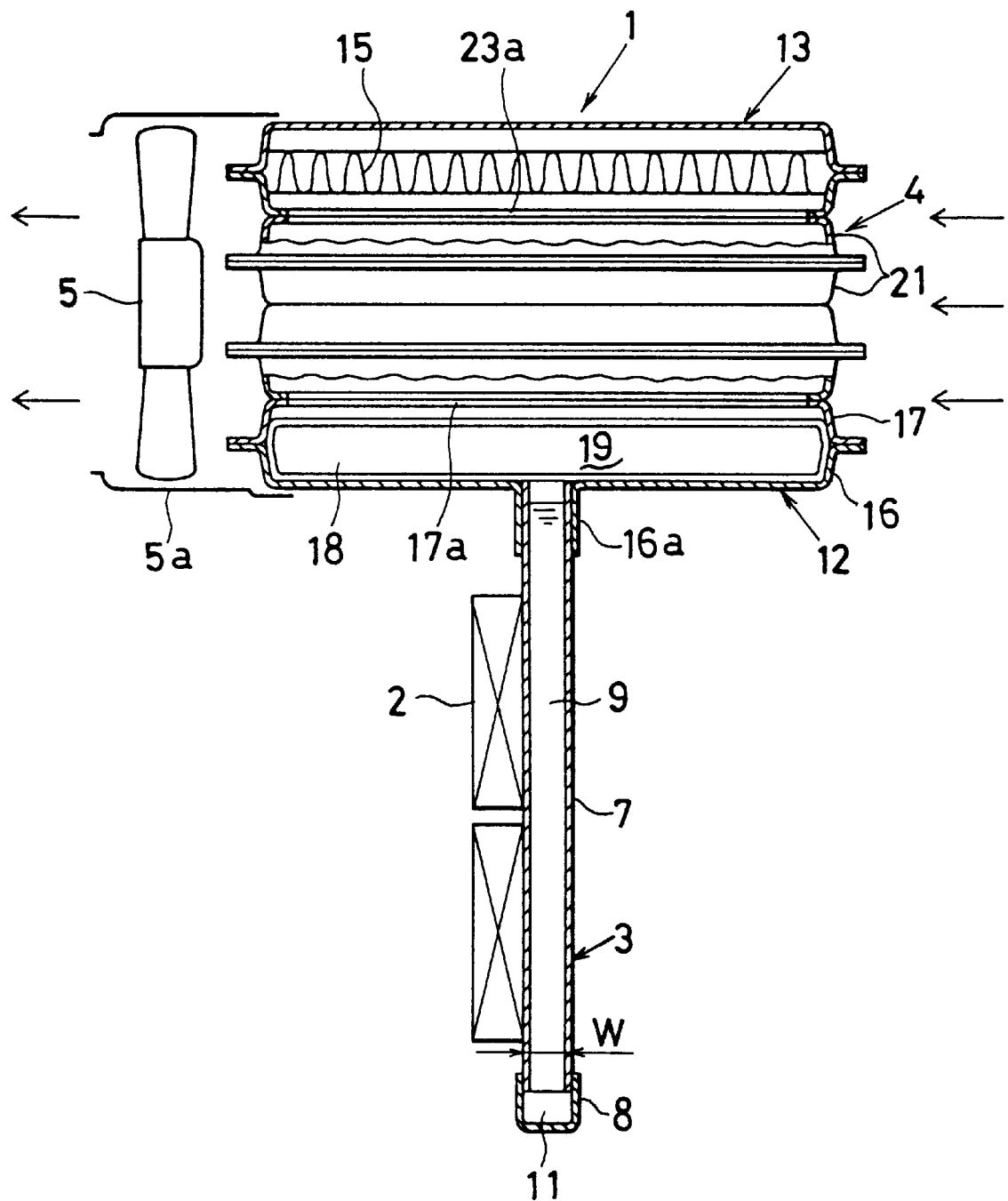
FIG. 46 is a cross sectional view taken along line XLVI—XLVI of FIG. 44.

The inner fins 15 are also corrugated fins like the heat radiating fins 14 and are inserted into the refrigerant passage 22 in each heat radiating pipe 13 (see FIG. 46).

The cooling fan 5, which is an axial-flow fan for example, is disposed in front of the radiator 4 and is fixed to the radiator with a fan shroud 5a.

After the entirety is assembled temporarily, the cooling apparatus 1 using boiling and condensing refrigerant is integrally bonded by brazing. In this case, the radiator 4 is mounted to the refrigerant tank 3 in such a manner that the bottom of the refrigerant passage 22 in each heat radiating pipe 13 is inclined (angle of inclination: θ) from the communicating portion 23 side in communication with the inlet chamber 19 of the connecting portion 12 toward the communicating portion 23 in communication with the outlet chamber 20 of the connecting portion (see FIG. 44).

An operation of this embodiment will be described below.

The refrigerant boiled with the heat from the heat generating units 2 rises as bubbles through the vapor passage 9 and enters the inlet chamber 19 in the connecting portion 12, then passes through one communicating portion 23 (the right-hand one in FIG. 44 of each heat radiating pipe 13 in communication with the inlet chamber 19, and enters the refrigerant passage 22. The refrigerant in a vaporized state and flowing through the refrigerant passage 22 is condensed on the inner wall surface of the refrigerant passage and the surfaces of the inner fins 15, temperature of which are low by receiving air from the cooling fan 5. The liquid drop flows down along the bottom of the refrigerant passage 22 by its own weight, then passes through the other communicating portion 23 of the heat radiating pipe 13 and enters the outlet chamber in the connecting portion 12. The condensed liquid further flows from the outlet chamber 20 into the condensed liquid passage 20, passes through the same passage and further through the communication path 11 formed by the cap 8, then again enters the vapor passage 9. On the other hand, a latent heat radiated when the vaporized refrigerant is condensed is transmitted from the wall surface of the heat radiating pipe 13 which surface defines the refrigerant passage 22 to the heat radiating fins 14 and is thereby discharged to the atmosphere. By repeating the boiling/condensing heat transfer of the refrigerant and discharging the heat from the heat generating units 2 to the atmosphere successively, the semiconductor devices is cooled.

In the cooling apparatus 1 using boiling and condensing refrigerant of this embodiment, a refrigerant circulating path is constituted by both refrigerant tank 3 and radiator 4 and therefore the refrigerant flowing in the radiator 4 can flow through the refrigerant passage 22 of each heat radiating pipe 13 uniformly from one side (the communicating portion 23 side in communication with the inlet chamber 19 of the connecting portion 12) toward the other side (the communicating portion 23 side in communication with the outlet chamber 20 of the connecting portion 12) (that is, it forms a circulation flow). As a result, the refrigerant can be efficiently condensed because the vaporized refrigerant does not collide with the condensed liquid in the radiator 4, and thereby the heat radiating performance is improved.

In this embodiment, moreover, the refrigerant tank 3 can be integrally constituted with the radiator 4 by connecting the two through the connecting portion 12 mounted to the radiator 4. Thus, as different from the conventional cooling apparatus, it is not necessary to use two pipes for connecting the refrigerant tank 3 to the radiator 4. Consequently, it is possible to decrease the number of components as well as the cost, and further it is also possible to downsize the entire of the cooling apparatus and to lighten weight thereof.

Since the radiator 4 is constituted by laminating a plurality of heat radiating pipes 13 each having the same shape on the connecting portion 12, the number of pipes 13 to be laminated can be changed easily. Therefore, a heat radiation capacity corresponding to the total amount of heat generated from the heat generating units 2 can be easily ensured by increasing or decreasing the number of heat radiating pipes 13 to be laminated in accordance with the number (i.e. the total amount of heat generated) of heat generating units 2 attached to the refrigerant tank 3.

Moreover, since the bottom of the refrigerant passage 22 in each heat radiating pipe 13 is inclined, it is easy for the condensed liquid flowing in the passage 22 to flow from the communicating portion 23 in communication with the inlet chamber 19 toward the communicating portion 23 in communication with the outlet chamber 20. Consequently, since the amount of the condensed liquid staying on the bottom the refrigerant passage 22 decreases, it is possible to condense the vaporized refrigerant efficiently.

The separator 18 which partitions the interior of the connecting portion 12 into inlet chamber 19 and outlet chamber 20 includes the extending portion 18b formed at the peripheral edge of the partition wall portion 18a and is formed in a cup shape as a whole, the separator 18 does not fall down within the connecting portion 12 until the separator 18 is integrally bonded to the inner wall surface of the connecting portion by brazing and the separator 18 can be positioned easily. Besides, a sufficient bond length (brazing length) can be ensured by the extending portion 18b in bonding the separator 18 within the connecting portion 12, and therefore, it is possible to obtain a high bond strength with high airtightness between the inlet chamber 19 side and the outlet chamber 20 side. Alternatively, when the separator 18 is press-fitted in the interior of the connecting portion 12, it is possible to ensure airtightness even without bonding the extending portion 18b to the connecting portion 12 because the extending portion is brought into pressure contact with the inner wall surface of the connecting portion.

Since the refrigerant tank 3 is constituted by covering the cap 8 onto the outer peripheral portion of the lower end of the extrusion member 7, the extrusion member may be cut into a suitable length according to the number and type of heat generating units 2 attached to the refrigerant tank.

Consequently, various refrigerant tanks 3 according to the number and type of heat generating units 2 can be manufactured easily with low cost.

A eighteenth embodiment of the present invention will be described.

Figure 47:
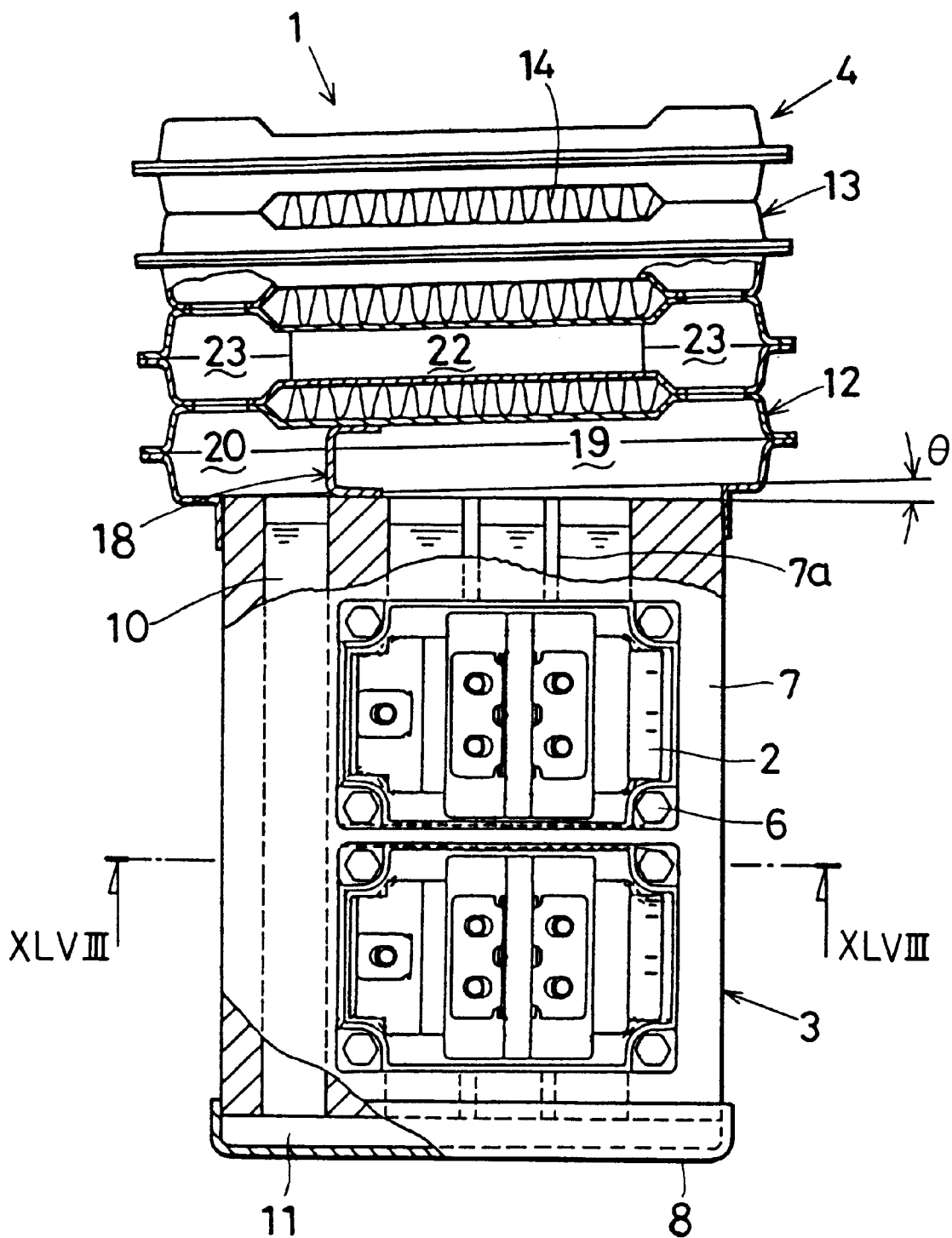
FIG. 47 is a front view, partly in cross section, of a cooling apparatus using boiling and condensing refrigerant according to an eighteenth embodiment.

FIG. 47 is a front view, partly in section, of a cooling apparatus 1 using boiling and condensing refrigerant.

Figure 48:
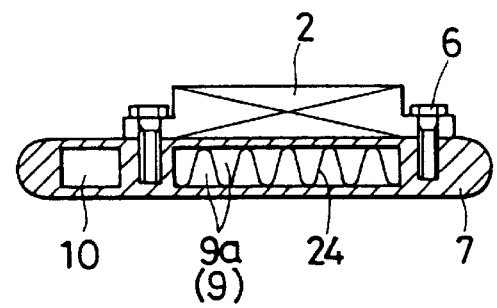
FIG. 48 is a cross sectional view taken along line XLVIII—XLVIII of FIG. 47.

In this embodiment, inner fins 24 are inserted into a vapor passage 9 formed in a refrigerant tank 3. The inner fins 24 are corrugated fins formed by corrugating an aluminum sheet for example. By inserting the inner fins 24 into the vapor passage 9, a plurality of passages 9a are formed (see FIG. 48).

In this way, when the boiling refrigerant after absorbing heat from the heat generating units 2 rises through the vapor passage 9, the vaporized refrigerant flows along the passages 9a defined by the inner fins 24, thus controlling the direction of the flow of the vaporized refrigerant. More particularly, the flow of the vaporized refrigerant is smoothed by the inner fins 24, and therefore, the vaporized refrigerant can pass through the vapor passage 9 smoothly. At the same time, the heat radiating performance is improved because the boiling area is increased by using the inner fins 24.

A nineteenth embodiment of the present invention will be described.

Figure 49:
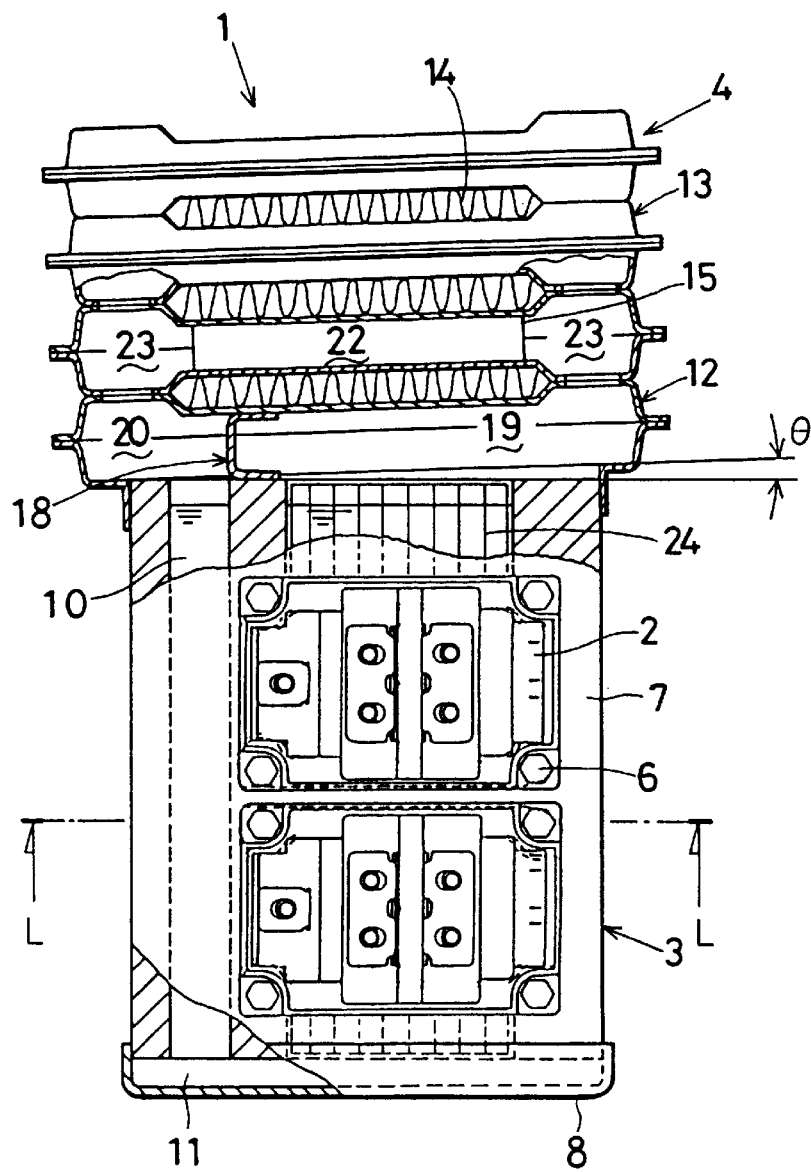
FIG. 49 is a front view, partly in cross section, of a cooling apparatus using boiling and condensing refrigerant according to a nineteenth embodiment.

FIG. 49 is a front view, partly in cross section, of a cooling apparatus 1 using boiling and condensing refrigerant.

Figure 50:
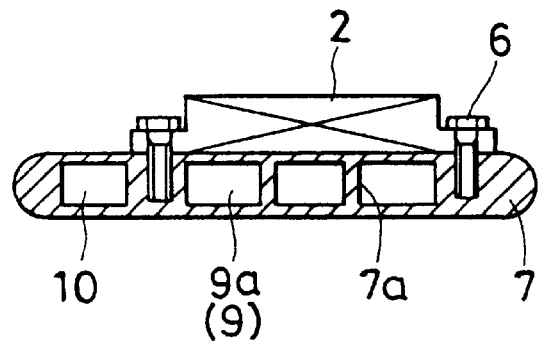
FIG. 50 is a cross sectional view taken along line L—L of FIG. 49.

In this embodiment, as shown in FIG. 50, an extrusion member 7 which constitutes a refrigerant tank 3 is integrally provided with plural ribs 7a to form plural passages 9a in a vapor passage 9. Also in this embodiment, in the same manner as in the eighteenth embodiment, the flow of vaporized refrigerant passing through the vapor passage 9 can be smoothed and the heat radiating performance is improved because the effective boiling area is increased by the ribs 7a. In this embodiment, it is also possible to improve the strength against positive and negative pressures in the refrigerant tank 3 and to prevent deformation of the surface to which heat generating units 2 are mounted.

A twentieth embodiment of the present invention will be described.

Figure 51:
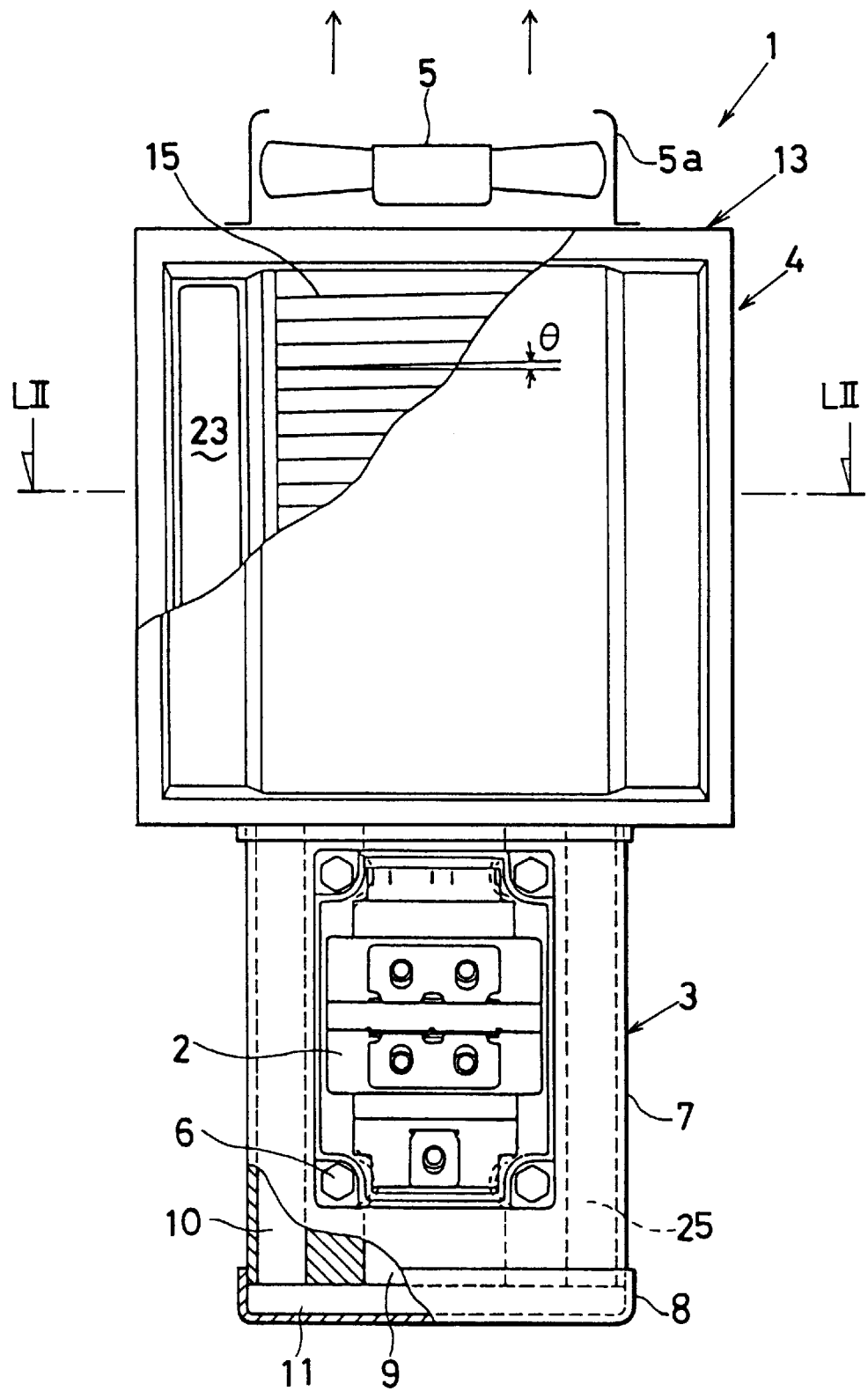
FIG. 51 is a front view, partly in cross section, of a cooling apparatus using boiling and condensing refrigerant according to a twentieth embodiment.

FIG. 51 is a front view, partly in cross section, of a cooling apparatus 1 using boiling and condensing refrigerant.

In this embodiment, a sub condensed liquid passage 25 is formed in a refrigerant tank 3.

Figure 52:
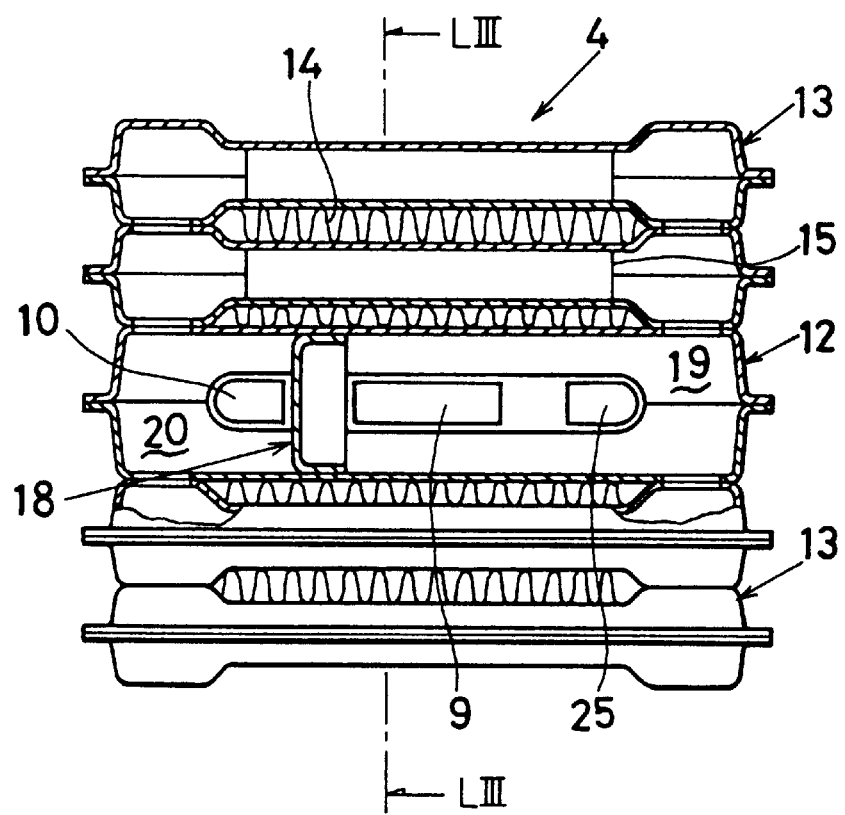
FIG. 52 is a cross sectional view taken along line LII—LII of FIG. 51.

The sub condensed liquid passage 25 is formed on the side (the side communicating with an inlet chamber 19 in an connecting portion 12) opposite to a condensed liquid passage 10 with respect to a vapor passage 9 (see FIG. 52) and is in communication with the vapor passage 9 and the condensed liquid passage 10 through a communication path 11 defined by a cap 8.

The sub condensed liquid passage 25 functions effectively when the cooling apparatus 1 using boiling and condensing refrigerant mounted on an electric vehicle tilts at an angle is θ or more to the side opposite to a tilting side of a radiator 4 together with tilt of the vehicle body. More particularly, when the cooling apparatus 1 using boiling and condensing refrigerant tilts and a refrigerant passage 22 formed in each heat radiating pipe 13 tilts to the opposite side (that is, when the communicating portion 23 side in communication with the inlet chamber 19 in the connecting portion 12 is lower than the communicating portion 23 side in communication with an outlet chamber 20), the condensed liquid after condensed in the radiator 4 may return to the vapor passage 9 through the inlet chamber 19. At this time, if the sub condensed liquid passage 2 is formed on the side opposite to the condensed liquid passage 10 with the vapor passage 9 therebetween, the condensed liquid flows into the sub condensed liquid passage 25, opening surface of which becomes the lowest at the time of tilting. Thus, it is possible to prevent the condensed liquid from returning to the vapor passage 9, thereby preventing interference between vaporized refrigerant and the condensed liquid. The condensed liquid which has entered the sub condensed liquid passage 25 flows as it is through the communication path 11 defined by the cap 8 and enters the vapor passage 9 again.

Figure 53:
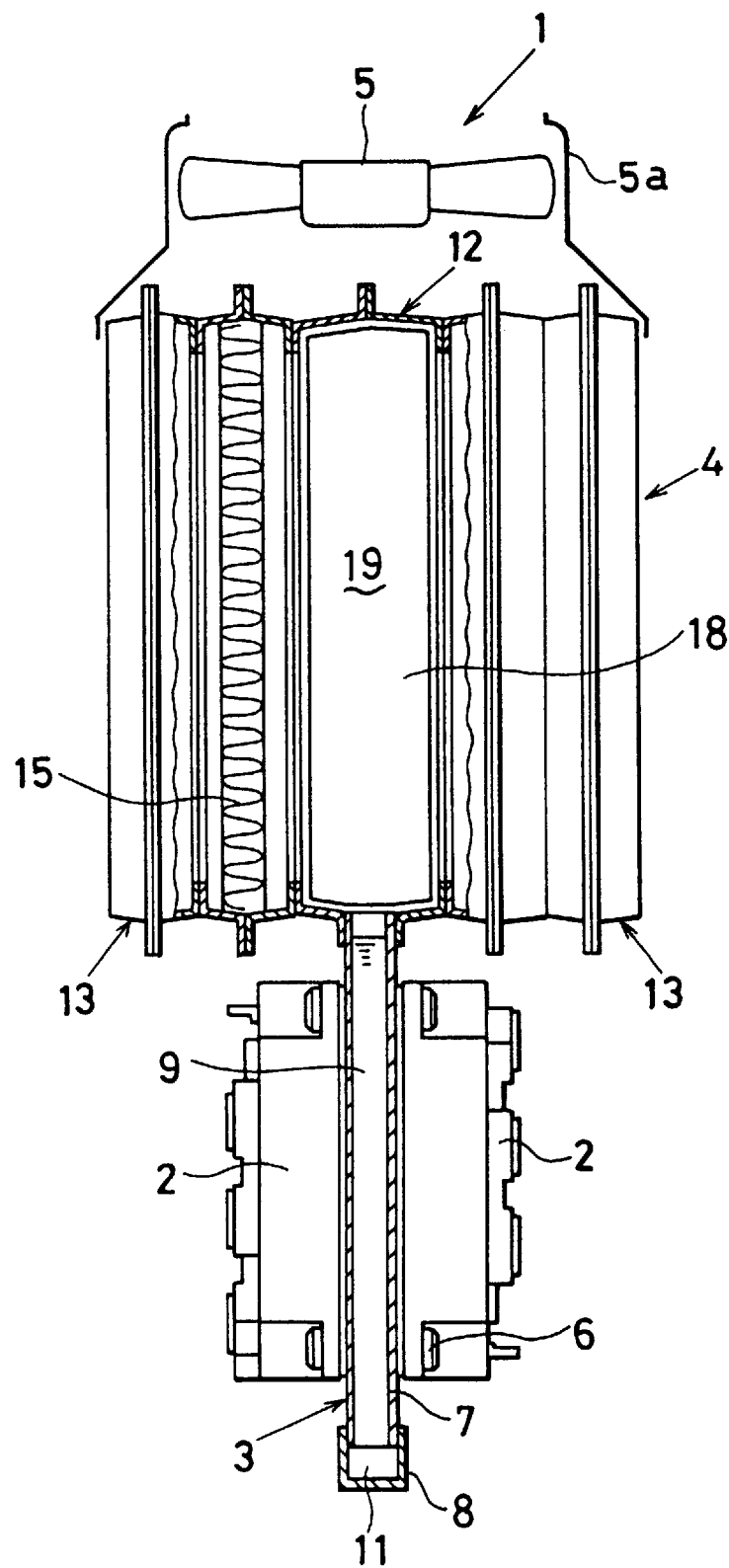
FIG. 53 is a cross sectional view taken along line LIII—LIII of FIG. 52.

In this embodiment, the radiator 4 is mounted to the refrigerant tank 3 so that air blowing direction is perpendicular to the radiator 4, and heat radiating pipes 13 are laminated on both sides of the connecting portion 12. In this case, since the entire width of the cooling apparatus is determined by the width (the right and left width in FIG. 53) of the radiator 4, as shown in FIG. 53, the entire width of the cooling apparatus does not increase even when heat generating units 2 are attached to both sides of the refrigerant tank 3.

A twenty-first embodiment of the present invention will be described.

Figure 54:
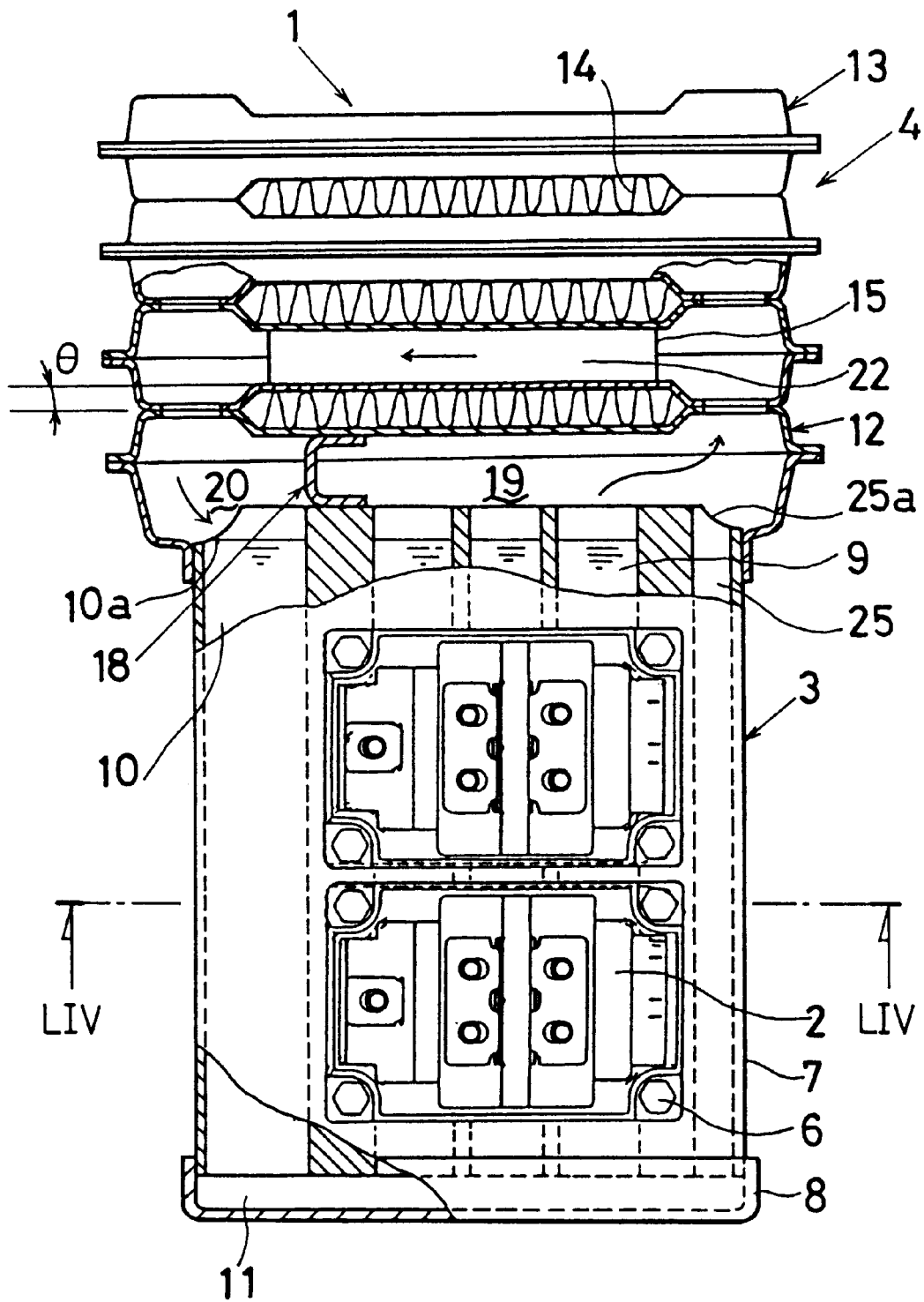
FIG. 54 is a front view, partly in cross section, of a cooling apparatus using boiling and condensing refrigerant according to a twenty-first embodiment.
Figure 55:
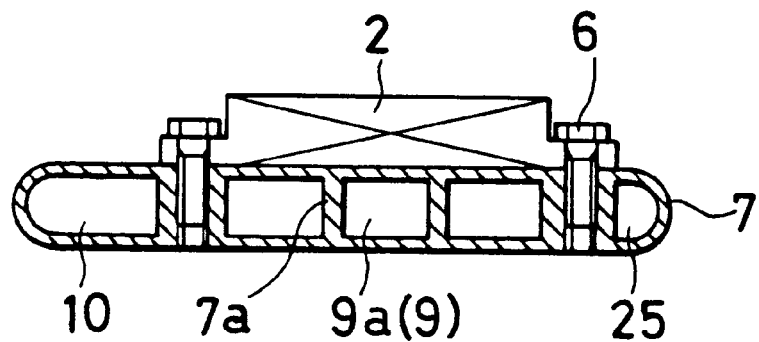
FIG. 55 is a cross sectional view taken along line LV—LV of FIG. 54.

FIG. 54 is a front view, partly in cross section, of a cooling apparatus 1 using boiling and condensing refrigerant.

In this embodiment, a recess portion 25a is formed in such a manner that the opening surface of a sub condensed liquid passage 25 is positioned lower than that of a vapor passage 9. When the cooling apparatus 1 using boiling and condensing refrigerant tilts to the side opposite to a tilting side of a radiator 4 at an angle of θ or more for some reason (for example tilting of a vehicle on which the cooling apparatus is mounted), it becomes easy for the condensed liquid to flow into the condensed liquid passage 25 because the opening surface of the condensed liquid passage is formed with the recess portion 25a. As a result, it is possible to positively prevent the condensed liquid from returning to the vapor passage 91 thereby preventing interference of the condensed liquid with vaporized refrigerant in the vapor passage 9. A recess portion 10a may be formed on the opening surface of the condensed liquid passage 10 in addition to the recess portion 25a formed on the sub condensed liquid passage 25.

A twenty-second embodiment of the present invention will be] described.

Figure 56:
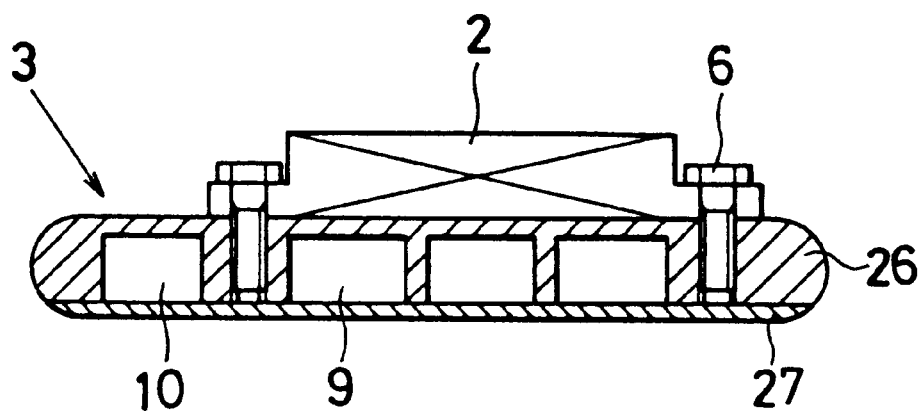
FIG. 56 is a cross sectional view of a refrigerant tank (corresponding to the section taken along line L—L in FIG. 50) according to a twenty-second embodiment.

FIG. 56 is a cross sectional view of a refrigerant tank 3 (corresponding to the cross section taken along line LVI—LVI of FIG. 49).

In this embodiment, vapor passages 9 and condensed liquid passage 10 are formed by laminating a cut member and a flat plate to each other. The extrusion member 7 is not always required to constitute the refrigerant tank 3. As shown in FIG. 56, a cut member 26 formed with plural recesses by cutting and a flat plate 27 may be laminated together to close the recesses, thereby forming vapor passages 9 and condensed liquid passage 10. Alternatively, two thin-walled members obtained by pressing may be laminated together to constitute the refrigerant tank 3.

A twenty-third embodiment of the present invention will be described.

Figure 57:
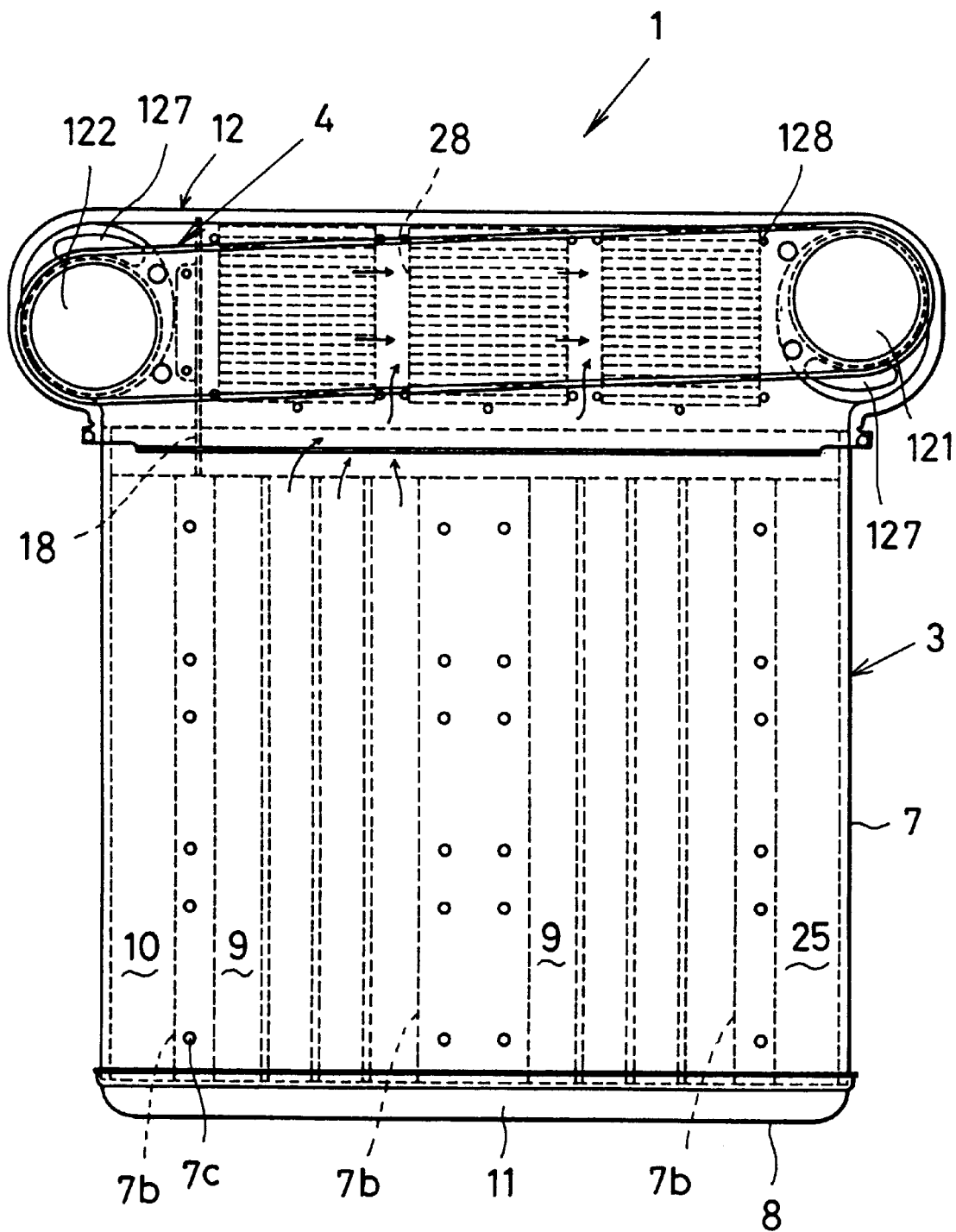
FIG. 57 is a front view of a cooling apparatus using boiling and condensing refrigerant according to a twenty-third embodiment.

FIG. 57 is a front view of a cooling apparatus 1 using boiling and condensing refrigerant.

In this embodiment, in the same manner as in the twentieth embodiment, a radiator 4 is mounted to a connecting portion 12 so that the air blowing direction is perpendicular to the radiator 4.

A refrigerant tank 3 includes an extrusion member 7 formed by extruding from an aluminum block and a cap 8 for covering one open end (the lower end in FIG. 57) of the extrusion member 7.

In the extrusion member 7 are formed vapor passages 9, condensed liquid passage and sub condensed liquid passage 25 by a plurality of support portions 7b extending vertically. Me vaporized refrigerant after boiled and evaporated with the heat of heat generating units 2 flows out through the vapor passages 9. The vapor passages 9 are formed in a plural number corresponding to the positions to which the heat generating units 2 are mounted. The liquid refrigerant after condensed in the radiator 4 flows into the condensed liquid passage 10e, which is formed in a position away from the mounting positions of the heat generating units 2. The sub condensed liquid passage 25 is formed on the side opposite to the condensed liquid passage 10 at the time of the extrusion for the refrigerant tank 3. The sub condensed liquid passage 25 is not usually used as the condensed liquid passage 10. The upper end portions of the support portions 7b are removed, so that the vapor passages 9, condensed liquid passage 10 and sub condensed liquid passage 25 are open in positions lower than the upper end face of the extrusion member 7. The support portions 7b are each formed with plural threaded holes 7c into which bolts are tightened.

The cap 8 is also formed of aluminum in the same manner as the extrusion member 7 and is fitted and integrally bonded to the outer peripheral portion of the lower end of the extrusion member 7 by brazing. A communication path 11 for communicating the vapor passages 9, condensed liquid passage 10 and sub condensed liquid passage 25 in the extrusion member 7 each other is formed between the cap 8 and the lower end face of the extrusion member. Accordingly, the refrigerant which has entered the condensed liquid passage 10 from the radiator 4 and which is in a liquid phase can be supplied to the vapor passages 9 through the communication path 11.

The connecting portion 12 is formed by bonding outer peripheral edge portions except for the lower end side, of two pressed oblong plates 120 (see FIG. 59). At both ends in the longitudinal direction are formed one communicating portion 121 communicating with the vapor passages 9 in the refrigerant tank 3 and another communicating portion 122 communicating with the condensed liquid passage 10. On the lower end side of the connecting portion 12 is formed a connection opening 123 for connecting with the refrigerant tank 3, opening 123 of which is fitted and bonded airtightly to the outer peripheral portion of the upper end of the refrigerant tank 3 (see FIG. 58). The interior of the connecting portion 12 is partitioned into an inlet chamber side including one communicating portion 121 and an outlet chamber side including the other communicating portion 122 by means of a separator 18 (see FIG. 57) disposed in a position adjacent to the communicating portion 122.

Figure 61:
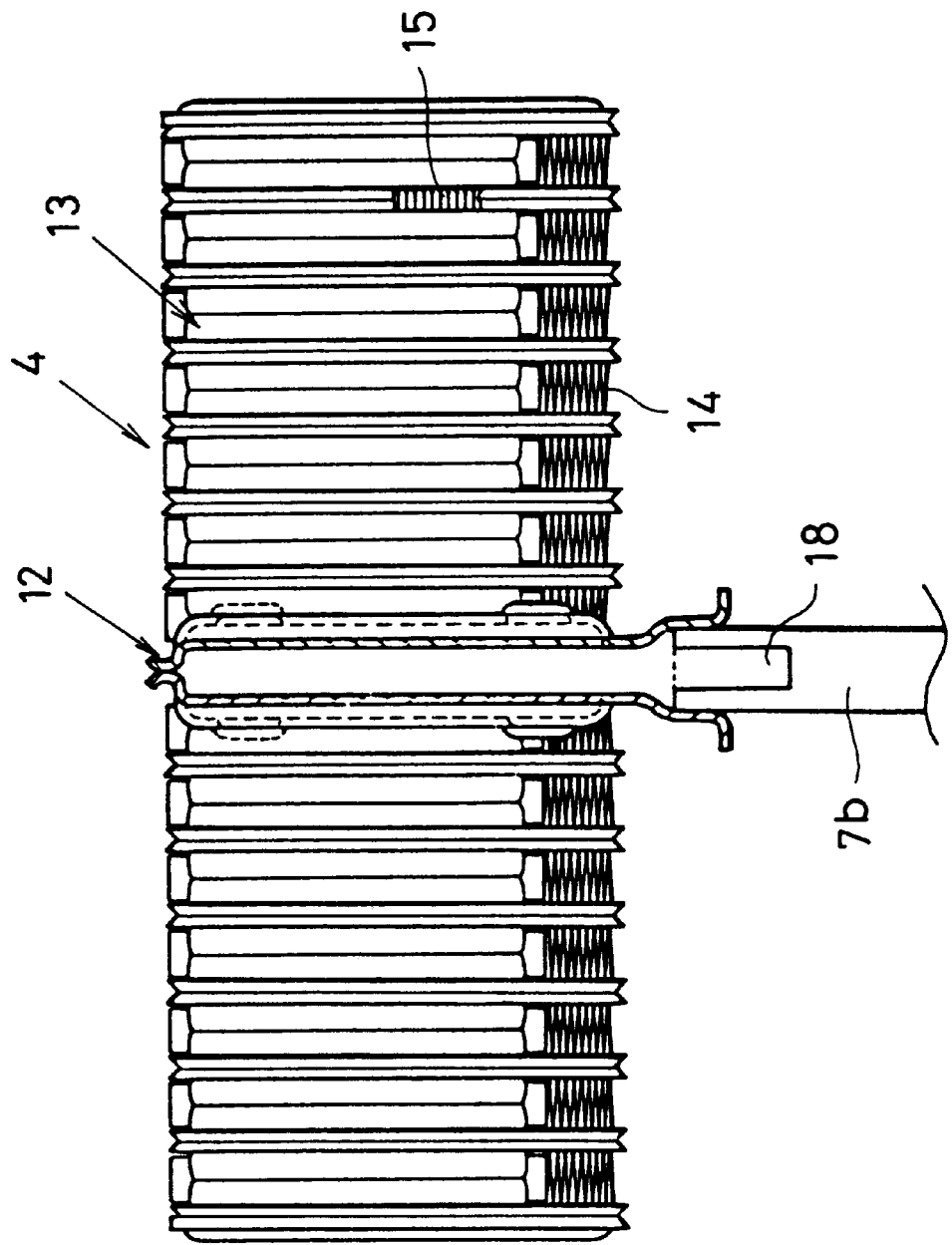
FIG. 61 is a cross sectional view showing a mounted state of the separator according to the twenty-third embodiment.
Figure 62:
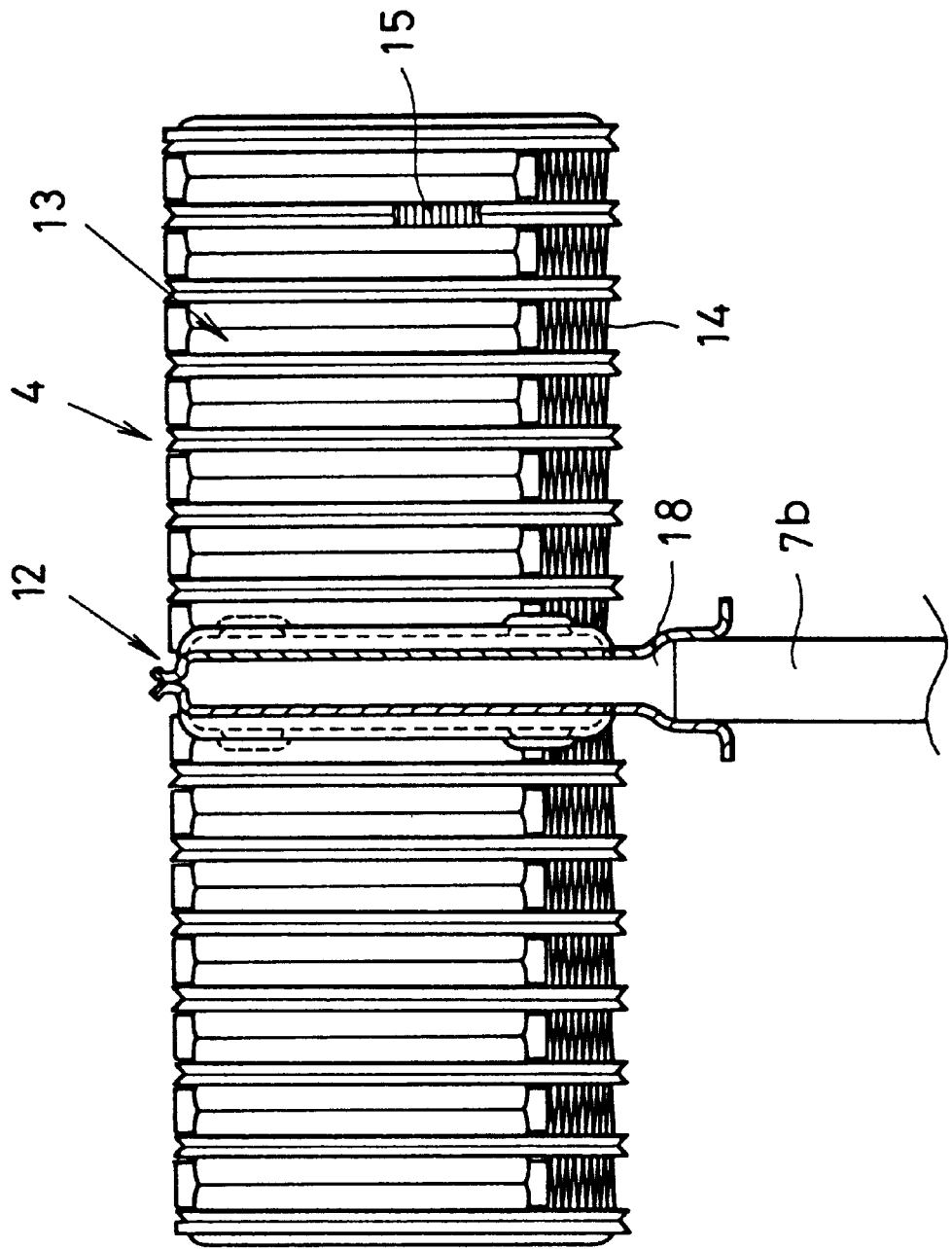
FIG. 62 is a cross sectional view showing a mounted state of a separator according to the twenty-third embodiment.

The separator 18 includes a partition wall portion 18a which partitions the interior of the connecting portion 12 into the inlet chamber side and the outlet chamber side and an extending wall portion 18b extending perpendicularly from one side of the partition wall portion 18a. The separator 18 is formed by pressing in an external shape which corresponds to the inner peripheral shape of the connecting portion 12 constituted by two pressed plates 120, and its outer peripheral edge portion is brazed to the inner wall surfaces of the plates 120. The lower-end side of the separator 18, as shown in FIG. 61, is in contact with the support portion 7b partitioning between the condensed liquid passage 10 and the vapor passage 9 in the refrigerant tank, and both are airtightly bonded together by brazing. Although in this embodiment the upper end portions of the support portions 7b are removed to lower the open surfaces of the condensed liquid passage 10 and vapor passages 9, it is not always necessary to remove the upper end portions, and in this case the lower end face of the separator 18 may be brought into contact with the upper end face of the support portion 7b as in FIG. 62 and both may be bonded together by brazing.

As shown in FIG. 59A, each pressed plate 120 is formed with recesses 124 (recessed from inside to the outside of the plate 120) at both longitudinal end portions and with communication ports 125 and 126 (circular holes punched in the pressing) being formed in the recesses 124 respectively. The recesses 124 are formed in an elliptic shape which is long in the vertical direction of each plate 120, and when the two pressed plates 120 are bonded together to constitute the connecting portion 12, there are formed one and the other communicating portion 121, 122. In each plate 120, however, the communication port 125 in one communicating portion 121 is formed in a position closer to the upper portion of the recess 124 which is generally elliptic, while the communication port 126 in the other communicating portion 122 is formed in a position closer to the lower portion of the recess which is generally elliptic. That is, in the vertical direction of the plate 120, the communication port 125 is formed in a higher position than the communication port 126.

Each pressed plate 120 is provided with arcuate ribs 127 below the communication port 125 and above the communication port 126, respectively. The ribs 127 reinforce so as to ensure the strength of the recesses 124.

Figure 63:
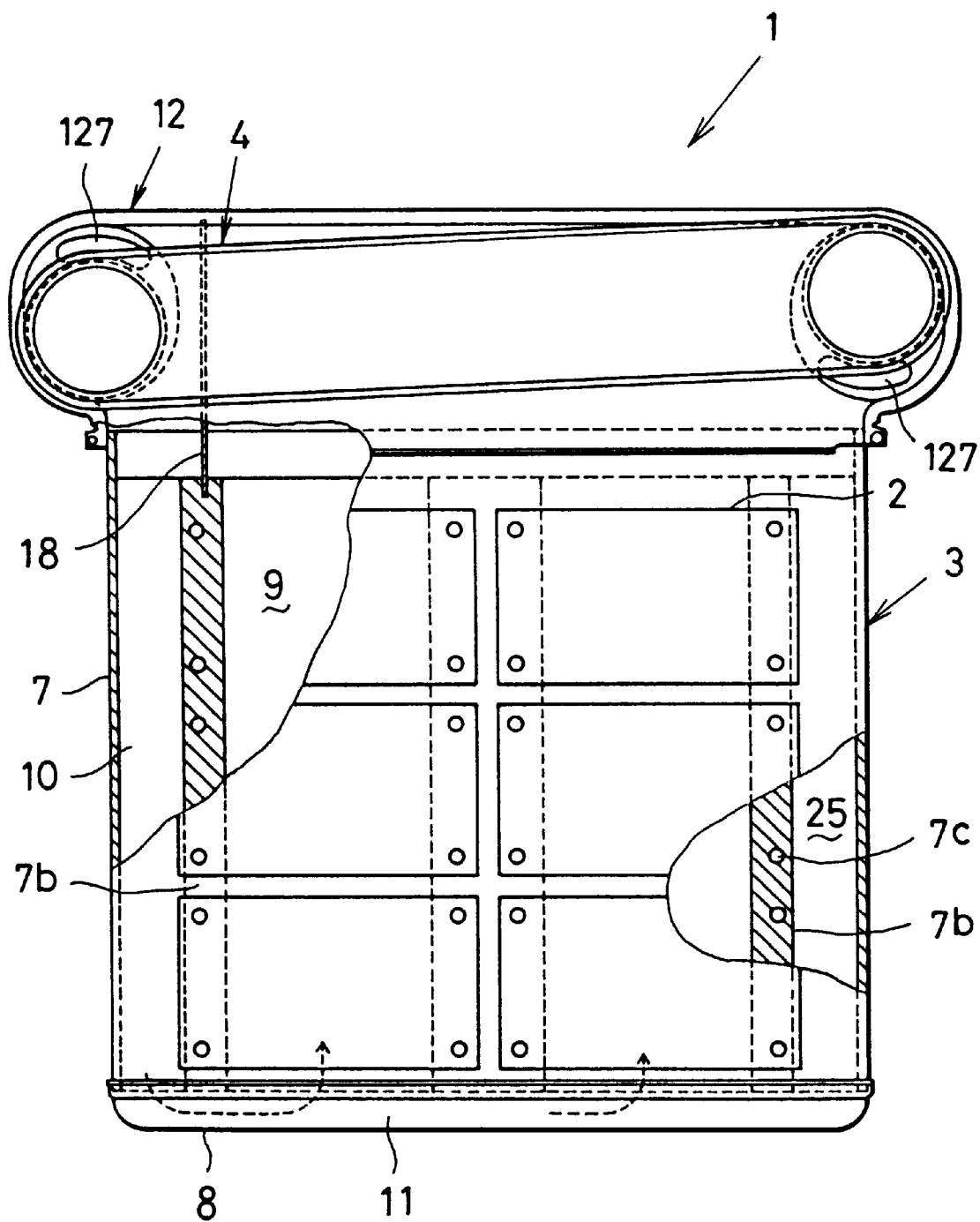
FIG. 63 is a front view of a cooling apparatus using boiling and condensing refrigerant according to the twenty-third embodiment.

In the interior of the connecting portion 12 are inserted a plurality of inner fins 28 between the separator 18 and one communicating portion 121 (namely in the inlet chamber). As shown in FIG. 57, each inner fin 28 is supported by a plurality of positioning ribs 128 formed on the plates 120. Each inner fins 28 is arranged so as to face in the longitudinal direction of the connecting portion 12 such that the vaporized refrigerant from the vapor passages 9 flows into one communicating portion 121, with a clearance being ensured between adjacent inner fins 28. The inner fins 28 are not always necessary and may be omitted as in FIG. 63. In this case, it is not necessary, either, to form the positioning ribs 128 for supporting the inner fins 28.

The radiator 4 is so-called a drawn-cup type heat exchanger and is constituted by laminating a plurality of flat heat radiating pipes 13.

Each heat radiating pipe 13 is formed as a hollow body by bonding together the outer peripheral edges of two pressed oblong plates 21, and at both longitudinal ends thereof are formed inlet-side and outlet-side communicating portions (neither shown) having communication ports (circular holes punched in the pressing; not shown), with the spacing between the inlet-side and outlet-side communicating portions being formed as a flat refrigerant passage (not shown). Inner fins 15 (see FIG. 58) formed by corrugating an aluminum sheet are inserted into the refrigerant passage.

Figure 58:
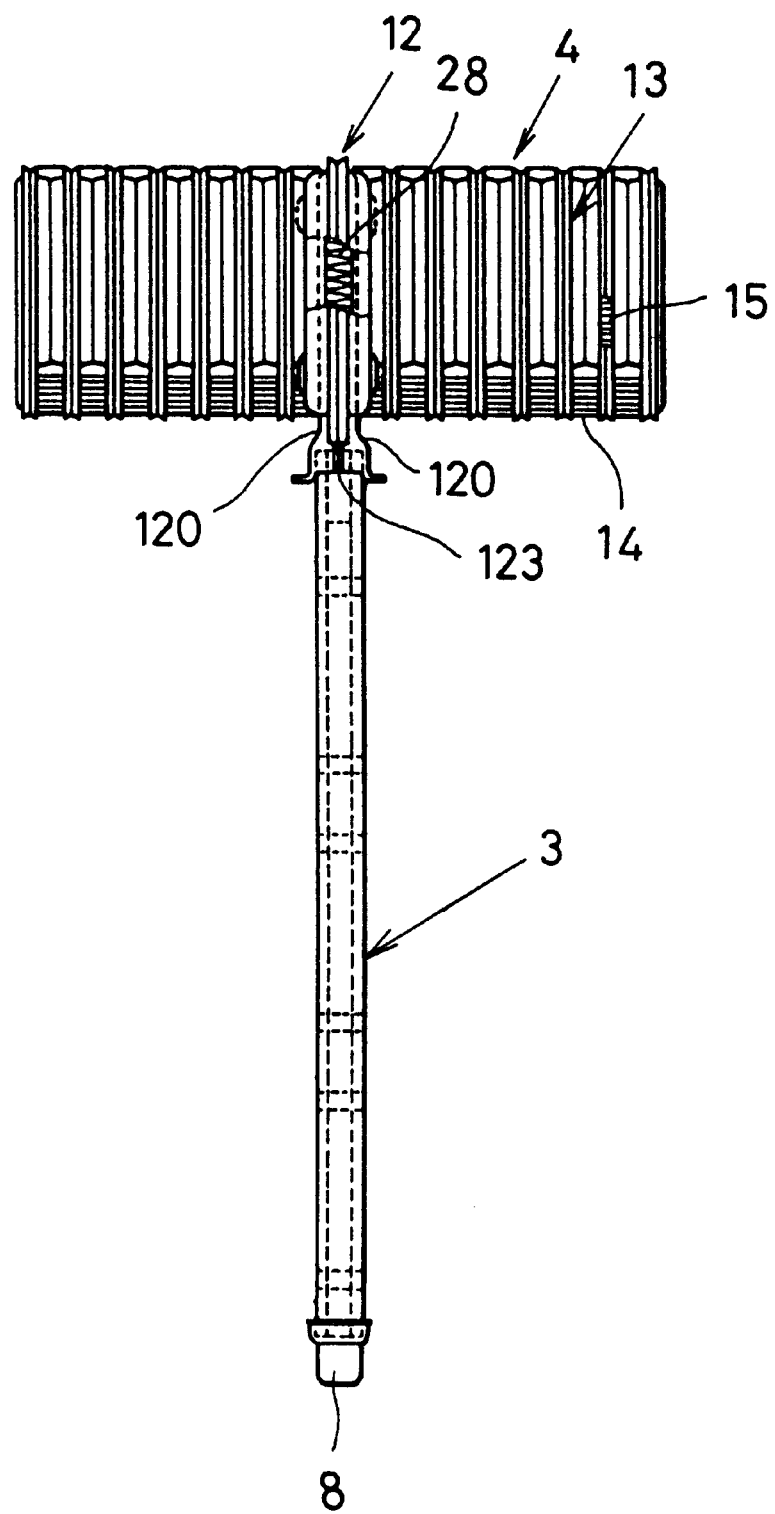
FIG. 58 is a side view according to the twenty-third embodiment.
Figure 60A:
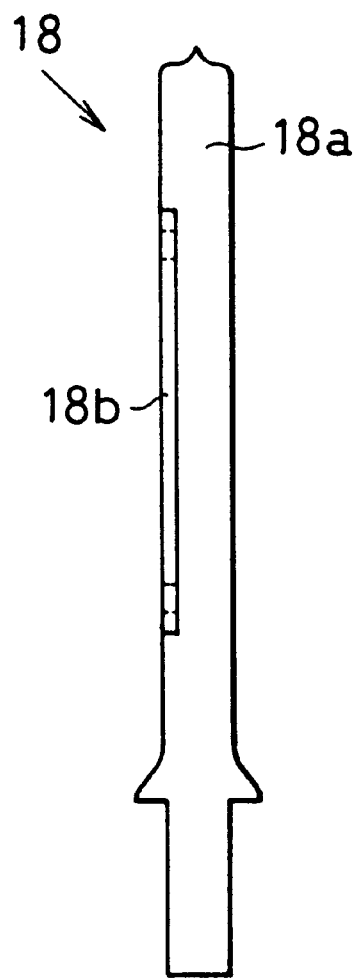
FIG. 60A is a plan view.
Figure 60B:
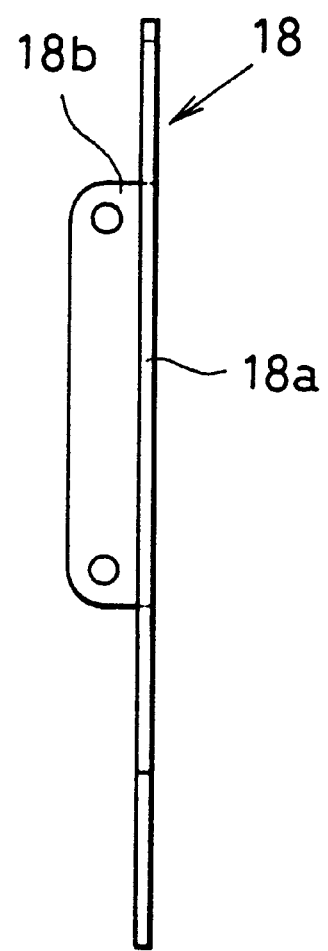
FIG. 60B is a side view of a separator according to the twenty-third embodiment.

As shown in FIG. 58, plural heat radiating pipes 13 are laminated on each side of the connecting portion 12 and are in communication with one another through the respective communication ports. The heat radiating pipes 13 connected to the connecting portion 12 and the connecting portion are in communication with each other through the communication ports 125 and 126 formed in the connecting portion 12 and the communication ports formed in the pipes 13. The radiator 4 is mounted in a entirely inclined state so that the inlet-side communicating portion of each heat radiating pipe 13 is positioned higher than the outlet-side communicating portion with respect to the connecting portion 12 (see FIG. 57). Further, heat radiating fins 14 formed of aluminum are inserted into a flat space formed between adjacent heat radiating pipes 13 in the stack direction and also inserted into flat spaces formed between the connecting portion 12 and the radiator 4 (the pipes 13) (see FIG. 58).

A cooling fan (not shown), which blows air to the radiator 4, is mounted above the radiator in such a manner that the blowing direction is perpendicular to the radiator.

An operation of this embodiment will be described below.

The refrigerant boiling with heat from the heat generating units 2 rises as bubbles through the vapor passages 9 and enters one communicating portion 121 of the connecting portion 12, then flows into the inlet-side communicating portion of each heat radiating pipe 13 and is distributed to the refrigerant passages in the pipes 13. The vaporized refrigerant flowing through each refrigerant passage is condensed on the inner wall surface of the refrigerant passage and the surfaces of the fins inserted into the refrigerant passage, temperature of which are low by receiving air from the cooling fan.

The refrigerant condensed into liquid drop flows along the bottom of the refrigerant passage in each heat radiating pipe 13 and enters the outlet-side communicating portion of the pipe, then flows out of the outlet-side communicating portion, passes through the other communicating portion 122 of the connecting portion 12 and enters the condensed liquid passage 10 in the refrigerant tank 3. The liquid refrigerant which has flowed down through the condensed liquid passage 10 passes through the communication path 11 formed in the cap 8 and is again supplied to the vapor passages 9. On the other hand, the condensing latent heat radiated upon condensation of vaporous refrigerant in the radiator 4 is transmitted from the wall surfaces of the heat radiating pipes 13 which surfaces define the refrigerant passages to the heat radiating fins 14 and is discharged into the air by the cooling fan.

According to this embodiment, since the separator 18 can be manufactured by pressing a plate member, it is possible to reduce the cost for manufacturing the separator. Besides, since the separator 18 constituted by a plate member is bonded to the inner peripheral surface of the connecting portion 12 by brazing, the gap between the separator 18 and the connecting portion 12 can be filled up with the brazing material, so that even the plate separator 18 can partition airtightly the interior of the connecting portion 12.

Further, since the two pressed plates 120 which constitute the connecting portion 12 are of the same shape, it is possible to use a common die structure for pressing the two plates 120 and hence possible to reduce the entire die cost for the connecting portion 12.

A twenty-fourth embodiment of the present invention will be described.

Figure 64:
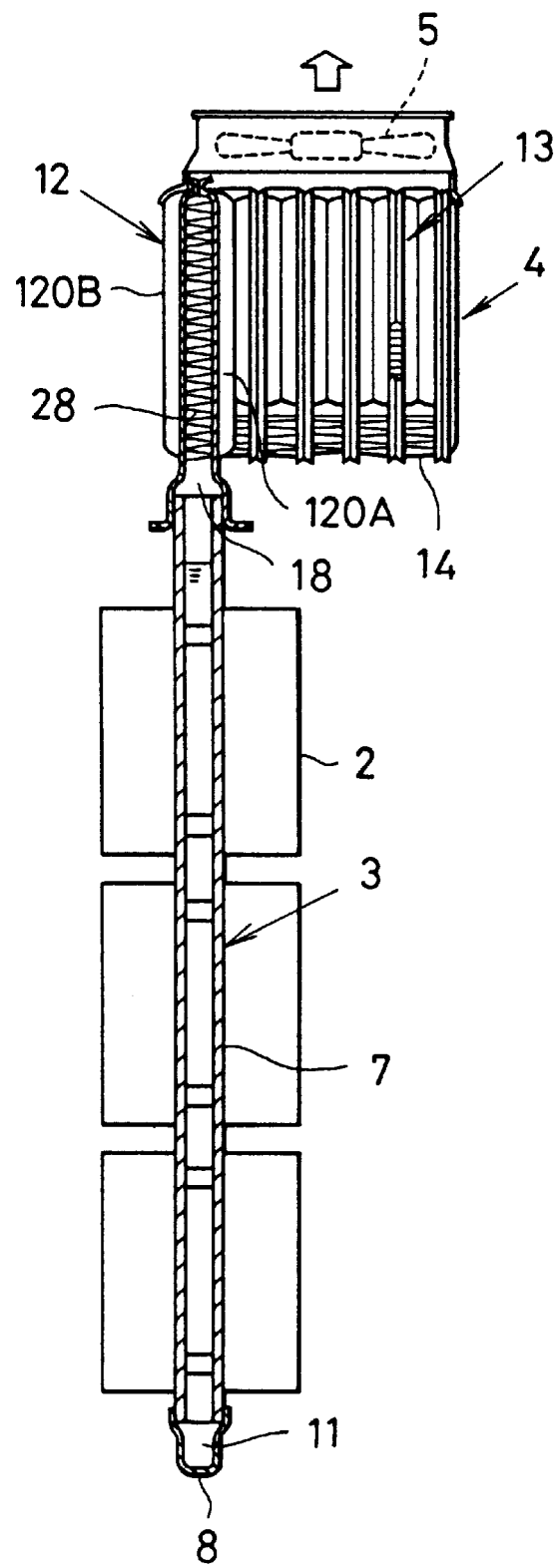
FIG. 64 is a side view of a cooling apparatus using boiling and condensing refrigerant according to a twenty-fourth embodiment.

FIG. 64 is a side view of a cooling apparatus 1 using boiling and condensing refrigerant.

In this embodiment, heat radiating pipes 13 constituting a radiator 4 are laminated on only one side of a connecting portion 12. In this case, communication ports (not shown) are formed in only one pressed plate 120A of the connecting portion 12 to which plate are connected the heat radiating pipes 13, the other pressed plate 120B being closed.

A twenty-fifth embodiment of the present invention will be described.

Figure 65:
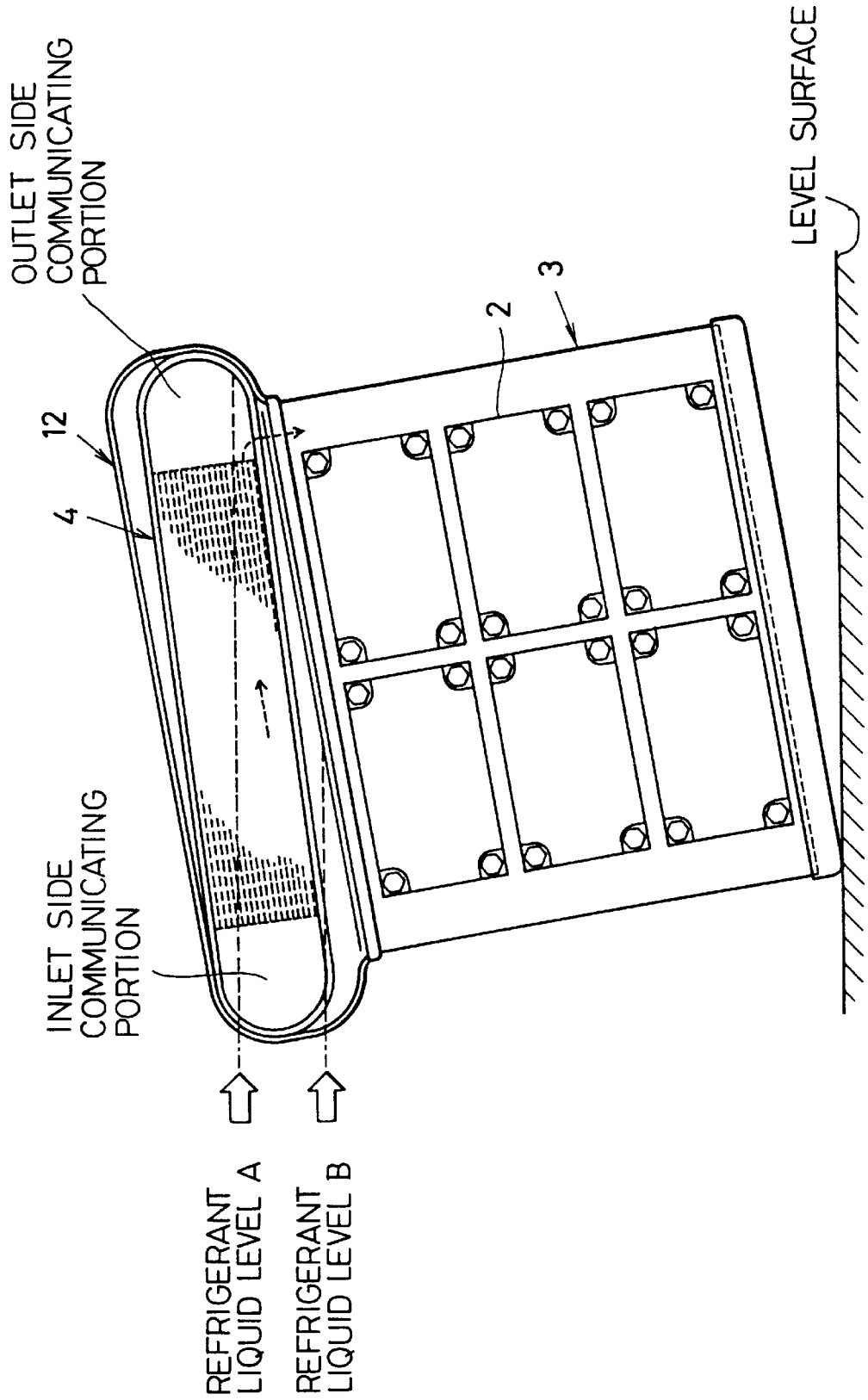
FIG. 65 is a front view showing an installed state of a cooling apparatus using boiling and condensing refrigerant according to a twenty-fifth embodiment.
Figure 66:
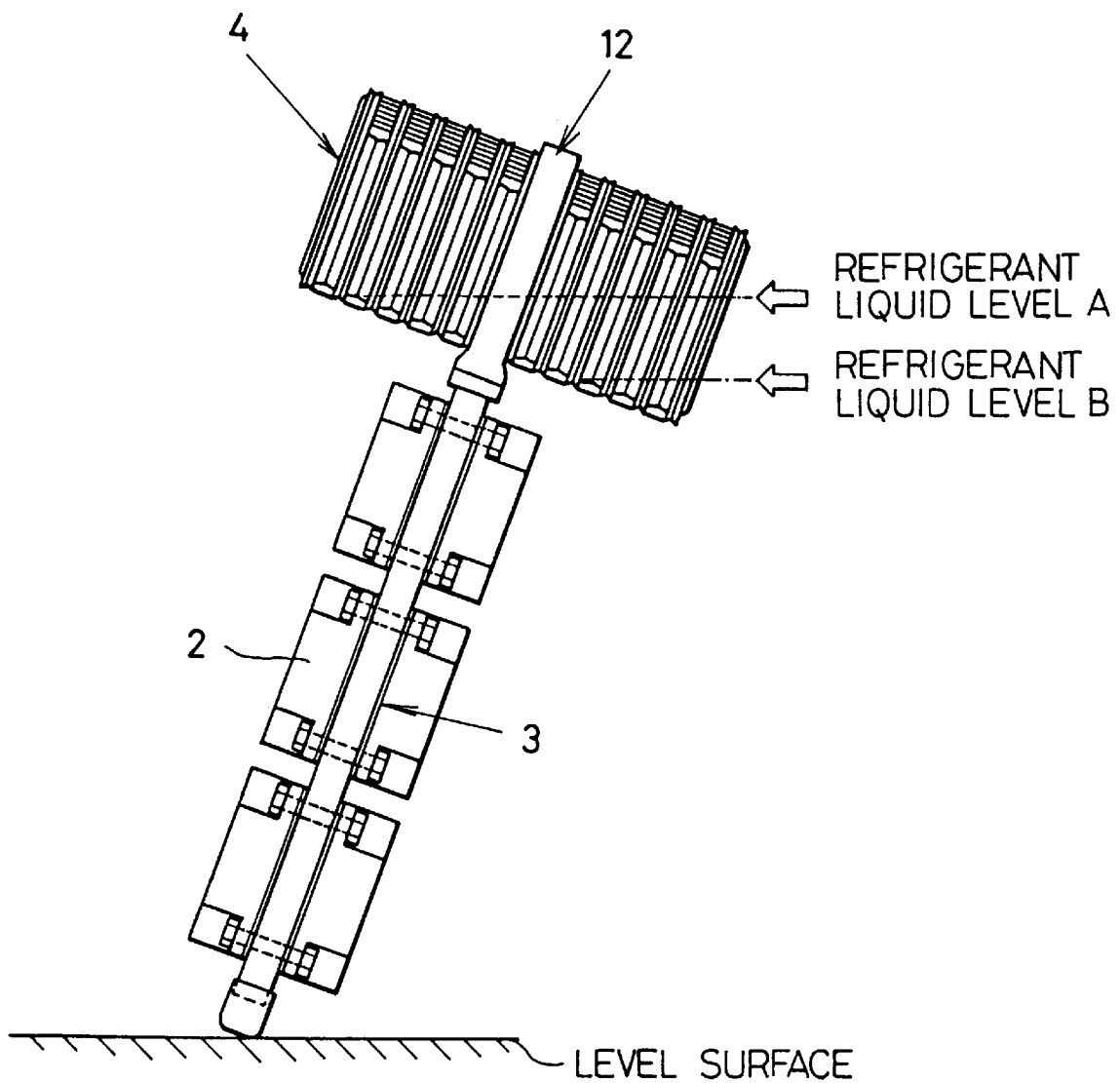
FIG. 66 is a side view according to the according to the twenty-fifth embodiment.

FIG. 65 is a front view showing an installed state of a cooling apparatus 1 using boiling and condensing refrigerant and FIG. 66 is a side view thereof.

In this embodiment, the cooling apparatus 1 using boiling and condensing refrigerant is used in a tilted state. As shown in FIG. 65 (with an outlet-side communicating portion of each heat radiating pipe 13 being higher in the vertical direction than an inlet-side communicating portion thereof) or as shown in FIG. 66, when the cooling apparatus 1 using boiling and condensing refrigerant is in an inclined state with respect to a horizontal plane, a refrigerant level B, in a normal amount of refrigerant sealed in a refrigerant tank 3, does not reach a condensed liquid passage in the refrigerant tank, and therefore, the condensed liquid to the refrigerant tank 3 (condensed liquid passage 10) cannot be returned. In such a case, the amount of refrigerant may be increased to the extent that a refrigerant level A is above the upper-end open surface of the condensed liquid passage 10. In this way, the condensed liquid can be returned to the refrigerant tank 3 (condensed liquid passage 10), so that the heat radiating performance can be maintained.

A twenty-sixth embodiment of the present invention will be described.

Figure 67:
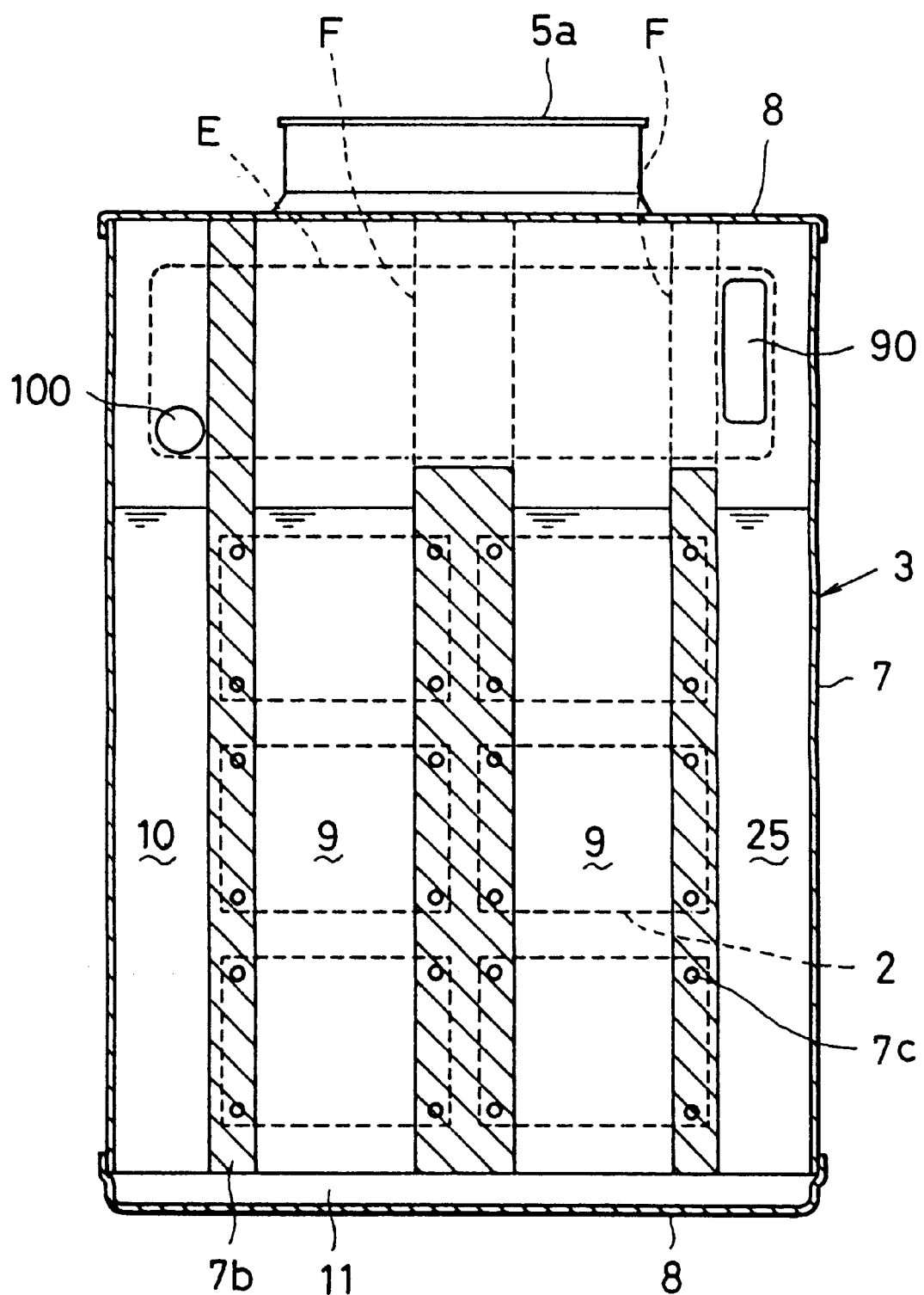
FIG. 67 is a longitudinal cross sectional view of a cooling apparatus using boiling and condensing refrigerant according to a twenty-sixth embodiment.
Figure 68:
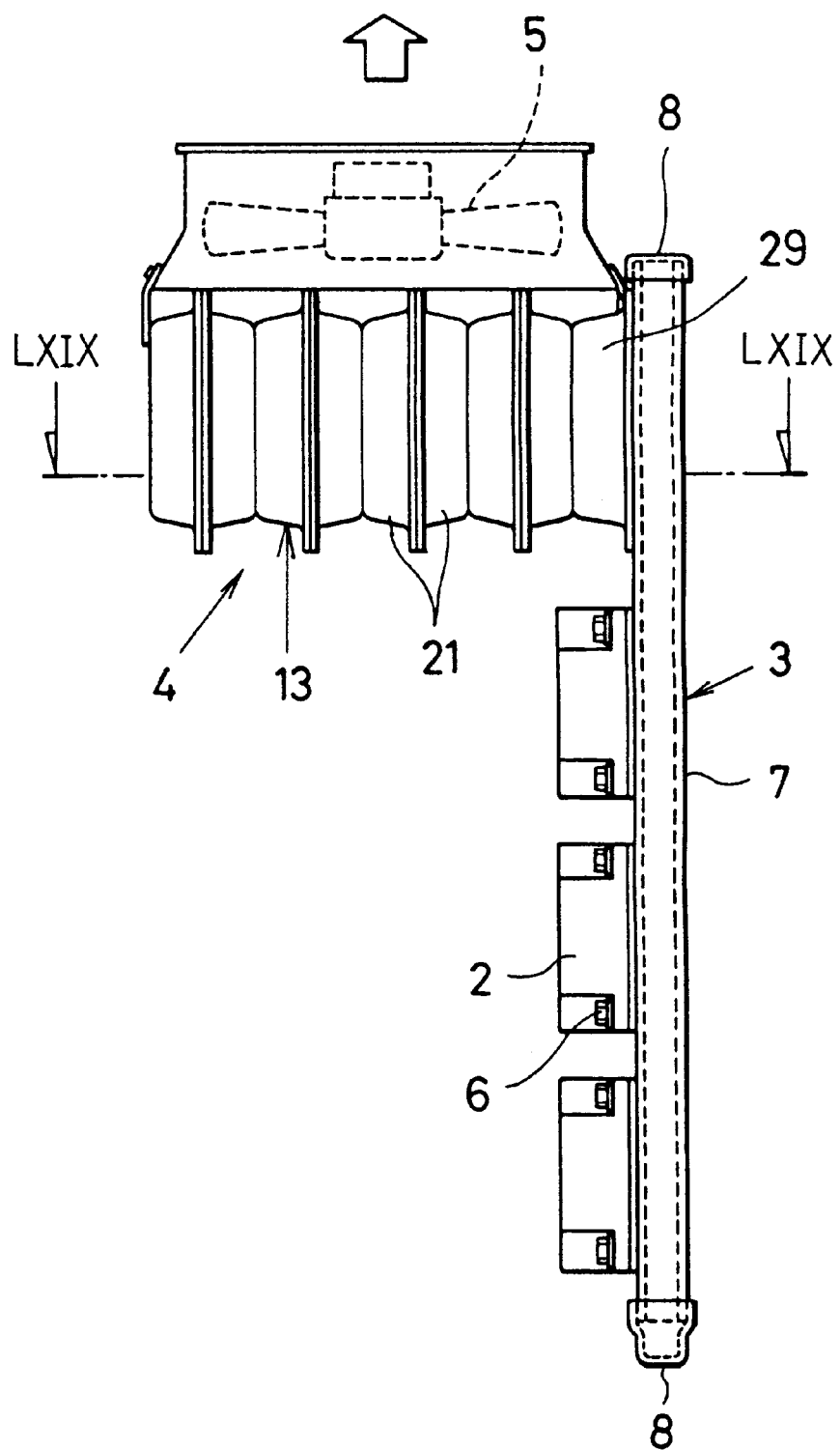
FIG. 68 is a side view according to the twenty-sixth embodiment.
Figure 69:
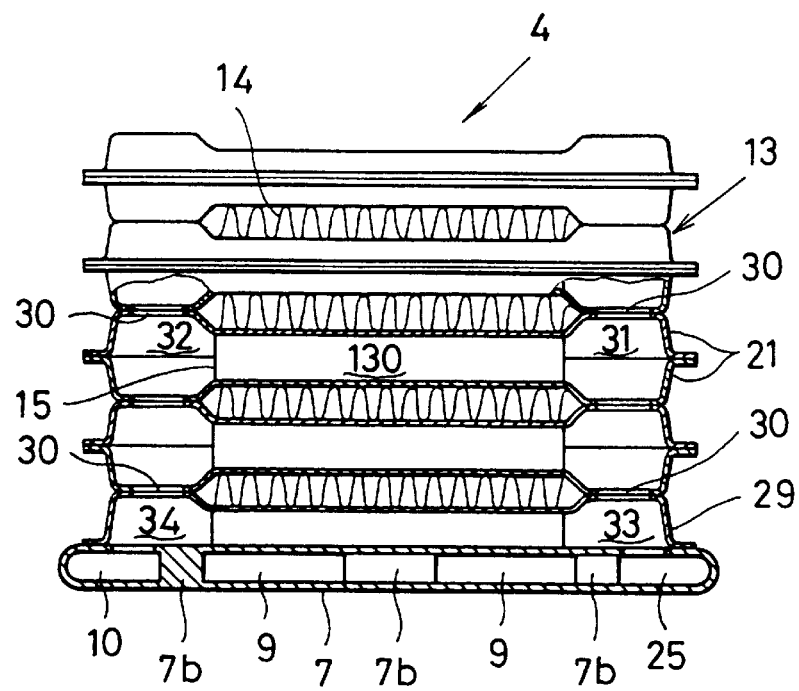
FIG. 69 is a cross sectional view taken along line LXIX—LXIX of FIG. 67.

FIG. 67 is a longitudinal cross sectional view of a refrigerant tank, FIG. 68 is a side view of a cooling apparatus 1 using boiling and condensing refrigerant, and FIG. 69 is a cross sectional view taken along line LXIX—LXIX of FIG. 67.

According to this embodiment, in the cooling apparatus 1 using boiling and condensing refrigerant, the upper portion of an extrusion member 7 is used as a part of the connection portion 12 forming a refrigerant tank 3.

The refrigerant tank 3 includes the extrusion member 7 obtained by extruding and caps 8 bonded to both upper and lower end portions of the extrusion member 7.

Figure 70:
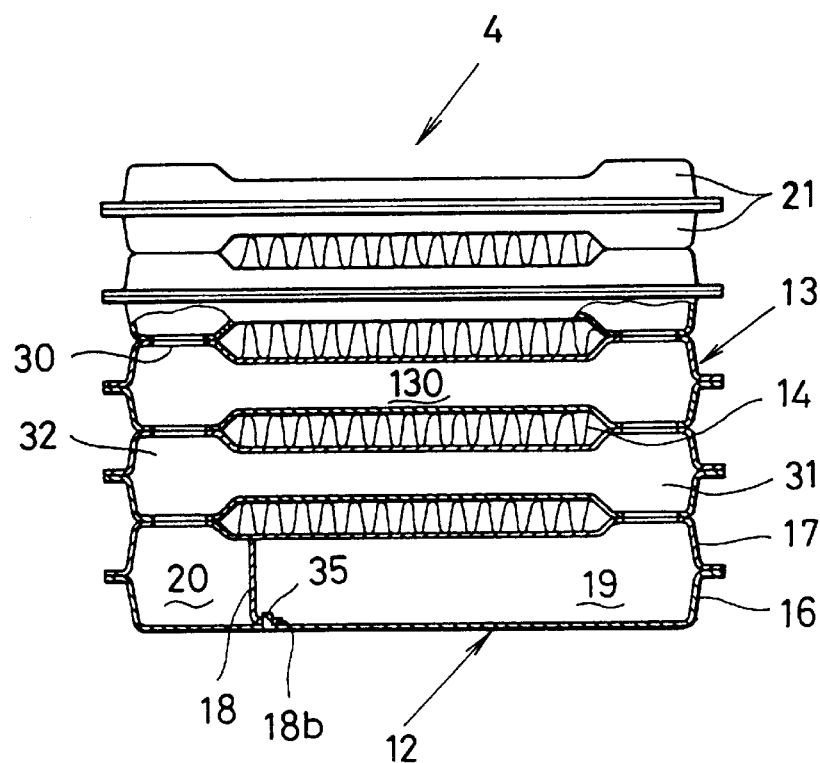
FIG. 70 is a top view of a cooling apparatus using boiling and condensing refrigerant, including a cross section of a connecting portion according to a twenty-seventh embodiment.

In the extrusion member 7, as shown in FIG. 70, vapor passages 9, condensed liquid passage 10 and sub condensed liquid passage 25 are formed longitudinally through the interior of the extrusion member by support portions 7b vertically extending. Further, an outlet port 90 of the vapor passages 9 and an inlet port 100 of the condensed liquid passage 10 are formed in an area (the area indicated with a broken line E in FIG. 67) to which is connected a radiator 4 (heat radiating pipes 13) through a connection plate 29 (a component of a connecting portion 12). The inlet port 100 and the outlet port 90 are formed in such a manner that the lower end of the inlet port 100 is positioned a little lower than the lower end of the outlet port 90.

The outlet port 90 is open above the sub condensed liquid passage 25, and the upper portions (indicated with broken lines F in FIG. 67) of the support portion 7b located between the two vapor passages 9 and of the support portion 7b located between a vapor passage 9 and the sub condensed liquid passage 25 are removed by an additional machining step such as milling, and thereby the outlet port 90 is brought into communication with the vapor passages 9. In each support portion 7b are formed threaded holes 7c into which mounting bolts 6 are tightened. The sub condensed liquid passage 25 is formed to keep the balance with the condensed liquid passage 10 in extruding, and usually it is not used as a condensed liquid passage 10. Therefore, it is not always necessary to form the sub condensed liquid passage 25.

The caps 8 are bonded to both end portions of the extrusion member 7 by brazing. The upper-end side cap 8 closes the upper-end opening of the extrusion member 7, however, the lower-end side cap 8 defines, with a lower end face of the extrusion member, a communicating path 11 for communicating with the vapor passages 9, condensed liquid passage 10 and sub condensed liquid passage 25 each other.

The radiator 4 is so-called a drawn-cup type heat exchanger. As shown in FIG. 69, the radiator 4 is constituted by laminating a plurality of hollow heat radiating pipes 13 each having the same shape and is connected to the refrigerant tank 3 through the connection plate 29.

Each heat radiating pipe 13 is composed of two plates each having a generally rectangular plane, and is manufactured as a hollow body by bonding together the outer peripheral edges of the two plates. Each of the two plates 21 is obtained in the same shape by pressing a metal stock (e.g. aluminum stock) superior in heat conductivity, with communication ports 30 being formed in both end portions of each plate.

In each heat radiating pipe 13, the central portion is entirely formed as a flat refrigerant passage 130, into which are inserted inner fins 15 obtained by corrugating an aluminum sheet. At both ends of the pipe located on both sides of the refrigerant passage 130 are formed an inlet-side communicating portion 31 and an outlet-side communicating portion 32 respectively having the communication ports 30. The communicating portions 31 and 32 are connected to the communicating portions 31 and 32 of the other heat radiating pipes 13 through the communication ports 30 to constitute an entire tank portion of the radiator 4.

As shown in FIG. 69, the heat radiating pipes 13 are laminated so that the respective inlet-side communicating portions 31 are fitted with one another and the respective outlet-side communicating portions 32 are also fitted, with heat radiating fins 14 being interposed between adjacent heat radiating pipes 13 which are laminated. The communication ports 30 are not formed in the outer plate 21 of the pipe 13 located in the outermost position. Alternatively, a plate 21 having the communication ports 30 may be used, however, the ports 30 are closed with an end plate (not shown) or the like from the outside of the plate 21.

As shown in FIG. 69, the connection plate 29 is airtightly bonded to the outer wall surface of the extrusion member 7 so as to cover both inlet port 100 and outlet port 90 formed in the extrusion member, with one communication chamber 33 and another communication chamber 34 being formed between the connection plate 29 and the outer wall surface of the extrusion member 7, the communication chamber 33 in communication with the vapor passages 9 and sub condensed liquid passage 25 through the outlet port 90, and the communication chamber 34 in communication with the condensed liquid passage 10 through the inlet port 100. In the connection plate 29 are formed communication ports 30 similar to those of the plates 21, and the communication chambers 33, 34 communicates with the heat radiating pipe 13 through the said communication port 30.

An operation of this embodiment will be described below.

The refrigerant which is boiling with heat generated from heat generating units 2 rises as bubbles through the vapor passages 9 and flows mainly into one communication chamber 33 through the outlet port 90, then further flows into one tank portion (the right inlet-side communicating portion 31 in FIG. 69) of the radiator 4 and is distributed to the refrigerant passages 130 in the heat radiating pipes 13. The refrigerant flowing in a vaporized state through each refrigerant passage 130 is condensed on the inner wall surface of the same passage and the surfaces of the inner fins 15, temperature of which are low by receiving air from a cooling fan 5 (see FIG. 68), with radiation of a condensing latent heat. The liquid drop flows down along the bottom of the refrigerant passage 130 and into the other tank portion (the left outlet-side communicating portion 32 in FIG. 69) of the radiator 4, then further flow into the other communication chamber 34. The condensed liquid staying mainly in the other communication chamber 34 flows through the inlet port 100 into the condensed liquid passage 10, then flows down through the passage 10, passes through the communication path 11 formed inside the lower cap 8 and is again supplied to the vapor passages 9. On the other hand, the condensing latent heat radiated when the vaporized refrigerant is condensed is transmitted from the wall surfaces of the refrigerant passages 130 to the heat radiating fins 14 and is discharged into the air passing between adjacent heat radiating pipes 13.

According to this embodiment wherein the upper portion of the extrusion member 7 constituting the refrigerant tank 3 is used as part of the connecting portion 12, the connecting portion can be constituted by only one connection plate 29 for the extrusion member 7. Further, in this embodiment, the support portion 7*b* serving as a partition between a vapor passage 9 and the condensed liquid passage 10 in the refrigerant tank 3 is left as it is without removal of its upper portion, and thereby it can be used as a partition member in the connecting portion 12.

A twenty-seventh embodiment of the present invention will be described.

FIG. 70 is a top view of a cooling apparatus 1 using boiling and condensing refrigerant, including a section of a connecting portion 12.

In this embodiment, a position of a separator 18 partitioning the interior of the connecting portion 12 into an inlet chamber 19 and an outlet chamber 20 is determined. More specifically, as shown in FIG. 70, a lug 35 is formed on any one of pressed plates 16 (or 17) for forming the connecting portion 12, while a hole is formed in an extending portion 18*b* of the separator 18, and by fitting the hole on the lug 35, it is possible to determine the position of the separator 18 easily.

A twenty-eighth embodiment of the present invention will be described.

Figure 71:
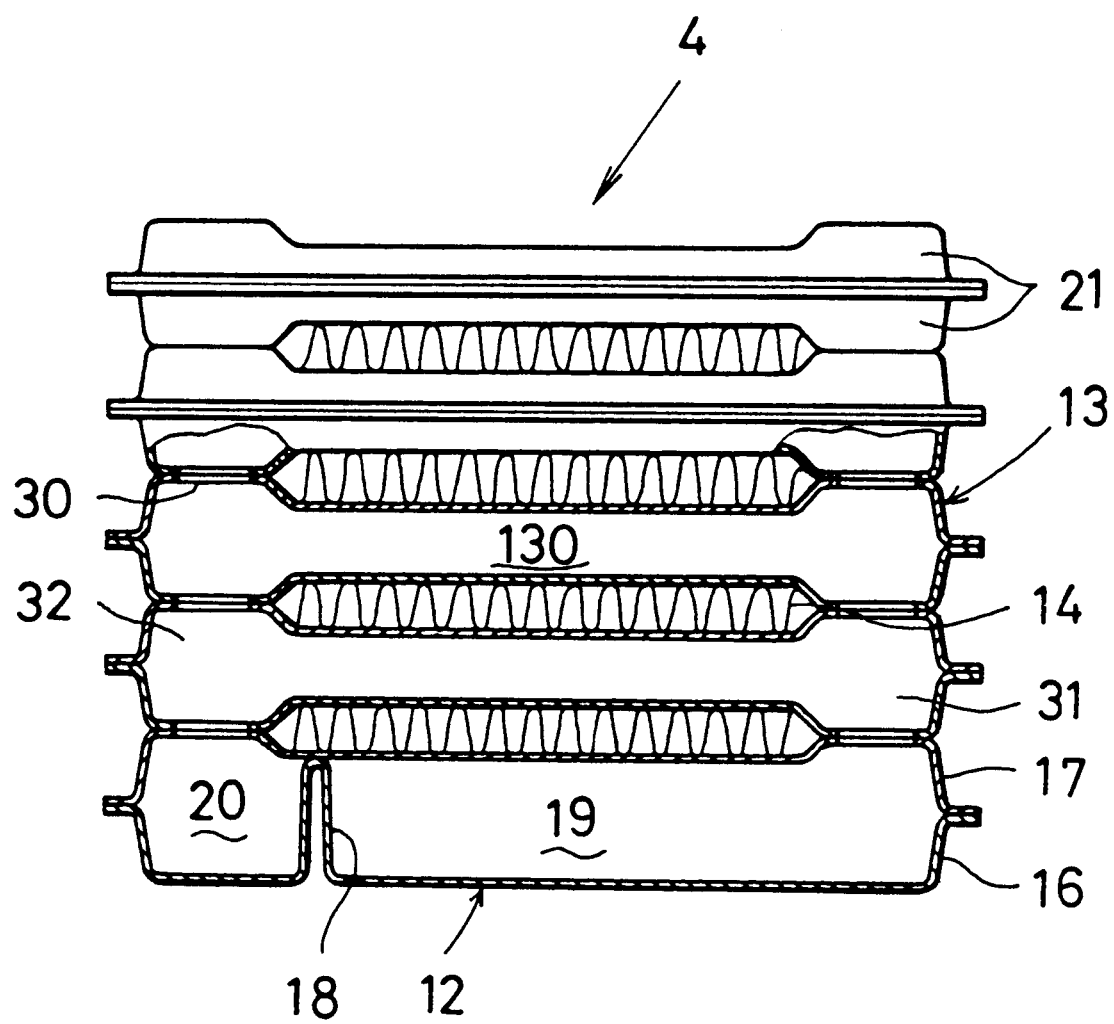
FIG. 71 is a top view of a cooling apparatus using boiling and condensing refrigerant, including a cross section of a connecting portion according to twenty-eighth embodiment.

FIG. 71 is a top view of a cooling apparatus 1 using boiling and condensing refrigerant, including a section of a connecting portion 12.

As illustrated in FIG. 71, in this embodiment, a separator 18 is formed by pressing integrally with any one plate 16 (or 17) for forming the connecting portion 12. In this case, it is not necessary to determine the position of the separator 18 with respect to the connecting portion 12, and further to decrease the number of manufacturing steps by reducing the number of components.

Although the present invention has been fully described in connection with the preferred embodiments thereof with reference to the accompanying drawings, it is to be noted that various changes and modifications will become apparent to those skilled in the art. Such changes and modifications are to be understood as being included within the scope of the present invention as defined in the appended claims.

What is claimed is:

1. A cooling apparatus for cooling a heat generating unit, comprising:

a refrigerant tank having an outside wall surface, to which said heat generating unit is attached, for containing refrigerant which is vaporized with heat generated by said heat generating unit;

a radiator for radiating heat of said refrigerant which has boiled and vaporized in said refrigerant tank; and a connecting portion for connecting said refrigerant tank and said radiator with each other, wherein said refrigerant tank includes a partition wall partitioning an interior thereof into a vapor passage through which said refrigerant after vaporized with heat by said heat generating unit flows out and a condensed liquid passage into which said refrigerant condensed and liquefied by said radiator flows downwardly, and a lower side connection path for connecting between said vapor passage and said condensed liquid passage at a lower side of said refrigerant tank, said condensed liquid passage is defined by a part of said outside wall surface and said partition wall, said refrigerant tank is formed in a cylindrical shape, said heat generating unit is attached to said refrigerant tank at a side where said valpor passage is located, said connecting portion includes a partition member for partitioning an interior thereof into an inlet chamber communicating with said vapor passage and an outlet chamber communicating with said condensed liquid passage, said radiator forms said inlet chamber connected to said refrigerant tank so as to communicate with said vapor passage, and said outlet chamber communicating with said condensed liquid passage, said radiator is composed of a hollow heat radiating pipe for connecting between said inlet chamber and said outlet chamber, said partition member is in contact with said partition wall, said refrigerant tank includes a pair of outside wall surfaces facing each other, said partition member is disposed in said refrigerant tank so as to contact with each of said outside wall surfaces, said heat radiating pipe includes an inlet-side communicating portion communicated with said inlet chamber, an outlet-side communicating portion communicated with said outlet chamber, and a refrigerant passage for connecting between said inlet-side communicating portion and said outlet-side communicating portion, said radiator is constituted by laminating a plurality of said heat radiating pipes on said connecting portion, said heat radiating pipes each having the same shape and being laminated in such a manner that said respective inlet-side communicating portions communicates with each other and said respective outlet-side communicating portions communicates with each other in a laminated direction thereof, and a bottom of said refrigerant passage in said heat radiating pipe is inclined downwardly from said inlet-side communicating portion toward said outlet-side communicating portion.

2. A cooling apparatus using boiling and condensing refrigerant for cooling a heat generating unit, comprising:

a refrigerant tank having an outside wall surface, for containing said refrigerant therein;

a heat generating unit boiling said refrigerant in said refrigerant tank by heating; and a radiator disposed so as to communicate with said refrigerant tank for condensing and liguefying said boiled refrigerant in said tank; wherein said refrigerant tank includes a partition wall partitioning an interior thereof into a vapor passage for leading said boiled refrigerant to said radiator and a condensed liquid passage in which said condensed and liquefied refrigerant flows downwardly, and a communication path formed at a lower side thereof for communicating between said vapor passage and said condensed liquid passage, said condensed liquid passage is defined by a part of said outside wall surface and said partition wall, said radiator includes an inlet chamber connected to said refrigerant tank so as to communicate with said vapor passage, an outlet chamber communicating with said condensed liquid passage, and a hollow heat radiating portion for connecting between said inlet chamber and said outlet chamber, said refrigerant tank is composed of an extrusion member formed by extruding, said refrigerant tank includes a refrigerant chamber in which said vapor passage and said condensed liguid passage are formed, and said vapor passage and said condensed liquid passage are defined by a refrigerant flow control plate disposed within said refrigerant chamber.

3. A cooling apparatus using boiling and condensing refrigerant for cooling a heat generating unit, comprising:

a refrigerant tank having an outside wall surface, for containing said refrigerant therein;

a heat generating unit boiling said refrigerant in said refrigerant tank by heating; and a radiator disposed so as to communicate with said refrigerant tank for condensing and liquefying said boiled refrigerant in said tank; wherein said refrigerant tank includes a partition wall partitioning an interior thereof into a vapor passage for leading said boiled refrigerant to said radiator and a condensed liquid passage in which said condensed and liquefied refrigerant flows downwardly, and a communication path formed at a lower side thereof for communicating between said vapor passage and said condensed liquid passage, said condensed liquid passage is defined by a part of said outside wall surface and said partition wall, said radiator includes an inlet chamber connected to said refrigerant tank so as to communicate with said vapor passage, an outlet chamber communicating with said condensed liquid passage, and a hollow heat radiating portion for connecting between said inlet chamber and said outlet chamber, said refrigerant tank is composed of an extrusion member formed by extruding, said refrigerant tank includes a refrigerant chamber in which said vapor passage and said condensed liquid passage are formed, said radiator includes a connecting member connected to said refrigerant tank so as to form an inlet chamber communicating with said vapor passage and an outlet chamber communicating with said condensed liquid passage, and a plurality of heat radiating pipes each having a hollow shape, which are laminated on said connection member so as to mutually communicates with each other, each of said heat radiating pipes includes an inlet-side communicating portion communicated with said inlet chamber, an outlet-side communicating portion communicated with said outlet chamber, and a refrigerant passage which communicates between said inlet-side communicating portion and said outlet-side communicating portion, and a bottom of said refrigerant passage is inclined from said inlet-side communicating portion toward said outlet-side communicating portion.

4. A cooling apparatus using boiling and condensing refrigerant for cooling a heat generating unit, comprising:

a refrigerant tank having an outside wall surface, for containing said refrigerant therein;

a heat generating unit boiling said refrigerant in said refrigerant tank by heating; and a radiator disposed so as to communicate with said refrigerant tank for condensing and liquefying said boiled refrigerant in said tank; wherein said refrigerant tank includes a partition wall partitioning an interior thereof into a vapor passage for leading said boiled refrigerant to said radiator and a condensed liquid passage in which said condensed and liquefied refrigerant flows downwardly, a communication path formed at a lower side thereof for communicating between said vapor passage and said condensed liquid passage, and a plurality of partitions partitioning said vapor passage into plural passages, said condensed licuid passage is defined by a part of said outside wall surface and said partition wall, said radiator includes an inlet chamber connected to said refrigerant tank so as to communicate with said vapor passage, an outlet chamber communicating with said condensed liquid passage, and a hollow heat radiating portion for connecting between said inlet chamber and said outlet chamber, and said partition wall is thicker than said partitions.

5. A cooling apparatus for cooling a heat generating unit, comprising:

a refrigerant tank having an outside wall surface to which said heat generating unit is attached, for containing refrigerant which is vaporized with heat generated by said heat generating unit;

a radiator for radiating heat of said refrigerant which has boiled and vaporized in said refrigerant tank; and a connecting portion for connecting said refrigerant tank and said radiator with each other, wherein said refrigerant tank forms therein a vapor passage through which said refrigerant after vaporized with heat by said heat generating unit flows out, a condensed liquid passage into which said refrigerant condensed by said radiator flows, and a connection path for connecting between said vapor passage and said condensed liquid passage, said connecting portion includes a partition member for partitioning an interior thereof into an inlet chamber connecting to said vapor passage and an outlet chamber connecting to said condensed liquid passage, said radiator forms said inlet chamber connected to said refrigerant tank so as to communicate with said vapor passage and said outlet chamber communicated with said condensed liquid passage, said radiator is composed of a hollow heat radiating pipe for connecting between said inlet chamber and said outlet chamber, said refrigerant tank includes a partition wall for partitioning an interior thereof into said vapor passage and said condensed liquid passage, and a plurality of partitions partitioning said vapor passage into plural passages, said condensed liquid passage is defined by a part of said outside wall surface and said partition wall, said partition member is in contact with said partition wall, and said partition wall is thicker than said partitions.

6. A cooling apparatus for cooling a heat generating unit, comprising:

a refrigerant tank having an outside wall surface to which said heat generating unit is attached, for containing refrigerant which is vaporized with heat generated by said heat generating unit;

a radiator for radiating heat of said refrigerant which has boiled and vaporized in said refrigerant tank; and a connecting portion for connecting said refrigerant tank and said radiator with each other, wherein said refrigerant tank includes a partition wall partitioning an interior thereof into a vapor passage through which said refrigerant after vaporized with heat by said heat generating unit flows out and a condensed liquid passage into which said refrigerant condensed and liquefied by said radiator flows downwardly, a lower side connection path for connecting between said vapor passage and said condensed liquid passage at a lower side of said refrigerant tank, and a plurality of partitions partitioning said vapor passage into plural passages, said condensed liquid passage is defined by a part of said outside wall surface and said partition wall, said refrigerant tank is formed in a cylindrical shape, said heat generating unit is attached to said refrigerant tank at a side where said vapor passage is located, said connecting portion includes a partition member for partitioning an interior thereof into an inlet chamber communicating with said vapor passage and an outlet chamber communicating with said condensed liquid passage, said radiator forms said inlet chamber connected to said refrigerant tank so as to communicate with said vapor passage and said outlet chamber communicating with said condensed liquid passage, said radiator is composed of a hollow heat radiating pipe for connecting between said inlet chamber and said outlet chamber, said partition member is in contact with said partition wall, and said partition wall is thicker than said partitions.

* * * * *